US012777753B2

(12) United States Patent
Im et al.

(10) Patent No.: US 12,777,753 B2
(45) Date of Patent: Oct. 27, 2026

(54) DISPLAY DEVICE AND METHOD FOR MANUFACTURING DISPLAY DEVICE

(71) Applicant: SAMSUNG DISPLAY CO., LTD., Yongin-si (KR)

(72) Inventors: Hyun Deok Im, Yongin-si (KR); Won Kyu Kim, Yongin-si (KR); Won Ho Lee, Yongin-si (KR); Jong Hyuk Kang, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1160 days.

(21) Appl. No.: 17/756,038

(22) PCT Filed: Sep. 15, 2020

(86) PCT No.: PCT/KR2020/012445

§ 371 (c)(1),
(2) Date: May 13, 2022

(87) PCT Pub. No.: WO2021/096050

PCT Pub. Date: May 20, 2021

(65) Prior Publication Data

US 2022/0406972 A1 Dec. 22, 2022

(30) Foreign Application Priority Data

Nov. 13, 2019 (KR) ........................ 10-2019-0145315

(51) Int. Cl.
*H10H 29/49* (2025.01)
*H10H 20/01* (2025.01)
(Continued)

(52) U.S. Cl.
CPC ........ *H10H 20/8316* (2025.01); *H10H 20/01* (2025.01); *H10H 20/857* (2025.01);
(Continued)

(58) Field of Classification Search
CPC ...................................................... H10H 29/49
(Continued)

(56) References Cited

U.S. PATENT DOCUMENTS 6,536,106 B1 3/2003 Jackson et al.
9,181,630 B2 11/2015 Shibata et al.
(Continued)

FOREIGN PATENT DOCUMENTS

JP 2008-260073 A 10/2008
JP 2012-004535 A 1/2012
(Continued)

OTHER PUBLICATIONS

International Search Report of PCT/KR2020/012445, Jan. 4, 2021, 5 pages.

(Continued)

*Primary Examiner* — Hsin Yi Hsieh
(74) *Attorney, Agent, or Firm* — Womble Bond Dickinson (US) LLP

(57) ABSTRACT

A display device according to an embodiment of the present disclosure includes a substrate, and a display element layer provided on a first surface of the substrate and including a plurality of light emitting elements. The display element layer may include a first electrode and a second electrode configured to extend in a first direction and spaced apart from each other in a second direction different from the first direction, and a third electrode configured to extend in the first direction and face the second electrode with the first electrode interposed therebetween. The first electrode includes a first protrusion protruding toward the second electrode, the second electrode includes a second protrusion protruding toward the first electrode, and the first protrusion and the second protrusion are alternately arranged in the first direction. Each of the light emitting elements may be
(Continued)

provided between the first protrusion and the second protrusion, and first ends of respective light emitting elements may be aligned toward one of the first electrode and the second electrode.

14 Claims, 43 Drawing Sheets

(51) Int. Cl.
*H10H 20/831* (2025.01)
*H10H 20/857* (2025.01)
*H10H 29/14* (2025.01)

(52) U.S. Cl.
CPC ......... *H10H 29/142* (2025.01); *H10H 20/032* (2025.01); *H10H 20/0364* (2025.01)

(58) Field of Classification Search
USPC ........................................................... 257/88
See application file for complete search history.

(56) References Cited

U.S. PATENT DOCUMENTS

| | | | | |
|---|---|---|---|---|
| 9,329,433 | B2 | 5/2016 | Negishi et al. | |
| 9,773,761 | B2 | 9/2017 | Do | |
| 10,629,791 | B2 | 4/2020 | Lim | |
| 10,784,246 | B2 | 9/2020 | Do et al. | |
| 2008/0251381 | A1* | 10/2008 | Shibata ................ | H10D 62/121 204/483 |

FOREIGN PATENT DOCUMENTS

| | | | | |
|---|---|---|---|---|
| KR | 10-2012-0120377 | A | 11/2012 | |
| KR | 10-2012-0138805 | A | 12/2012 | |
| KR | 10-1490758 | B1 | 2/2015 | |
| KR | 10-2016-0059569 | A | 5/2016 | |
| KR | 10-2017-0091805 | A | 8/2017 | |
| KR | 10-2019-0102382 | A | 9/2019 | |
| WO | WO-2020149517 | A1 * | 7/2020 | ......... H10D 30/6755 |

OTHER PUBLICATIONS

Written Opinion of PCT/KR2020/012445, Jan. 4, 2021, 7 pages.
Korean Notice of Allowance dated Jul. 16, 2024 regarding Korean Patent Application No. 10-2019-0145315 corresponding to U.S. Appl. No. 17/756,038 (7 pages).

* cited by examiner

EL1: EL1-1, EL1-2
EL2: EL2-1, EL2-2
EL3: EL3-1, EL3-2
CNT1: CNT1-1, CNT1-2
CNT2: CNT2-1, CNT2-2
BNK1: BNK1-1, BNK1-2

EL1: EL1-1, EL1-2
EL2: EL2-1, EL2-2
EL3: EL3-1, EL3-2
BNK1: BNK1-1, BNK1-2
CNT1: SCNT1
CNT2: SCNT2
SCNT1: SCNT1-1, SCNT1-2
SCNT2: SCNT2-1, SCNT2-2

DISPLAY DEVICE AND METHOD FOR MANUFACTURING DISPLAY DEVICE

CROSS-REFERENCE TO RELATED APPLICATIONS

This application is a U.S. National Phase Patent Application of International Patent Application Number PCT/KR2020/012445, filed on Sep. 15, 2020, which claims priority to Korean Patent Application Number 10-2019-0145315, filed on Nov. 13, 2019, the entire contents of all of which are incorporated by reference herein.

BACKGROUND

1. Field

Various embodiments of the present disclosure relate to a display device and a method of manufacturing the display device.

2. Description of the Related Art

A light emitting diode (LED) demonstrates relatively good durability even under poor environmental conditions, and also has excellent performance from lifetime and luminance aspects. Recently, research into application of this LED to various display devices has been actively conducted.

As a part of this research, technology for manufacturing an ultra-small rod-type LED that is as small as microscale or nanoscale size has been developed using an inorganic crystalline structure, for example, a structure in which a nitride-based semiconductor is deposited. For example, a rod-type LED may be manufactured in a size small enough to form a pixel or the like of a self-emissive display device.

SUMMARY

Aspects and features of embodiments of the present disclosure is to provide a display device in which the degree of alignment of light emitting elements is excellent, and a method of manufacturing the display device.

A display device according to one or more embodiments of the present disclosure may include a substrate; and a display element layer on a first surface of the substrate, the display element layer including: a plurality of light emitting elements, a first electrode and a second electrode extending in a first direction and spaced from each other in a second direction different from the first direction; and a third electrode extending in the first direction, and opposing the second electrode with the first electrode interposed therebetween. The first electrode may include a first protrusion protruding toward the second electrode, the second electrode may include a second protrusion protruding toward the first electrode, and the first protrusion and the second protrusion may be alternately arranged along the first direction. The plurality of light emitting elements may be located between the first protrusion and the second protrusion, and first ends of respective one of the plurality of light emitting elements are aligned toward one of the first electrode and the second electrode.

In one or more embodiments of the present disclosure, the first electrode, the second electrode, and the third electrode, and the plurality of light emitting elements may be located on a same surface of the substrate.

In one or more embodiments of the present disclosure, the display element layer may further include a first contact electrode electrically connecting at least one of the first electrode and the third electrode to the plurality of light emitting elements; and a second contact electrode electrically connecting the second electrode to the plurality of light emitting elements.

In one or more embodiments of the present disclosure, the first contact electrode may include first sub-contact electrodes coupled to a portion of the first electrode adjacent to the plurality of light emitting elements and spaced from each other in the first direction, and the second contact electrode may include second sub-contact electrodes coupled to a portion of the second electrode adjacent to the plurality of light emitting elements and spaced from each other in the first direction.

In one or more embodiments of the present disclosure, the display element layer may further include an insulating layer on the first electrode and the second electrode, wherein the third electrode and the plurality of light emitting elements may be on the insulating layer.

In one or more embodiments of the present disclosure, the third electrode may include a third protrusion protruding toward the second electrode.

In one or more embodiments of the present disclosure, the display element layer may further include a first contact electrode electrically connecting the plurality of light emitting elements to the third protrusion to each other; and a second contact electrode electrically connecting the plurality of light emitting elements to the second electrode.

In one or more embodiments of the present disclosure, the first protrusion may include a first end adjacent to the second electrode and a second end adjacent to the first electrode, the second protrusion may include a first end adjacent to the first electrode and a second end adjacent to the second electrode, and in the first direction, a width of each first end is greater than a width of each second end.

In one or more embodiments of the present disclosure, the display element layer may further include a fourth electrode extending in the first direction and opposing the first electrode with the second electrode interposed therebetween.

In one or more embodiments of the present disclosure, the first electrode, the second electrode, the third electrode, and the fourth electrode, and the plurality of light emitting elements may be on a same surface of the substrate.

In one or more embodiments of the present disclosure, the display element layer may further include a first contact electrode electrically connecting at least one of the first electrode and the third electrode to the plurality of light emitting elements; and a second contact electrode electrically connecting at least one of the second electrode and the fourth electrode to the plurality of light emitting elements.

In one or more embodiments of the present disclosure, in a direction from the substrate to the display element layer, the first electrode and the second electrode may be located on a surface different from a surface on which the third electrode and the fourth electrode are located, with an insulating layer interposed therebetween.

In one or more embodiments of the present disclosure, the plurality of light emitting elements may be on the insulating layer, and from among a first electrode pair including the first electrode and the second electrode and a second electrode pair including the third electrode and the fourth electrode, an electrode pair on the insulating layer may be electrically connected to the plurality of light emitting elements.

In one or more embodiments of the present disclosure, the third electrode may include a third protrusion protruding toward the fourth electrode, the fourth electrode may include a fourth protrusion protruding toward the third electrode, and the third protrusion may oppose the fourth protrusion with the plurality of light emitting elements interposed therebetween.

A method of manufacturing a display device according to one or more embodiments of the present disclosure may include forming a first electrode, a second electrode, and a third electrode on a substrate such that the first electrode, the second electrode, and the third electrode extend in a first direction and are spaced from each other in a second direction different from the first direction; providing light emitting elements on the substrate on which the first electrode, the second electrode, and the third electrode are formed; primarily aligning the light emitting elements by applying a first alignment signal to the first electrode and to the second electrode; and secondarily aligning the light emitting elements by applying a second alignment signal to the third electrode and to the second electrode. The first electrode includes a first protrusion protruding toward the second electrode, and the second electrode includes a second protrusion protruding toward the first electrode. When the first alignment signal is applied to the first electrode and to the second electrode, the light emitting elements may be aligned such that first ends and second ends of the light emitting elements oppose the first protrusion and the second protrusion, respectively.

In one or more embodiments of the present disclosure, a frequency of the first alignment signal may be higher than a frequency of the second alignment signal.

In one or more embodiments of the present disclosure, secondarily aligning may include aligning the light emitting elements such that respective first ends of the light emitting elements oppose one of the first electrode and the second electrode.

In one or more embodiments of the present disclosure, a waveform of the second alignment signal may be a square wave, a sawtooth wave, or a pulse wave.

In one or more embodiments of the present disclosure, the method of manufacturing the display method may further include forming a first contact electrode electrically connecting at least one of the first electrode and the third electrode to the light emitting elements, and a second contact electrode electrically connecting the second electrode to the light emitting elements.

A method of manufacturing a display device according to one or more embodiments of the present disclosure may include forming, on a substrate, a first electrode and a second electrode that extend in a first direction and are spaced from each other in a second direction different from the first direction; forming, on the substrate, a third electrode and a fourth electrode that extend in the first direction and oppose each other with the first electrode and the second electrode interposed therebetween; providing light emitting elements on the substrate on which the first electrode, the second electrode, the third electrode and the fourth electrode are formed; primarily aligning the light emitting elements by applying a first alignment signal to the first electrode and to the second electrode; and secondarily aligning the light emitting elements by applying a second alignment signal to the third electrode and to the fourth electrode. The first electrode may include a first protrusion protruding toward the second electrode, and the second electrode may include a second protrusion protruding toward the first electrode. When the first alignment signal is applied to the first electrode and the second electrode, the light emitting elements are aligned such that first ends and second ends of the light emitting elements oppose the first protrusion and the second protrusion, respectively.

In accordance with one or more embodiments of the present disclosure, there is provided a display device in which the degree of directional alignment of light emitting elements is relatively high, and a method of manufacturing the display device.

In accordance with one or more embodiments of the present disclosure, first and second electrodes respectively include first and second protrusions protruding toward each other, thus enabling the light emitting elements to be primarily aligned and to be finally directionally aligned. By means of this, the degree of directional alignment of light emitting elements may be improved.

However, the aspects of the present disclosure are not limited to the foregoing aspects, and may be expanded in various forms without departing from the spirit and scope of the present disclosure.

DETAILED DESCRIPTION

Figure 1A:
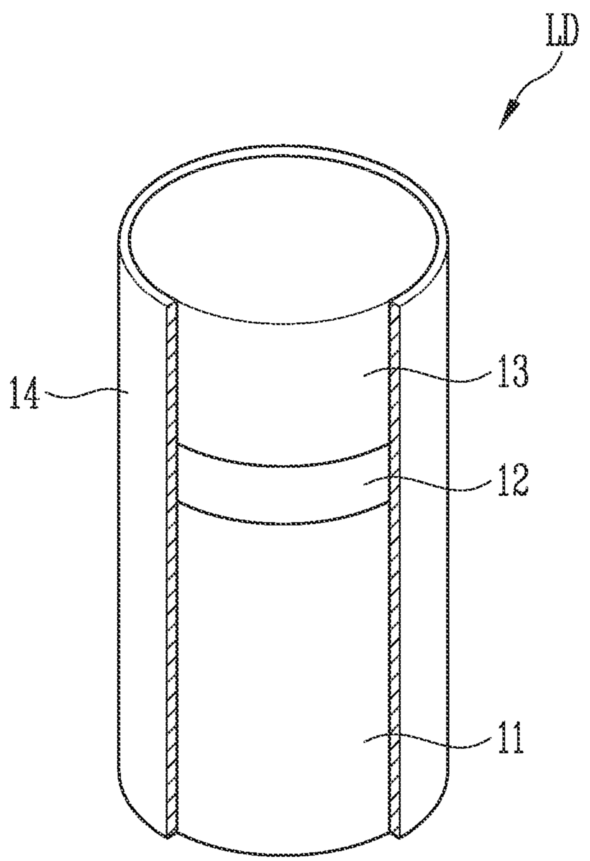
FIGS. 1A and 1B are perspective cutaway views illustrating a light emitting element according to one or more embodiments of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

In the description of each drawing, similar reference numerals are used to designate similar components. The sizes of structures in the accompanying drawings may be exaggerated for clarity of the present disclosure. It should be noted that, although the terms "first", "second", etc. may be used herein to describe various elements, these elements should not be limited by these terms. These terms are only used to distinguish one element from another element. For instance, a first element may be termed a second element without departing from the teachings of the present disclosure, and similarly, the second element may also be termed the first element. The singular forms are intended to include the plural forms as well, unless the context clearly indicates otherwise.

It should be understood that the terms "comprise" or "have" when used in this specification, specify the presence of stated features, numbers, steps, operations, elements, components, and/or combinations thereof but do not preclude the presence or addition of one or more other features, numbers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the direction of the second part on which the first part is formed is not limited to an upper direction, but may include cases where the first part is formed in a lateral direction or a lower direction. To the contrary, when a first part such as a layer, a film, a region, or a plate is under a second part, the first part may be not only directly under the second part but a third part may intervene between them.

Hereinafter, embodiments of the present disclosure will be described in detail with reference to the attached drawings.

Figure 1B:
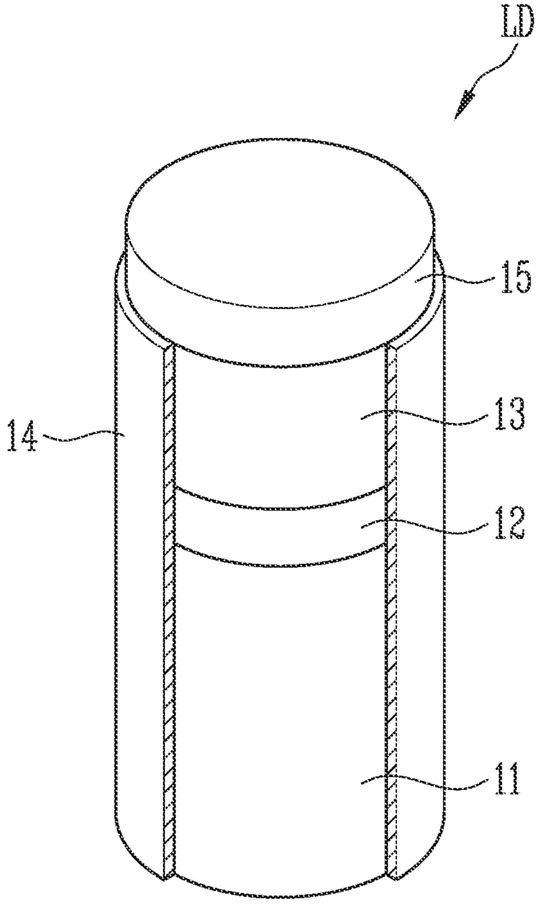

FIGS. 1A and 1B are perspective cutaway views illustrating a light emitting element according to one or more embodiments of the present disclosure. In FIGS. 1A and 1B, although a light emitting element LD having a cylindrical shape is illustrated, the present disclosure is not limited thereto.

Referring to FIGS. 1A and 1B, the light emitting element LD according to one or more embodiments of the present disclosure may include a first semiconductor layer 11, a second semiconductor layer 13, and an active layer 12 interposed between the first semiconductor layer 11 and the second semiconductor layer 13.

In an example, the light emitting element LD may be implemented as a stacked body in which the first semiconductor layer 11, the active layer 12, and the second semiconductor layer 13 are sequentially stacked.

In accordance with one or more embodiments of the present disclosure, the light emitting element LD may be provided in the form of a rod extending in one direction. Assuming that the extension direction of the light emitting element LD is a longitudinal direction, the light emitting element LD may have a first end and a second end along the longitudinal direction.

In one or more embodiments of the present disclosure, one of the first semiconductor layer 11 and the second semiconductor layer 13 may be disposed on the first end (e.g., a first portion), and a remaining one of the first semiconductor layer 11 and the second semiconductor layer 13 may be disposed on the second end (e.g., a second portion) of the light emitting element LD.

In one or more embodiments of the present disclosure, the light emitting element LD may be provided in the form of a rod. However, the term "rod-type" embraces a rod-like shape or a bar-like shape such as a cylindrical shape or a prismatic shape, which has a larger longitudinal length (i.e., which has an aspect ratio greater than 1). For example, the length of the light emitting element LD may be greater than a diameter thereof.

The light emitting element LD may be manufactured to be sufficiently small to have a diameter and/or length of, for example, a microscale or nanoscale level.

However, the size of the light emitting element LD according to one or more embodiments of the present disclosure is not limited thereto, and the size of the light emitting element LD may be changed to meet requirements of the display device to which the light emitting element LD is applied.

The first semiconductor layer 11 may include, for example, at least one n-type semiconductor layer. For instance, the first semiconductor layer 11 may include a semiconductor layer that includes any one semiconductor material of InAlGaN, GaN, AlGaN, InGaN, AlN, and InN and is doped with a first conductive dopant such as Si, Ge, or Sn.

However, the material forming the first semiconductor layer 11 is not limited thereto, and the first semiconductor layer 11 may be formed of various materials in addition to the described materials.

The active layer 12 may be formed on the first semiconductor layer 11, and may be formed to have a single- or multi-quantum well structure. In various embodiments of the present disclosure, a cladding layer doped with a conductive dopant may be formed on and/or under the active layer 12. For example, the cladding layer may be implemented as an AlGaN layer or an InAlGaN layer. In addition, it is apparent that a material such as AlGaN or AlInGaN may also be used for the active layer 12.

When an electric field of a suitable voltage (e.g., a set or predetermined voltage) or more is applied between the opposite ends of the light emitting element LD, the light emitting element LD emits light while electron-hole pairs are coupled to each other in the active layer 12.

The second semiconductor layer 13 may be provided on the active layer 12, and may include a semiconductor layer of a type different from that of the first semiconductor layer 11. For example, the second semiconductor layer 13 may include at least one p-type semiconductor layer. For instance, the second semiconductor layer 13 may include a semiconductor layer which includes at least one semiconductor material of InAlGaN, GaN, AlGaN, InGaN, AlN, and InN and is doped with a second conductive dopant such as Mg.

However, the material forming the second semiconductor layer 13 is not limited thereto, and the second semiconductor layer 13 may be formed of various materials in addition to the described materials.

In accordance with one or more embodiments of the present disclosure, the light emitting element LD may further include other florescent body layers, active layers, semiconductor layers and/or electrodes on and/or under each layer in addition to the above-described first semiconductor layer 11, active layer 12, and second semiconductor layer 13.

In one or more embodiments, the light emitting element LD may further include at least one electrode disposed on one end (e.g., a top surface) of the second semiconductor layer 13 or on one end (e.g., a bottom surface) of the first semiconductor layer 11.

For example, as illustrated in FIG. 1B, the light emitting element LD may further include an electrode 15 disposed on one end of the second semiconductor layer 13. The electrode 15 may be, but is not limited to, an Ohmic contact electrode. In accordance with one or more embodiments, the electrode 15 may be a Schottky contact electrode. Furthermore, the electrode 15 may include a metal or a metal oxide, and may use, but is not limited to, for example, chrome (Cr), titanium (Ti), aluminum (Al), gold (Au), nickel (Ni), and an oxide or alloy thereof alone or a transparent conductive material such as ITO or in combination. Also, in one or more embodiments, the electrode 15 may be substantially transparent or translucent. Thereby, light generated from the light emitting element LD may be emitted to the outside of the light emitting element LD after passing through the electrode 15.

Also, the light emitting element LD may further include an insulating layer 14 around (or surrounding) an outer surface (e.g., an outer peripheral or circumferential surface) of the light emitting element LD. However, in accordance with one or more embodiments of the present disclosure, the insulating layer 14 may be omitted, and may also be provided to cover only some of the first semiconductor layer 11, the active layer 12, and the second semiconductor layer 13.

For example, the insulating layer 14 may be provided on a portion of the light emitting element LD except the opposite ends thereof, thus enabling the opposite ends of the light emitting element LD to be exposed.

For convenience of description, in FIGS. 1A and 1B, a shape in which a portion of the insulating layer 14 is removed is depicted, and the entire side surface of the actual light emitting element LD may be surrounded by the insulating layer 14.

The insulating layer 14 may be provided to enclose at least portions of outer surfaces (e.g., outer peripheral or circumferential surfaces) of the first semiconductor layer 11, the active layer 12, and/or the second semiconductor layer 13. For example, the insulating layer 14 may be provided to enclose the outer surface (e.g., the outer peripheral or circumferential surface) of at least the active layer 12. Also, when the light emitting element LD includes the electrode 15, the insulating layer 14 may also be provided to enclose at least a portion of the outer surface (e.g., outer peripheral or circumferential surface) of the electrode 15.

In one or more embodiments of the present disclosure, the insulating layer 14 may include a transparent insulating material. For example, the insulating layer 14 may include, but is not limited to, one or more insulating materials selected from the group consisting of $SiO_2$, $Si_3N_4$, $Al_2O_3$, and $TiO_2$, and various materials having insulating properties may be employed.

When the insulating layer 14 is provided on the surface of the light emitting element LD, the active layer 12 may be prevented from short-circuiting with a first electrode and/or a second electrode which is not illustrated.

Furthermore, by forming the insulating layer 14, occurrence of a defect on the surface (e.g., outer peripheral or circumferential surface) of the light emitting element LD may be reduced or minimized, whereby the lifetime and efficiency of the light emitting element LD may be improved. Furthermore, in the case where a plurality of light emitting elements LD are disposed in close contact with each other, the insulating layer 14 may prevent an undesired short-circuit from occurring between the light emitting elements LD.

The above-described light emitting element LD may be employed as a light emitting source for various display devices. For example, the light-emitting element LD may be used as a light source element of a lighting device or a self-emissive display device.

Figure 2A:
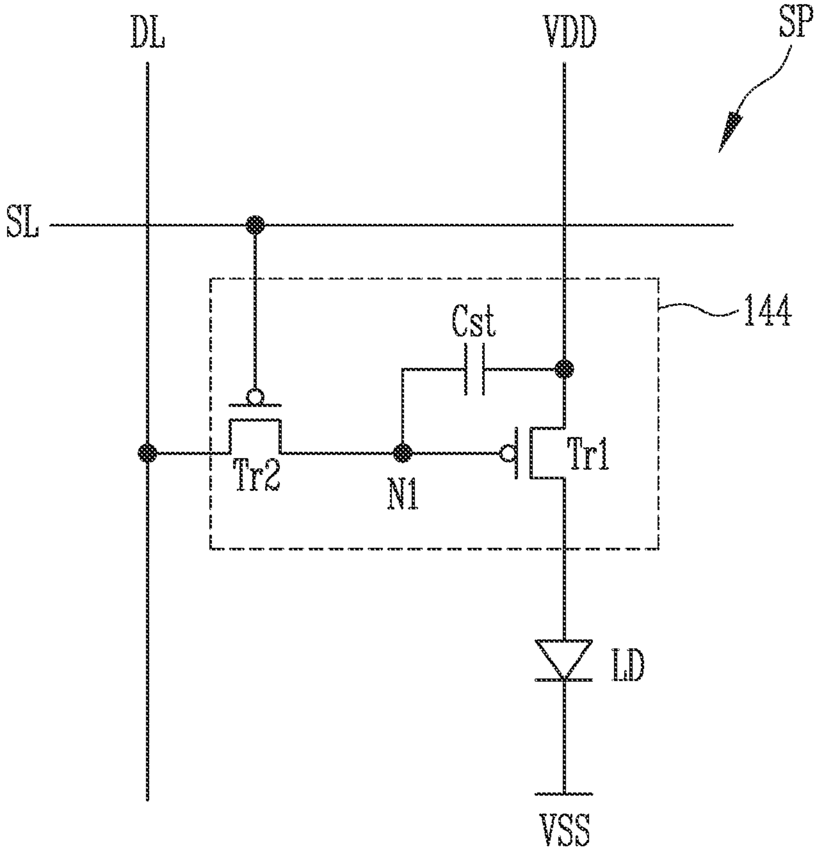
FIGS. 2A and 2B are circuit diagrams illustrating a unit emission area of a display device according to one or more embodiments of the present disclosure.
Figure 2B:
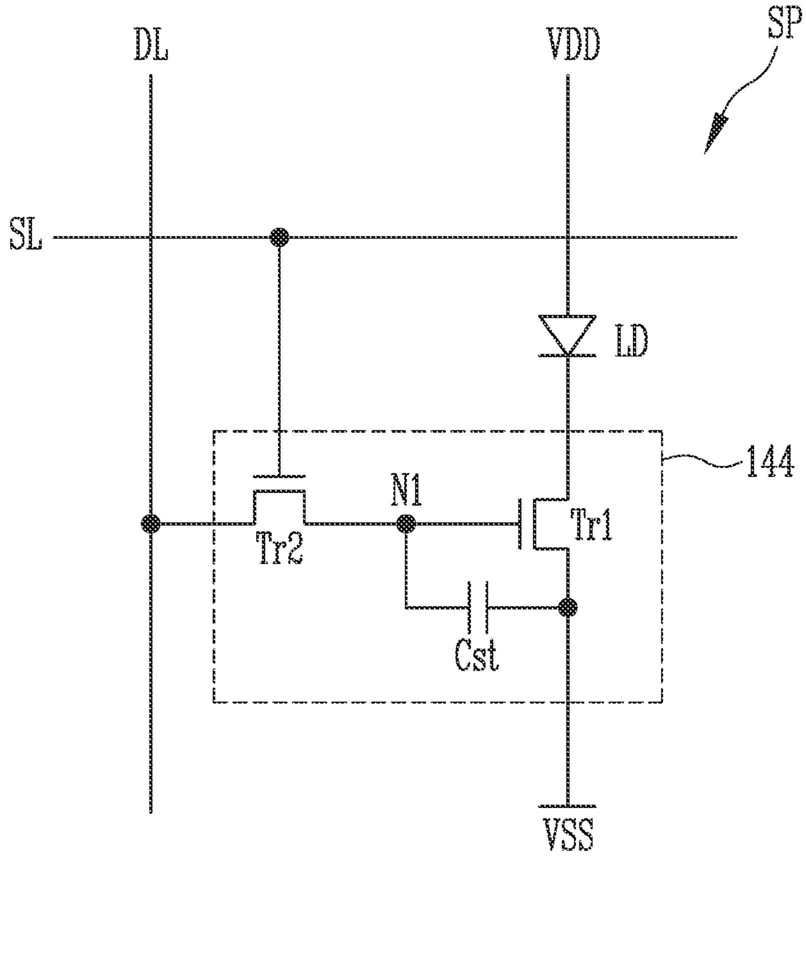

FIGS. 2A and 2B are circuit diagrams illustrating a unit emission area of a display device according to one or more embodiments of the present disclosure.

FIGS. 2A and 2B illustrate an example of a pixel forming an active light emitting display panel. In one or more embodiments of the present disclosure, the unit emission area may be a pixel area in which one sub-pixel is provided.

Referring to FIG. 2A, a sub-pixel SP may include one or more light emitting elements LD and a pixel driving circuit 144 coupled to the light emitting elements LD and configured to drive the light emitting elements LD.

A first electrode (e.g., an anode electrode) of each light emitting element LD may be coupled to a first driving power source VDD via the pixel driving circuit 144, and a second electrode (e.g., a cathode electrode) of the light emitting element LD may be coupled to a second driving power source VSS.

Here, the first and second driving power sources VDD and VSS may have different potentials. For example, the second driving power source VSS may have a potential lower than that of the first driving power source VDD by a threshold voltage of the light emitting element LD or more.

Each of the light emitting elements LD may emit light with luminance corresponding to a driving current controlled by the pixel driving circuit 144.

Although an embodiment in which only one light emitting element LD is included in the sub-pixel SP is illustrated in FIG. 2A, the present disclosure is not limited thereto. For example, the sub-pixel SP may include a plurality of light emitting elements LD coupled in parallel to each other.

In accordance with one or more embodiments of the present disclosure, the pixel driving circuit 144 may include a first transistor T1, a second transistor Tr2, and a storage capacitor Cst. However, the structure of the pixel driving circuit 144 is not limited to the embodiment illustrated in FIG. 2A.

A first electrode of the first transistor Tr1 (e.g., a driving transistor) may be coupled to the first driving power source VDD, and a second electrode thereof may be electrically connected to the first electrode of each of the light-emitting elements LD. A gate electrode of the first transistor Tr1 is coupled to a first node N1. Such a first transistor Tr1 controls the amount of driving current supplied to the light-emitting elements LD in response to the voltage of the first node N1.

A first electrode of the second transistor Tr2 (e.g., a switching transistor) is coupled to a data line DL, and a second electrode thereof is coupled to the first node N1. Here, the first electrode and the second electrode of the second transistor Tr2 may be different electrodes, wherein, when the first electrode is, for example, a source electrode, the second electrode may be a drain electrode. Also, a gate electrode of the second transistor Tr2 is coupled to a scan line SL.

Such a second transistor Tr2 is turned on when a scan signal having a voltage (e.g., a low voltage) enabling the second transistor Tr2 to be turned on is supplied from the scan line SL, thus electrically connecting the data line DL and the first node N1 to each other. In this case, a data signal for a corresponding frame is supplied to the data line DL, and the data signal is transferred to the first node N1. The data signal transferred to the first node N1 is charged in the storage capacitor Cst. For example, the storage capacitor holds a charge corresponding the data signal transferred to the first node N1.

One electrode of the storage capacitor Cst is coupled to the first driving power source VDD, and the other electrode thereof is coupled to the first node N1. Such a storage capacitor Cst may charge a voltage corresponding to the data signal supplied to the first node N1, and maintain the charged voltage until a data signal for a subsequent frame is supplied.

For convenience of description, the pixel driving circuit 144 having a relatively simple structure, which includes the second transistor Tr2 for transferring the data signal into the sub-pixel SP, the storage capacitor Cst for storing the data signal, and the first transistor Tr1 for supplying the driving current corresponding to the data signal to the light emitting element LD, is illustrated in FIG. 2A.

However, the present disclosure is not limited thereto, and the structure of the pixel driving circuit 144 may be modified and practiced in various forms. For example, it is apparent that the pixel driving circuit 144 may further include at least transistor element such as a transistor element for compensating for the threshold voltage of the first transistor T1, a transistor element for initializing the first node N1, and/or a transistor element for controlling an emission time of the light emitting element LD, or other circuit elements such as a boosting capacitor for boosting the voltage of the first node N1.

Also, although, in FIG. 2A, all of the transistors included in the pixel driving circuit 144, e.g., the first and second transistors Tr1 and Tr2, are illustrated as P-type transistors, the present disclosure is not limited thereto. That is, at least one of the first and second transistors Tr1 and Tr2 included in the pixel driving circuit 144 may be replaced with an N-type transistor.

Referring to FIG. 2B, in accordance with one or more embodiments of the present disclosure, first and second transistors Tr1 and Tr2 may be implemented as N-type transistors. The pixel driving circuit 144 illustrated in FIG. 2B is similar to the pixel driving circuit 144 of FIG. 2A in configuration and operation thereof, except for a change in connection locations of some components attributable to a change in the type of transistors. Therefore, a detailed description thereof will be omitted.

Figure 3:
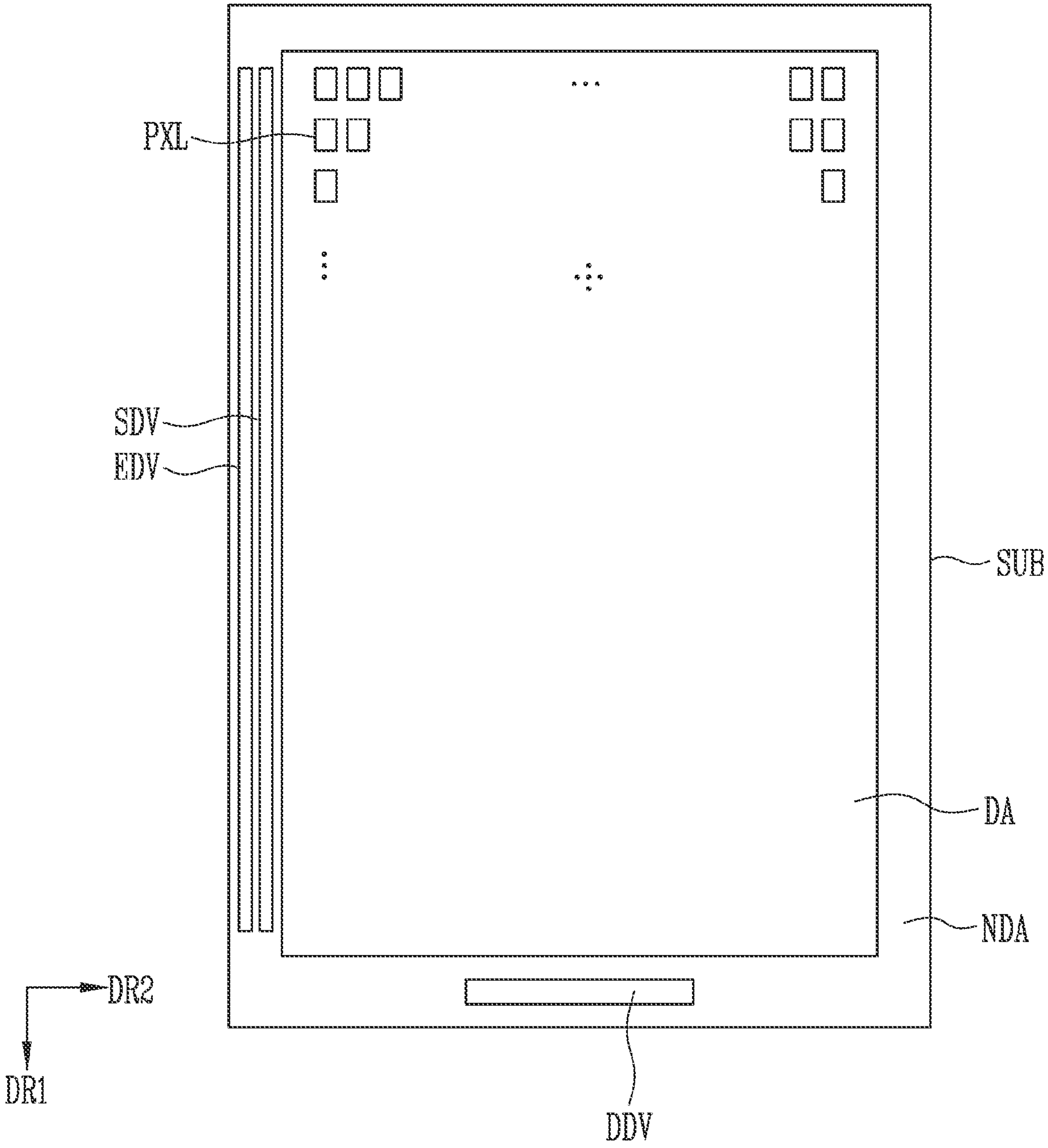
FIG. 3 is a plan view illustrating a display device according to one or more embodiments of the present disclosure.

FIG. 3 is a plan view illustrating a display device according to one or more embodiments of the present disclosure. In particular, illustrated is a schematic plan view of the display device which uses the light emitting element LD illustrated in FIG. 1A or 1B as a light emitting source.

Referring to FIGS. 1A, 1B, and 3, the display device according to one or more embodiments of the present disclosure may include a substrate SUB, pixels PXL which are provided on one surface of the substrate SUB, a driver which is provided on the substrate SUB and configured to drive the pixels PXL, and a line circuit which couples the pixels PXL to the driver.

The display device may be classified into a passive matrix-type display device and an active matrix-type display device according to the scheme for driving a light emitting element LD. For example, when the display device is implemented in an active matrix type, each of the pixels PXL may include a driving transistor for controlling the amount of current supplied to the light emitting element LD, a switching transistor for transferring a data signal to the driving transistor, etc.

Recently, from the standpoint of resolution, contrast, and operating speed, the active matrix-type display device for selecting and turning on each pixel PXL becomes mainstream, but the present disclosure is not limited thereto, and the passive matrix-type display device for turning on each group of pixels PXL may also use components (e.g., first and second electrodes, etc.) for driving the light emitting element LD.

The substrate SUB may include a display area DA and a non-display area NDA. The display area DA may be an area in which the pixels PXL for displaying an image are provided. The non-display area NDA may be an area in which a driver for driving the pixels PXL and a portion of the line circuit for coupling the pixels PXL to the driver are provided.

The pixels PXL may be provided in the display area DA on the substrate SUB. Each of the pixels PXL may be a unit by which an image is displayed, and may be provided as a plurality of pixels. The pixels PXL may include a light emitting element LD that emits white light and/or color light. Each pixel PXL may emit, but is not limited to, light having any one color among red, green, and blue. For example, each pixel PXL may emit light having any one color among cyan, magenta, yellow, and white.

The pixels PXL may be provided as a plurality of pixels, and may be arranged in a matrix form along columns extending in a first direction DR1 and rows extending in a second direction DR2 intersecting the first direction DR1. However, the arrangement form of the pixels PXL is not especially limited, and the pixels PXL may be arranged in various forms.

The driver may provide a signal to each pixel PXL through the line circuit, and may then control the operation of the pixel PXL. In FIG. 3, a line circuit is omitted for convenience of description.

The driver may include a scan driver SDV configured to provide a scan signal to each pixel PXL through a scan line, an emission driver EDV configured to provide an emission control signal to each pixel PXL through an emission control line, a data driver DDV configured to provide a data signal to each pixel PXL through a data line, and a timing controller. The timing controller may control the scan driver SDV, the emission driver EDV, and the data driver DDV.

The display device according to one or more embodiments of the present disclosure may be employed in various electronic devices. For instance, the display device may be applied to a television, a notebook computer, a cellular phone, a smartphone, a smartpad (PD), a portable multimedia player (PMP), a personal digital assistant (PDA), a navigation device, various types of wearable devices such as a smartwatch, etc.

FIGS. 4A to 4F are plan views illustrating a display element layer according to one or more embodiments of the present disclosure. In particular, FIGS. 4A to 4F are plan views illustrating various embodiments of a display element layer DPL on which first to third electrodes EL1, EL2, and EL3 and light emitting elements LD are provided on the same surface of a substrate SUB.

Additionally, in one or more embodiments of the present disclosure, the expression "formed and/or provided on the same surface" may mean that the components are formed in the same process, and the expression "formed and/or provided on different surfaces" may mean that components are formed in different processes.

Although, in FIGS. 4A to 4F, the light emitting elements LD are illustrated as being aligned in parallel and arranged along a second direction DR2, arrangement of the light emitting elements LD is not limited thereto. For example, the light emitting elements LD may be aligned in a diagonal direction with respect to the second direction DR2 between the first and second electrodes EL1 and EL2.

Figure 4A:
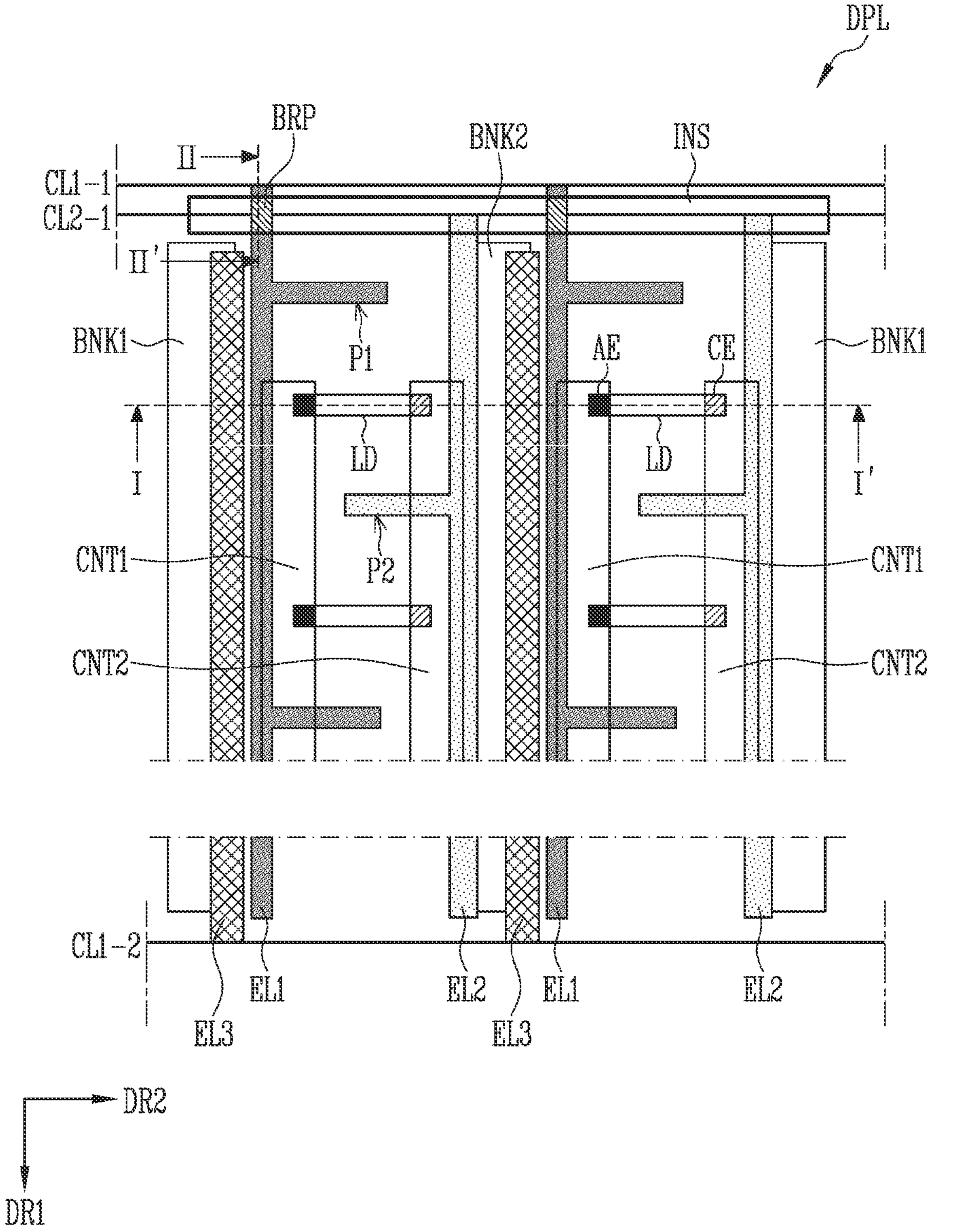
FIGS. 4A to 4F are plan views illustrating a display element layer according to one or more embodiments of the present disclosure.
Figure 4B:
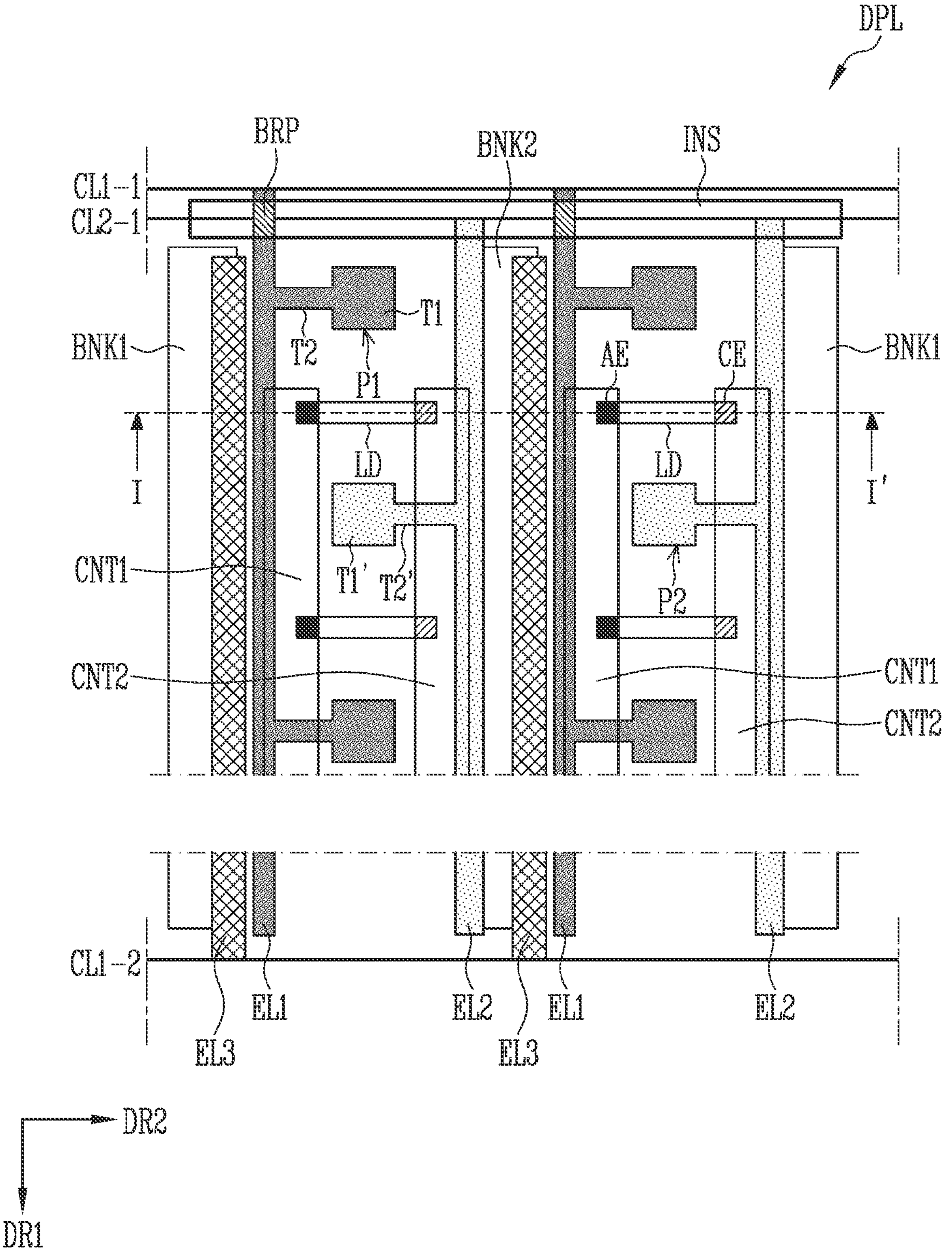
Figure 4C:
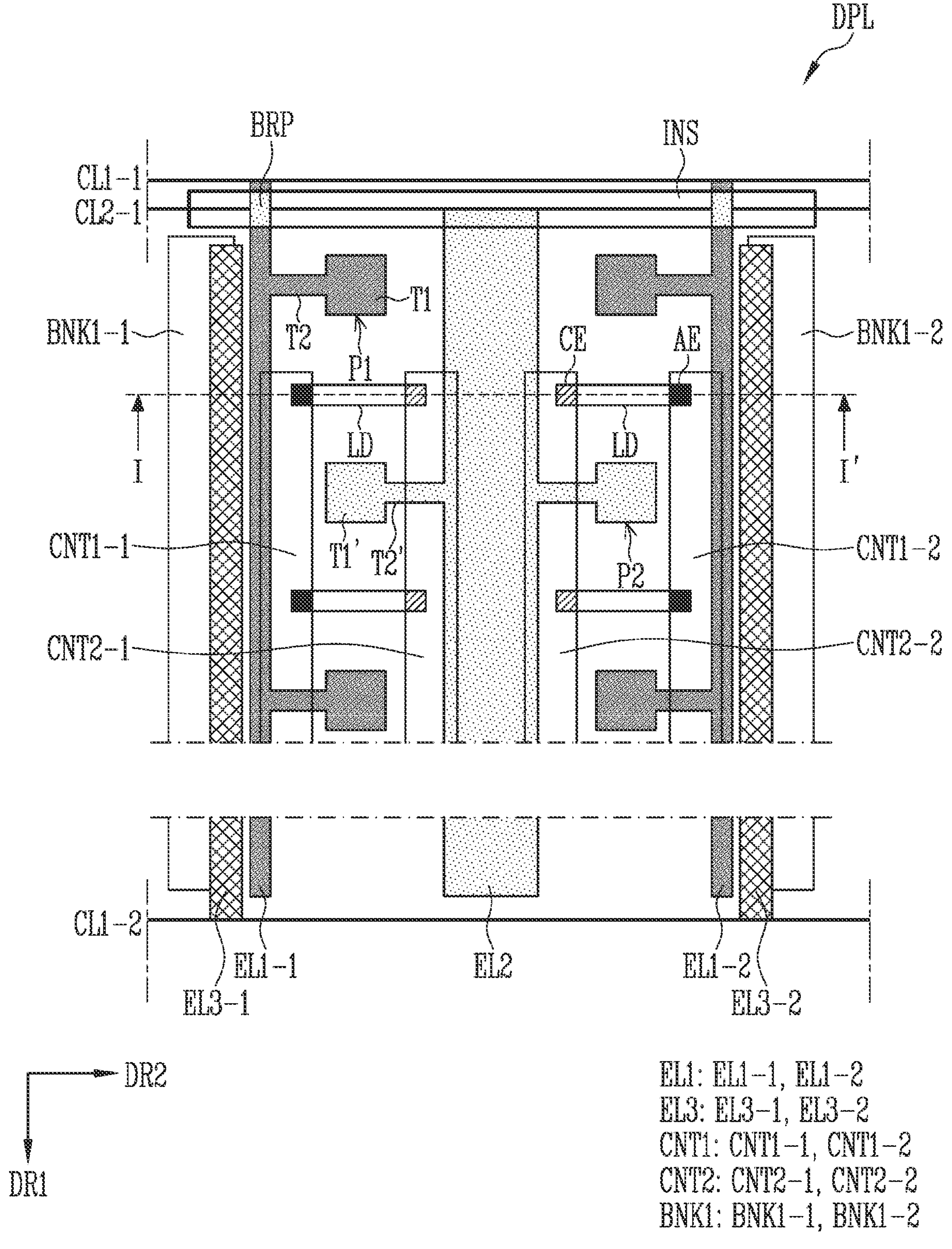
Figure 4D:
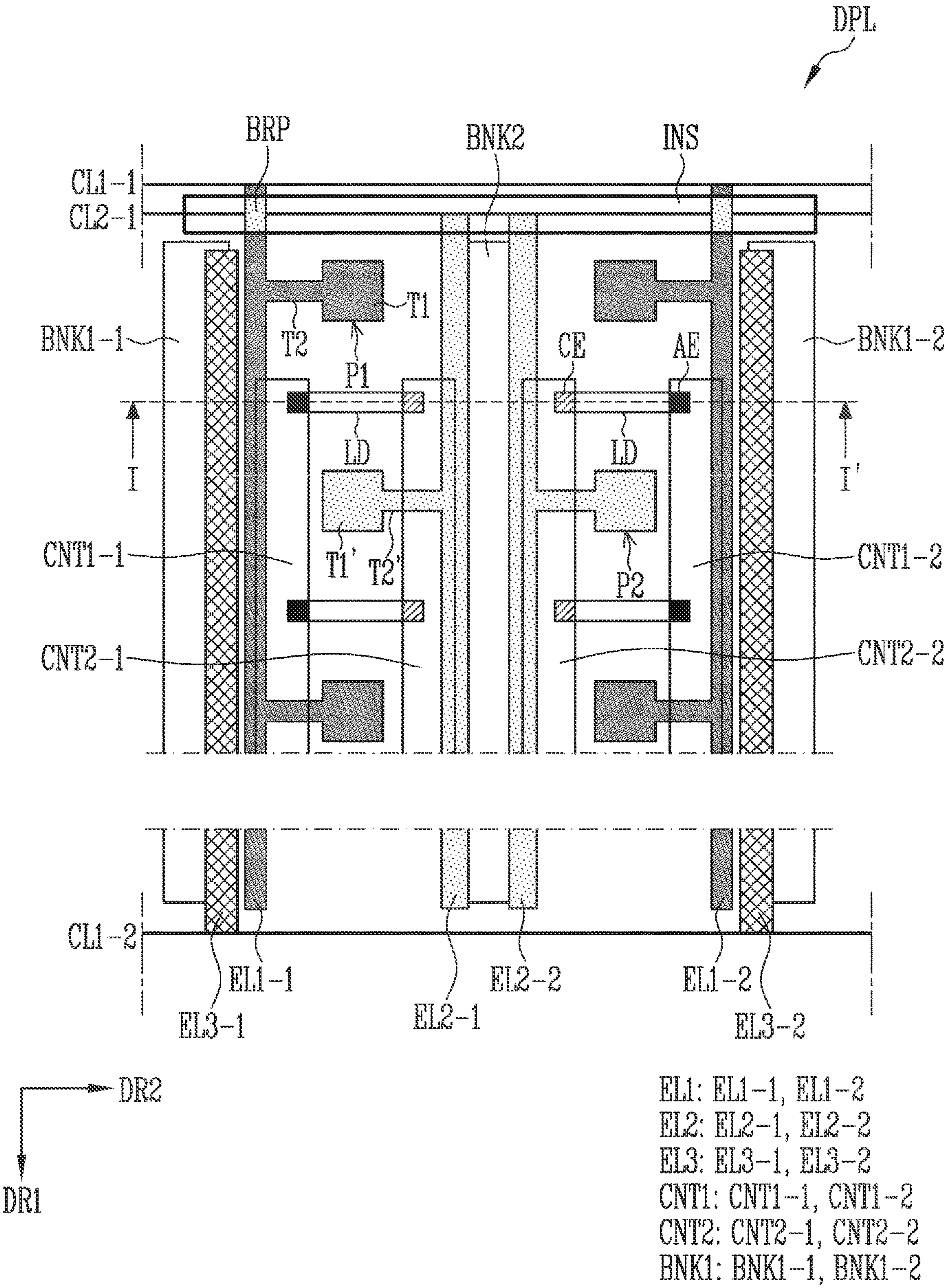
Figure 4E:
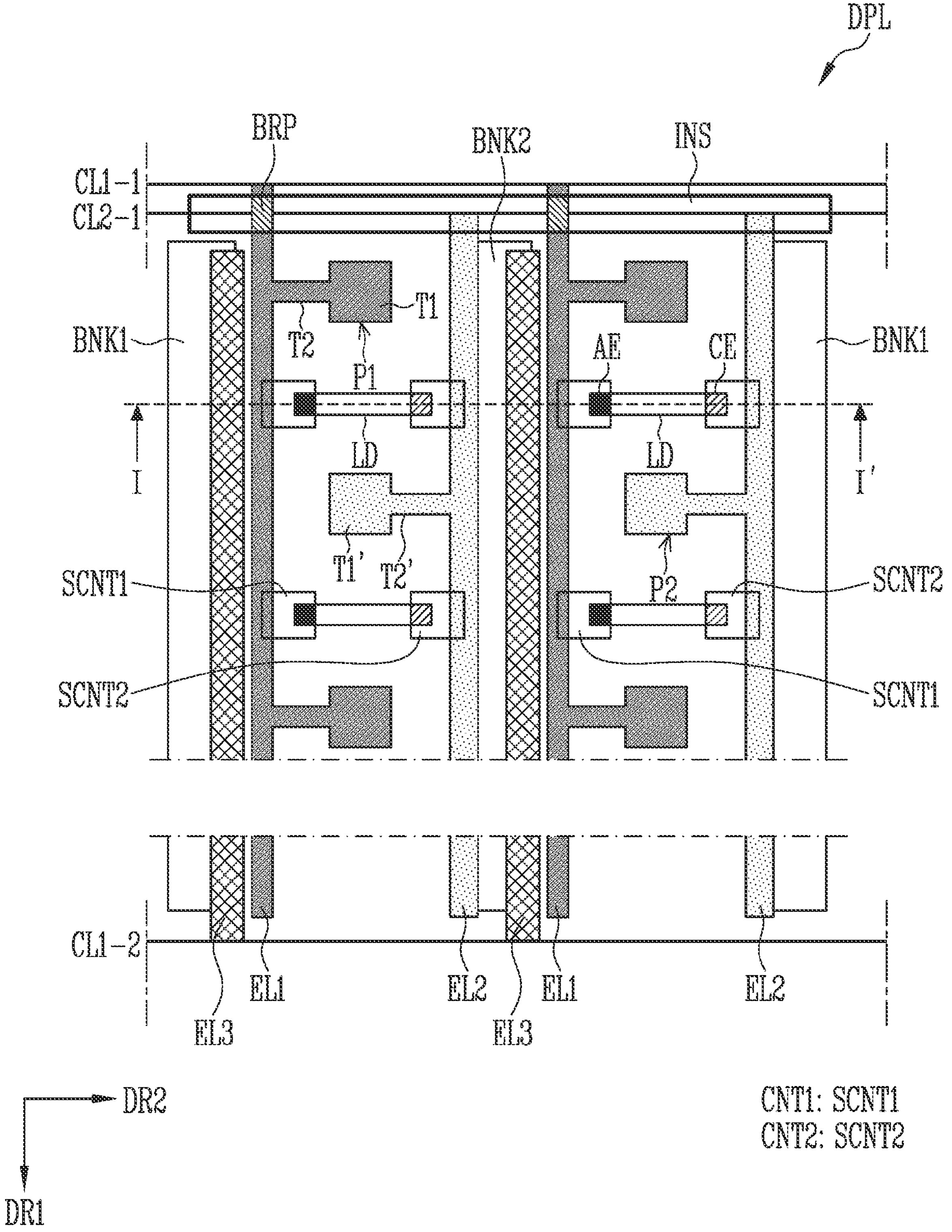
Figure 4F:
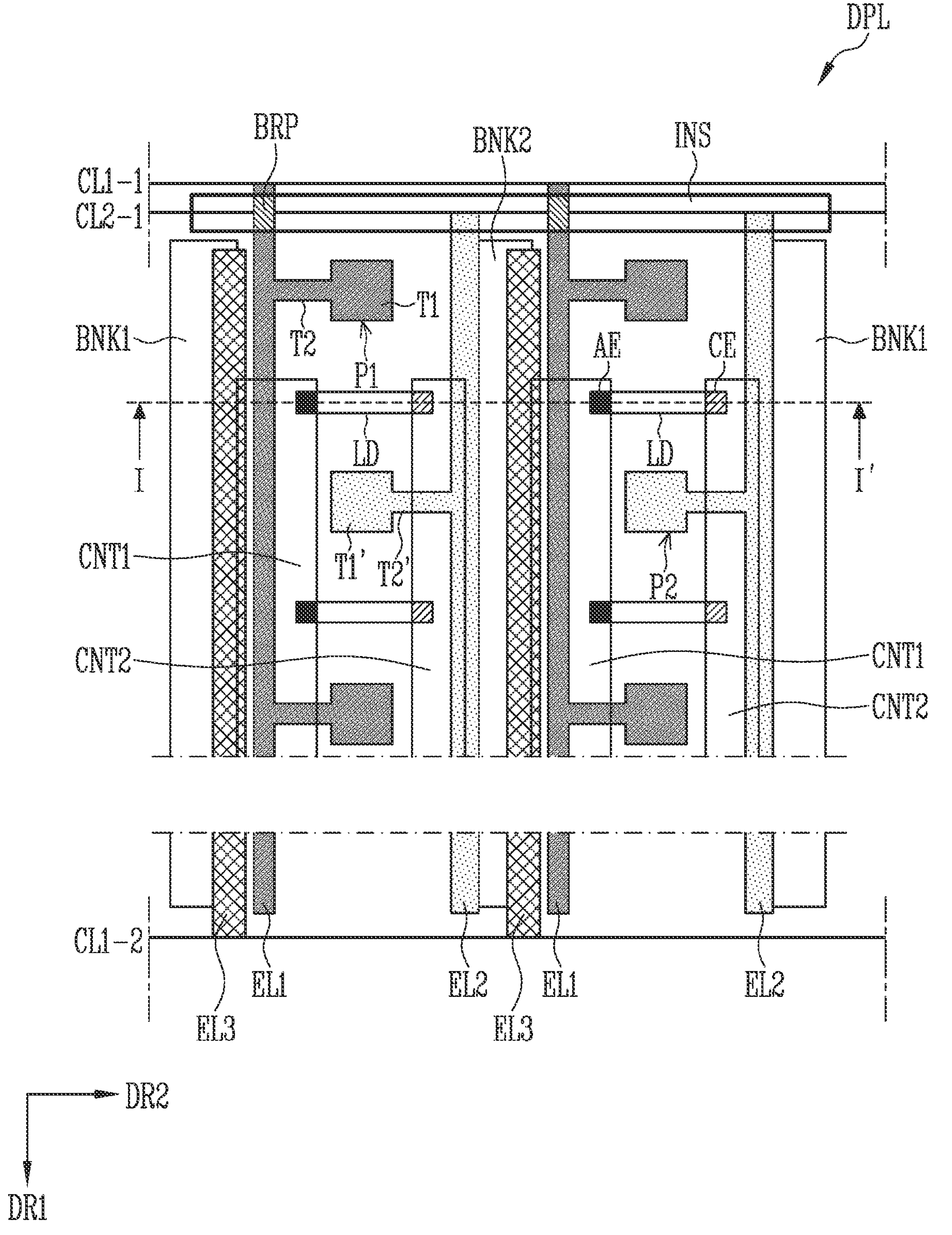
Figure 5A:
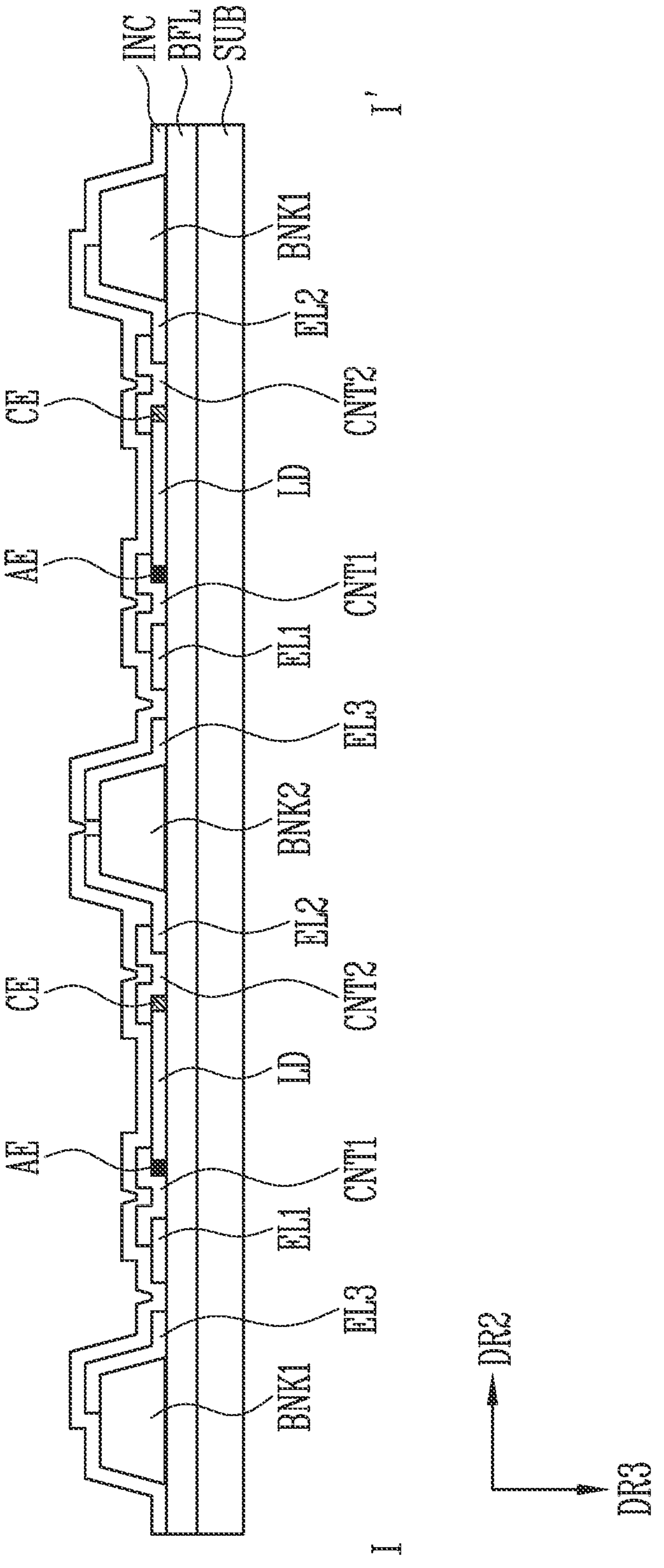
FIG. 5A is a sectional view taken along the line I-I' of FIG. 4A.
Figure 5B:
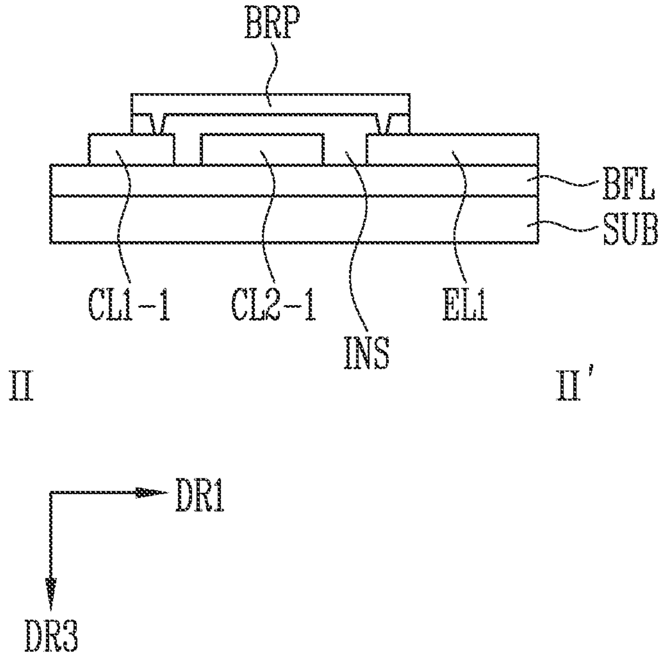
FIG. 5B is a sectional view taken along the line II-II' of FIG. 4A.
Figure 5C:
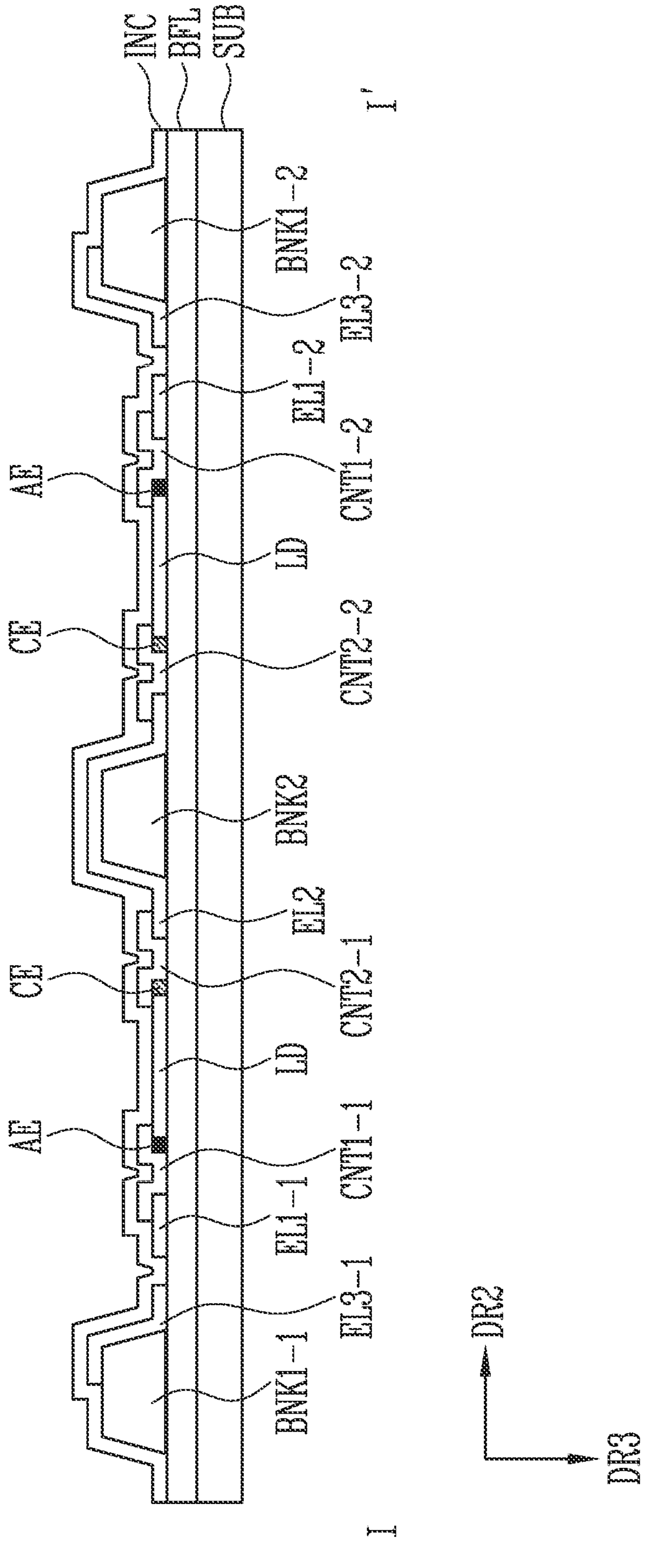
FIG. 5C is a sectional view taken along the line I-I' of FIG. 4C.
Figure 5D:
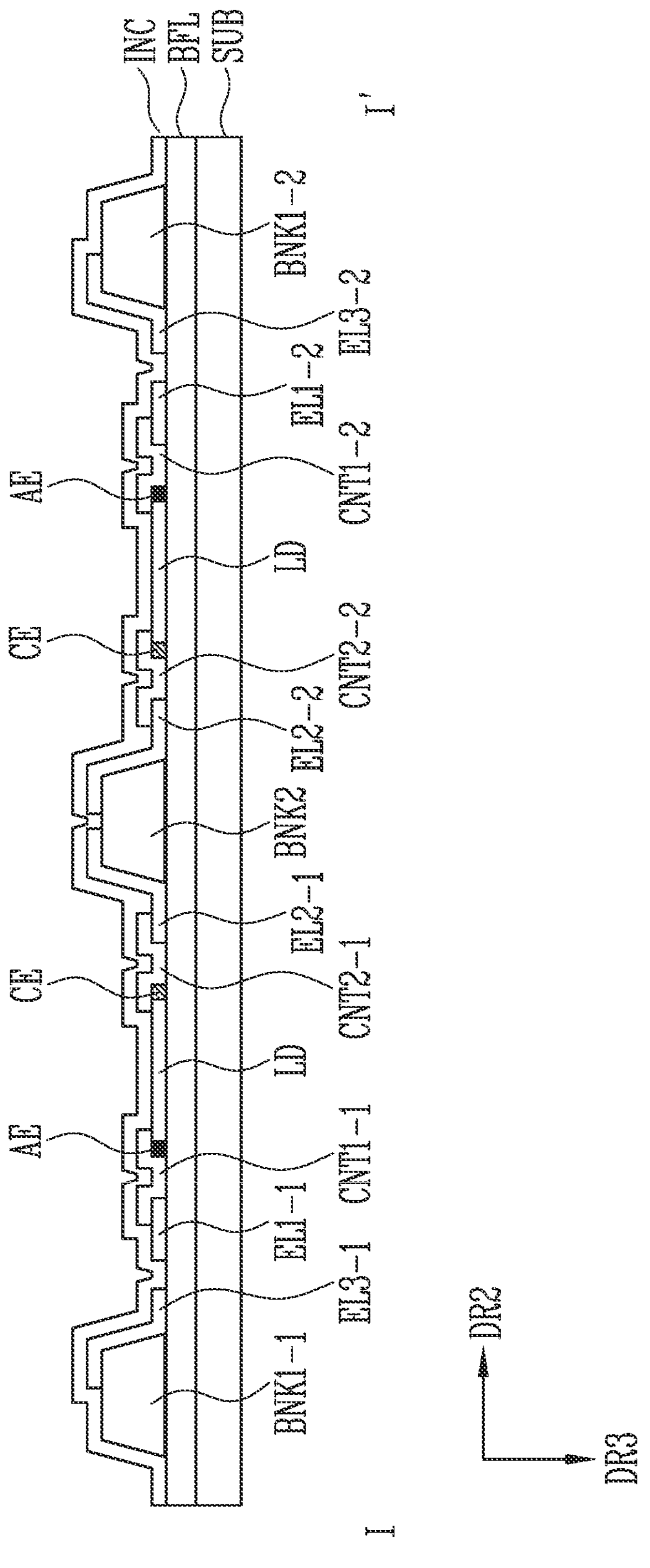
FIG. 5D is a sectional view taken along the line I-I' of FIG. 4D.
Figure 5E:
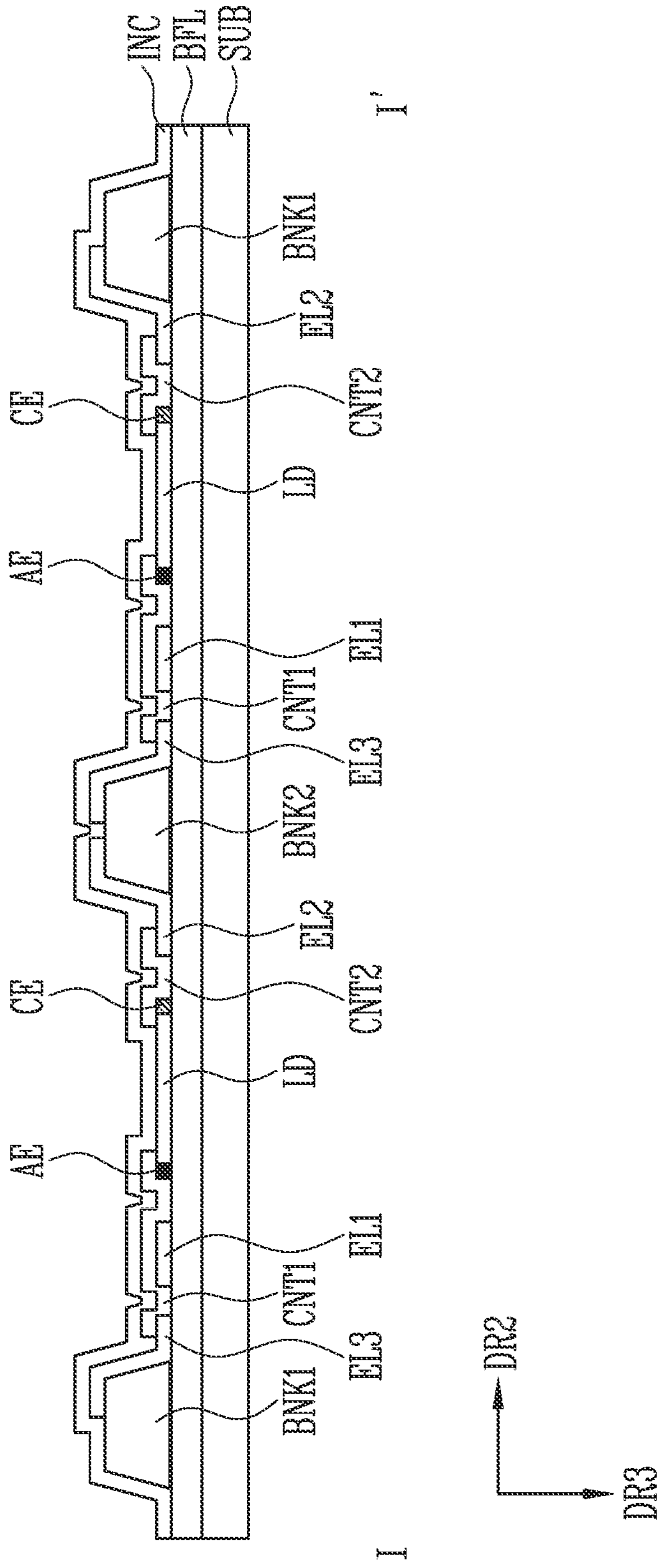
FIG. 5E is a sectional view taken along the line I-I' of FIG. 4F.

FIG. 5A is a sectional view taken along the line I-I' of FIG. 4A, FIG. 5B is a sectional view taken along the line II-II' of FIG. 4A, FIG. 5C is a sectional view taken along the line I-I' of FIG. 4C, FIG. 5D is a sectional view taken along the line I-I' of FIG. 4D, and FIG. 5E is a sectional view taken along the line I-I' of FIG. 4F.

As illustrated in FIGS. 4A to 5E, the display element layer DPL according to one or more embodiments of the present disclosure may include the first to third electrodes EL1, EL2, and EL3 and the light emitting elements LD, which are provided on the substrate SUB.

The substrate SUB may be a rigid substrate or a flexible substrate.

The rigid substrate may include a glass substrate, a quartz substrate, a glass ceramic substrate, and a crystalline glass substrate.

The flexible substrate may include a film substrate and a plastic substrate, each of which includes a polymer organic material. For example, the flexible substrate may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Further, the flexible substrate may include fiber glass reinforced plastic (FRP).

It may be desirable that the material applied to the substrate SUB have resistance (thermal resistance) to high treatment temperature during a process of manufacturing the display device. In various embodiments of the present disclosure, the substrate SUB may entirely or at least partially have flexibility.

The display element layer DPL may include a buffer layer BFL provided on the substrate SUB. The buffer layer BFL may prevent impurities from being diffused into the light emitting elements LD. The buffer layer BFL may be provided in a single layer structure or a multilayer structure having at least two or more layers. In the case where the buffer layer BFL is provided in a multilayer structure, respective layers may be formed of the same material or different materials. In one or more embodiments, the buffer layer BFL may be omitted depending on the material and processing conditions of the substrate SUB.

In one or more embodiments of the present disclosure, the first to third electrodes EL1, EL2, and EL3 and the light emitting elements LD may be provided on the same surface of the substrate SUB. For example, the first to third electrodes EL1, EL2, and EL3 and the light emitting elements LD may be provided on one surface of the substrate SUB or provided on one surface of the buffer layer BFL provided on the substrate SUB.

On the substrate SUB, the first electrode EL1 and the second electrode EL2 may extend in a first direction DR1, and may be provided to be spaced from each other in a second direction DR2. The third electrode EL3 may be provided on the substrate SUB so as to face (or oppose) the second electrode EL2 with the first electrode EL1 interposed therebetween.

As illustrated in FIGS. 4A to 4F, the first electrode EL1 may include first protrusions P1 protruding toward the second electrode EL2 in the second direction DR2, and the first protrusions P1 may be aligned on the first electrode EL1 along the first direction DR1. Also, the second electrode EL2 may include second protrusions P2 protruding toward the first electrode EL1 in the second direction DR2, and the second protrusions P2 may be aligned on the second electrode EL2 along the first direction DR1. Here, the first protrusions P1 and the second protrusions P2 may be alternately arranged along the first direction DR1.

Because the first protrusions P1 are provided on the first electrode EL1 and the second protrusions P2 are provided on the second electrode EL2, the degree of directional alignment of the light emitting elements LD in the display device may be improved. In detail, after the light emitting elements LD have been primarily aligned between the first protrusions P1 and the second protrusions P2, secondary alignment thereof is performed, and thus the degree of directional alignment of the light emitting elements LD may be further improved. Detailed descriptions thereof will be made later.

With respect to the second direction DR2, the first protrusions P1 and the second protrusions P2 may be provided in parallel to each other. Because the first protrusions P1 and the second protrusions P2 are provided in parallel to each other, the light emitting elements LD may be effectively primarily aligned, as will be described later.

Referring to FIGS. 4A to 4F, the first to third electrodes EL1, EL2, and EL3 may be coupled to connection lines CL1-1, CL2-1, and CL1-2, respectively. For example, the first electrode EL1 may be coupled to the 1-1-th connection line CL1-1, the second electrode EL2 may be coupled to the 2-1-th connection line CL2-1, and the third electrode EL3 may be coupled to the 1-2-th connection line CL1-2. The 1-1-th connection line CL1-1 and/or the 1-2-th connection line CL1-2 may be coupled to a first driving power source VDD, and the 2-1-th connection line CL2-1 may be coupled to a second driving power source VSS. In one or more embodiments, the 1-1-th connection line CL1-1 and/or the 1-2-th connection line CL1-2 may be coupled to the second driving power source VSS, and the 2-1-th connection line CL2-1 may be coupled to the first driving power source VDD.

In one or more embodiments of the present disclosure, the substrate SUB may include an emission area in which light emitting elements LD are provided, and a non-emission area in which light emitting elements LD are not provided. In the non-emission area of the substrate SUB, the connection lines CL1-1, CL1-2, and CL2-1 may be disposed, and the display element layer DPL may include an insulating layer INS provided in the non-emission area. The first to third electrodes EL1, EL2, and EL3, the 1-1-th to 2-1-th connection lines CL-1-1, CL1-2, and CL2-1, and the light emitting elements LD may be provided on the same surface of the substrate SUB.

As illustrated in FIGS. 4A to 4F and 5*b*, the insulating layer INS may be provided on the 2-1-th connection line CL2-1, and a bridge pattern BRP may be provided on the insulating layer INS. The bridge pattern BRP may electronically connect the first electrode EL1 to the 1-1-th connection line CL1-1. In another embodiment, the first electrode EL1 may be coupled to the 1-1-th connection line CL1-1 to cross the insulating layer INS without using the bridge pattern BRP.

In one or more embodiments of the present disclosure, the light emitting elements LD may be provided between the first protrusions P1 and the second protrusions P2 with respect to the first direction DR1. The light emitting elements LD may be provided between the first electrode EL1 and the second electrode EL2 with respect to the second direction DR2. In one or more embodiments, the light emitting element may be the second electrode EL2 and the third electrode EL3 with respect to the second direction DR2.

Respective first ends of the light emitting elements LD may be aligned toward one of the first electrode EL1 and the second electrode EL2. That is, the light emitting elements LD may be directionally aligned on the substrate SUB. For example, the light emitting elements LD may be aligned such that respective first ends thereof face (or oppose) the first electrode EL1 and respective second ends thereof face (or oppose) the second electrode EL2. Here, the first ends of the light emitting elements LD may be anode electrodes AE, and the second ends of the light emitting elements LD may be cathodes electrodes CE. In one or more embodiments, the first ends of the light emitting elements LD may be cathode electrodes CE, and the second ends of the light emitting elements LD may be anode electrodes AE.

Although the case where the first ends (e.g., anode electrodes AE) of the light emitting elements LD face (or oppose) the first electrode EL1 and the seconds ends (e.g., cathode electrodes CE) face (or oppose) the second electrode EL2 is illustrated In FIGS. 4A to 4F, the first ends of the light emitting elements LD may face (or oppose) the second electrode EL2, and the second ends thereof may face (or oppose) the first electrode EL1, unlike the above-described case.

In one or more embodiments of the present disclosure, the display element layer DPL may include a first contact electrode CNT1 for electrically connecting at least one of the first electrode EL1 and the third electrode EL3 to the light emitting elements LD and a second contact electrode CNT2 for electrically connecting the second electrode EL2 to the light emitting elements LD. In detail, the first contact electrode CNT1 may electrically connect at least the first electrode EL1 of the first electrode EL1 and the third electrode EL3 to the light emitting elements LD.

The first and second contact electrodes CNT1 and CNT2 may include at least one of various transparent conductive materials including ITO, IZO, and ITZO, and may be implemented to be substantially transparent or translucent so as to satisfy a desired transmittance (e.g., a set or predetermined transmittance). However, the material of the first and second contact electrodes CNT1 and CNT2 is not limited to the above-described embodiments, and the first and second contact electrodes CNT1 and CNT2 may be formed of various opaque conductive materials in accordance with one or more embodiments.

The first and second contact electrodes CNT1 and CNT2 may each be formed of a transparent conductive material so that light emitted from each of the light emitting elements LD reaches the second and third electrodes EL2, EL3 without loss.

Referring to FIGS. 4A to 4E, the first contact electrode CNT1 may electrically connect the first electrode EL1 to the first ends (e.g., anode electrodes AE) of the light emitting elements LD, and the second contact electrode CNT2 may electrically connect the second electrode EL2 to the second ends (e.g., cathode electrodes CE) of the light emitting elements LD.

The first electrode EL1 may be connected to the 1-1-th connection line CL1-1, and the 1-1-th connection line CL1-1 may be connected to the first driving power source VDD. That is, the first electrode EL1 may be electrically connected to the first driving power source VDD via the 1-1-th connection line CL1-1. The first contact electrode CNT1 that is electrically connected to the first electrode EL1 may apply the voltage of the first driving power source VDD (e.g., alternating current (AC) voltage) to the first ends of the light-emitting elements LD.

The second electrode EL2 may be connected to the 2-1-th connection line CL2-1, and the 2-1-th connection line CL2-1 may be connected to the second driving power source VSS. That is, the second electrode EL2 may be electrically connected to the second driving power source VSS via the 2-1-th connection line CL2-1. The second contact electrode CNT2 that is electrically connected to the second electrode EL2 may apply the voltage of the second driving power source VSS (e.g., ground (GND) voltage) to the second ends of the light-emitting elements LD.

As described above, as an electric field of a suitable voltage (e.g., a set or predetermined voltage) or more is applied to both ends of the light emitting elements LD, the light emitting elements LD emit light while electron and holes are coupled to each other to create electron-hole pairs in the active layers 12 of the light emitting elements LD.

Referring to FIG. 4F, the first contact electrode CNT1 may electrically connect the first and third electrodes EL1 and EL3 to the first ends (e.g., anode electrodes AE) of the light emitting elements LD, and the second contact electrode CNT2 may electrically connect the second electrode EL2 to the second ends (e.g., cathode electrodes CE) of the light emitting elements LD.

In one or more embodiments of the present disclosure, one of the 1-1-th connection line CL1-1 and the 1-2-th connection line CL1-2 may be coupled to the first driving power source VDD. For example, when the 1-1-th connection line CL1-1 is coupled to the first driving power source VDD, the first contact electrode CNT1 may supply the driving voltage of the first driving power source VDD, transferred through the first electrode EL1, to the first ends of the light emitting elements LD. In contrast, when the 1-2-th connection line CL1-2 is coupled to the first driving power source VDD, the first contact electrode CNT1 may supply the driving voltage of the first driving power source VDD, transferred through the third electrode EL3, to the first ends of the light emitting elements LD.

In one or more embodiments of the present disclosure, the display element layer DPL may include banks BNK1 and BNK2 spaced from each other with the light emitting elements LD interposed therebetween.

As illustrated in FIGS. 4A to 5E, the banks BNK1 and BNK2 may be provided on the substrate SUB in a form in which they extend in the first direction DR1 and are spaced from each other in the second direction DR2, and may partition the unit emission areas.

The two banks BNK1 and BNK2 adjacent to each other on the substrate SUB may be spaced from each other by a suitable interval (e.g., a set or predetermined interval) in the second direction DR2. For example, the two first and second banks BNK1 and BNK2 adjacent to each other may be spaced from each other by the length of the light emitting elements LD or more on the substrate SUB.

Each of the first and second banks BNK1 and BNK2 may include an inorganic insulating layer formed of an inorganic material or an organic insulating layer formed of an organic material. In one or more embodiments, each of the first and second banks BNK1 and BNK2 may include, but is not limited to, an organic insulating layer having a single layer structure and/or an inorganic insulating layer having a single layer structure. In one or more embodiments, each of the first and second banks BNK1 and BNK2 may be provided in a multi-layer form in which one or more organic insulating layers and one or more inorganic insulating layers are stacked. However, materials of the first and second banks BNK1 and BNK2 are not limited to the above-described embodiments, and, in accordance with one or more embodiments, the first and second banks BNK1 and BNK2 may include a conductive material.

The banks BNK1 and BNK2 may have, but are not limited to, a trapezoidal section, the width of which decreases upwards in the third direction DR3. In one or more embodiments, the banks BNK1 and BNK2 may include a curved surface having a semicircular or semielliptical section, the width of which decreases upwards. In the present disclosure, the shapes and/or gradients of the banks BNK1 and BNK2 are not especially limited, and may be changed in various forms.

Referring to FIGS. 4A to 5E, the second electrode EL2 and the third electrode EL3 may be provided on the first and second banks BNK1 and BNK2. The second and third electrodes EL2 and EL3 may be provided to correspond to the shapes of the first and second banks BNK. That is, the second electrode EL2 and the third electrode EL3 may have shapes corresponding to the gradients of the first and second banks BNK1 and BNK2. For example, each of the second and third electrodes EL3 may include a protruding portion corresponding to the first and second banks BNK1 and BNK2 and a flat portion corresponding to the substrate SUB.

In one or more embodiments of the present disclosure, the second electrode EL2 and the third electrode EL3 may be reflective electrodes. The second and third electrodes EL2 and EL3, which are reflective electrodes, may guide light emitted from the light emitting elements LD in a direction from the substrate SUB to the display element layer DPL (e.g., a front direction).

Each of the first and second banks BNK1 and BNK2 and the second and third electrodes EL2 and EL3 may function as a reflective element which guides light emitted from each light emitting element LD to a desired direction and then improves optical efficiency of the display device. That is, each of the first and second banks BNK1 and BNK2 and the second and third electrodes EL2 and EL3 may function as a reflective element which enables light emitted from each light emitting element LD to travel in the front direction of the display device (e.g., an image display direction), thus improving light emission efficiency of the display elements LD.

The second electrode EL2 and the third electrode EL3, which are reflective electrodes, may include a conductive material having high light reflectivity. The conductive material having high light reflectivity may include, for example, metals such as Ag, Mg, Al, Pt, Pd, Au, Ni, Nd, Ir, Cr, and Ti, and an alloy thereof. In accordance with one or more embodiments, each of the second and third electrodes EL2 and EL3 may include a transparent conductive material. The transparent conductive material may include a conductive oxide such as an indium tin oxide (ITO), an indium zinc oxide (IZO), a zinc oxide (ZnO), or an indium tin zinc oxide (ITZO), a conductive polymer such as PEDOT, etc. When each of the second and third electrodes EL2 and EL3 includes the transparent conductive material, a separate conductive layer made of an opaque metal for reflecting light emitted from each light emitting element LD in the front direction of the display device (i.e. the image display direction or the third direction DR3) may be further added. However, respective materials of the second and third electrodes EL2 and EL3 are not limited to the above-described materials.

The first electrode EL1 may include a transparent conductive material. The transparent conductive material may include, for example, ITO, IZO, ZNO, ITZO, etc., but the material used to form the first electrode EL1 is not limited thereto.

Referring to FIGS. 4A, 4B, 4E, and 4F, the second electrode EL2 and the third electrode EL3 may be provided on portions of the first and second banks BNK1 and BNK2. For example, the third electrode EL3 may be provided in an area adjacent to the first electrode EL1, among areas of the first and second banks BNK1 and BNK2, and the second electrode EL2 may be provided in an area opposite the area. That is, the second electrode EL2 may be provided on one side of each of the first and second banks BNK1 and BNK2 in the second direction DR2, and the third electrode EL3 may be provided on other side thereof.

In one or more embodiments of the present disclosure, the display element layer DPL may include a bank pattern.

The bank pattern may enclose at least one side of a peripheral area of each pixel PXL. The bank pattern may be a structure which defines (or partitions) sub-emission areas of each pixel PXL and pixels PXL adjacent thereto, and may be, for example, a pixel defining layer. Such a bank pattern may be configured to include at least one light shielding material and/or reflective material, thus preventing occurrence of a light leakage defect indicating that light is leaked between each pixel PXL and pixels PXL adjacent thereto. In accordance with one or more embodiments, in order to further improve efficiency of light emitted from each pixel PXL, a reflective material layer may be formed on the bank pattern. The bank pattern may be formed and/or provided on a layer different from the layer of the banks BNK1 and BNK2, but the present disclosure is not limited thereto, and in accordance with an embodiment, the bank pattern may be formed and/or provided on the same layer as the banks BNK1 and BNK2.

In various embodiments of the present disclosure, each first protrusion P1 may include a first end T1 adjacent to the second electrode EL2 and a second end T2 adjacent to the first electrode EL1, and each second protrusion P2 may include a first end T1' adjacent to the first electrode EL1 and a second end T2' adjacent to the second electrode EL2.

As illustrated in FIG. 4B, the widths of the first ends T1 and T1' of the first protrusion P1 and the second protrusion P2 in the first direction DR1 may be greater than those of the second ends T2 and T2'. The widths of the first ends T1 and T1' of the first protrusion P1 and the second protrusion P2 in the first direction DR1 may be formed to be greater than those of the second ends T2 and T2', and thus primary alignment of the light emitting elements LD may be effectively performed, as will be described later.

Although the case where in the first ends T1 and T1' of the first and second protrusions P1 and P2 have rectangular shapes is illustrated in FIG. 4B, the shapes of the first ends T1 and T1' are not limited, and may be, for example, elliptical, trapezoidal, and semicircle shapes.

Referring to FIGS. 4C and 5C, a 1-1-th bank BNK1-1 and a 1-2-th bank BNK1-2 may be provided to be spaced from each other with the second bank BNK2 interposed therebetween. The second electrode EL2 may be provided on the entire portion of the second bank BNK2, a 3-1-th electrode EL3-1 may be provided on a portion of the 1-1-th bank BNK1-1, and a 3-2-th electrode EL3-2 may be provided on a portion of the 1-2-th bank BNK1-2. The 1-1-th electrode EL1-1 may be provided between the 3-1-th electrode EL3-1 and the second electrode EL2, and the 1-2-th electrode EL1-2 may be provided between the second electrode EL2 and the 3-2-th electrode EL3-2.

The first ends (e.g., anode electrodes AE) of the light emitting elements LD provided between the 1-1-th electrode EL1-1 and the second electrode EL2 may face (or oppose) the 1-1-th electrode EL1-1, and second ends thereof (e.g., cathode electrodes CE) may face (or oppose) the second electrodes EL2. The first ends (e.g., anode electrodes AE) of the light emitting elements LD provided between the 1-2-th electrode EL1-2 and the second electrode EL2 may face (or oppose) the 1-2-th electrode EL1-2, and second ends thereof (e.g., cathode electrodes CE) may face (or oppose) the second electrodes EL2.

A 1-1-th contact electrode CNT1-1 may electrically connect the 1-1-th electrode EL1-1 to the first ends of the light emitting elements LD, and a 2-1-th contact electrode CNT2-1 may electrically connect the second electrode EL2 to the second ends of the light emitting elements LD. A 1-2-th contact electrode CNT1-2 may electrically connect the 1-2-th electrode EL1-2 to the first ends of the light emitting elements LD, and a 2-2-th contact electrode CNT2-2 may electrically connect the second electrode EL2 to the second ends of the light emitting elements LD.

As illustrated in FIGS. 4C and 5C, when the second electrode EL2 is provided on the entire surface of the second bank BNK2, and the width of the second electrode EL2 in the second direction DR2 is increased, the drop of a driving voltage applied through the 2-1-th connection line CL2-1 may be reduced or minimized, and then the driving voltage may be provided to the 2-1-th and 2-2-th contact electrodes CNT2-1 and CNT2-2.

Referring to FIGS. 4D and 5D, a 1-1-th bank BNK1-1 and a 1-2-th bank BNK1-2 may be provided to be spaced from each other with the second bank BNK2 interposed therebetween. The 2-1-th and 2-2-th electrodes EL2-1 and EL2-2 may be provided on portions of both sides of the second bank BNK2, a 3-1-th electrode EL3-1 may be provided on a portion of the 1-1-th bank BNK1-1, and a 3-2-th electrode EL3-2 may be provided on a portion of the 1-2-th bank BNK1-2. The 1-1-th electrode EL1-1 may be provided between the 3-1-th electrode EL3-1 and the 2-1-th electrode EL2-1, and the 1-2-th electrode EL1-2 may be provided between the 2-2-th electrode EL2-2 and the 3-2-th electrode EL3-2.

The first ends (e.g., anode electrodes AE) of the light emitting elements LD provided between the 1-1-th electrode EL1-1 and the 2-1-th electrode EL2-1 may face (or oppose) the 1-1-th electrode EL1-1, and the second ends thereof (e.g., cathode electrodes CE) may face (or oppose) the 2-1-th electrodes EL2-1. The first ends (e.g., anode electrodes AE) of the light emitting elements LD provided between the 1-2-th electrode EL1-2 and the 2-2-th electrode EL2-2 may face (or oppose) the 1-2-th electrode EL1-2, and the second ends thereof (e.g., cathode electrodes CE) may face (or oppose) the 2-2-th electrodes EL2-2.

The 1-1-th contact electrode CNT1-1 may electrically connect the 1-1-th electrode EL1-1 to the first ends of the light emitting elements LD, and the 2-1-th contact electrode CNT2-1 may electrically connect the 2-1-th electrode EL2-1 to the second ends of the light emitting elements LD. The 1-2-th contact electrode CNT1-2 may electrically connect the 1-2-th electrode EL1-2 to the first ends of the light emitting elements LD, and the 2-2-th contact electrode CNT2-2 may electrically connect the 2-2-th electrode EL2-2 to the second ends of the light emitting elements LD.

In one or more embodiments of the present disclosure, as shown in FIG. 4E, the first contact electrode CNT1 may include first sub-contact electrodes SCNT1 that are coupled to a portion of the first electrode EL1 adjacent to the light emitting elements LD and that are spaced from each other in the first direction DR1. The second contact electrode CNT2 may include second sub-contact electrodes SCNT2 that are coupled to a portion of the second electrode EL2 adjacent to the light emitting elements LD and that are spaced from each other in the first direction DR1.

As illustrated in FIG. 4E, the first sub-contact electrodes SCNT1 may be coupled only to the portion of the first electrode EL1 adjacent to the first ends (e.g., anode electrodes AE) of the light emitting elements LD, and may be arranged to be spaced from each other in the first direction DR1. The second sub-contact electrodes SCNT2 may be coupled only to the portion of the second electrode EL2 adjacent to second ends (e.g., cathode electrodes CE) of the light emitting elements LD, and may be arranged to be spaced from each other in the first direction DR1.

The first sub-contact electrodes SCNT1 are formed in a shape coupled only to a certain portion of the first electrode EL1 and the second sub-contact electrodes SCNT2 are formed in a shape coupled only to a certain portion of the second electrode EL2, thus enabling a driving voltage to be effectively transferred to the light emitting elements LD.

In one or more embodiments of the present disclosure, the display element layer DPL may include an encapsulation layer INC provided on one surface of the substrate on which the first to third electrodes EL1, EL2, and EL3, the first and second contact electrodes CNT1 and CNT2, and the light emitting elements LD are provided. The encapsulation layer INC may cover the first to third electrodes EL1, EL2, and EL3, the first and second contact electrodes CNT1 and CNT2, and the light emitting elements LD so that they are not exposed to outside, thus preventing occurrence of corrosion. The encapsulation layer INC may include a transparent insulating material to transmit light. The transparent insulating layer may include an organic material or an inorganic material. For example, the encapsulation layer INC may be formed of a transparent insulating material so as to reduce or minimize loss of light that is emitted from the light emitting elements LD and that is reflected by the second and third electrodes EL2 and EL3 in the image display direction (i.e. the third direction DR3) of the display device.

In one or more embodiments of the present disclosure, an overcoat layer OC may be provided on the encapsulation layer INC. The overcoat layer OC may be an encapsulation layer for preventing oxygen and moisture from permeating the light emitting elements LD.

Figure 6A:
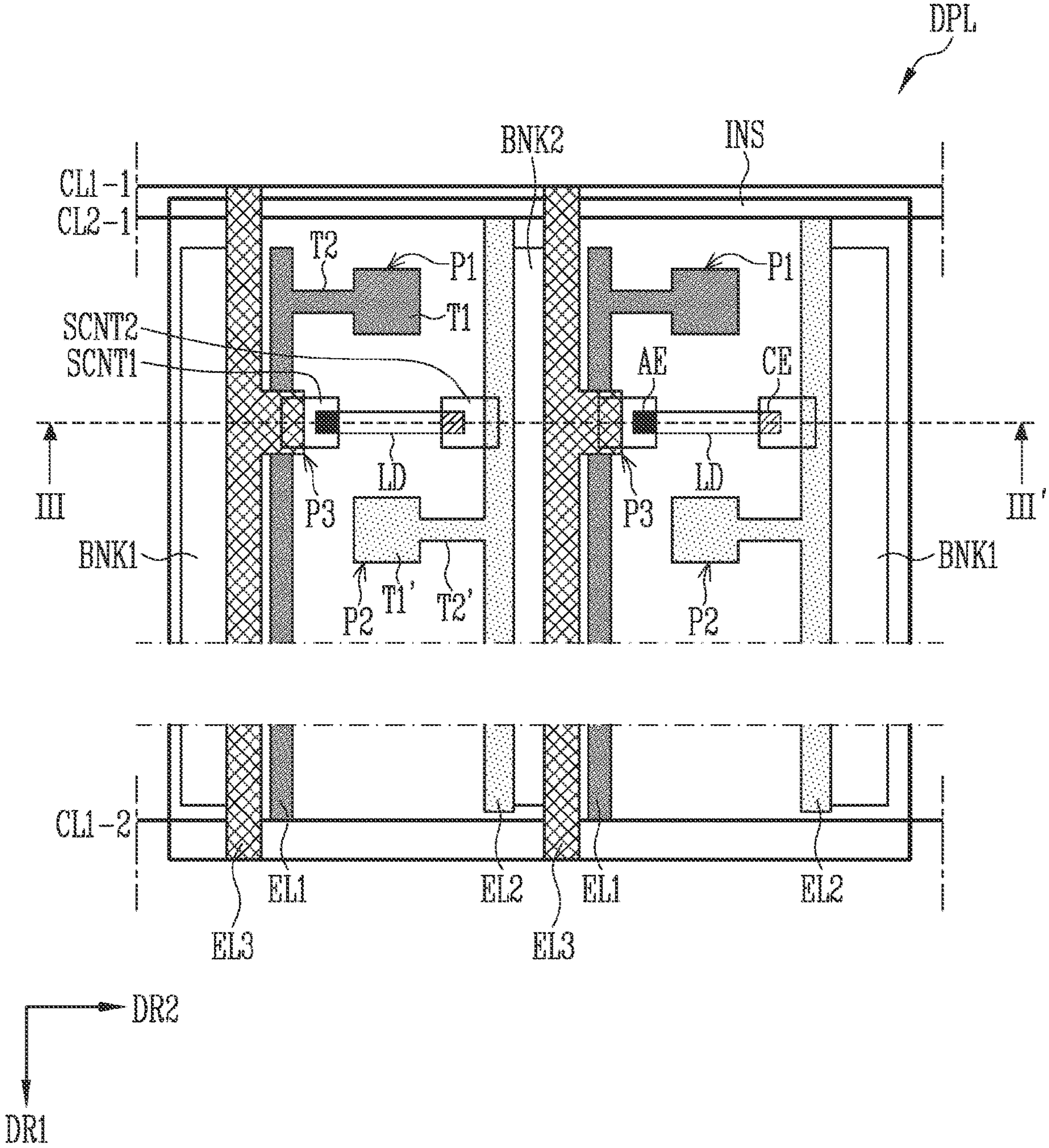
FIGS. 6A and 6B are plan views illustrating a display element layer according to one or more embodiments of the present disclosure.
Figure 6B:
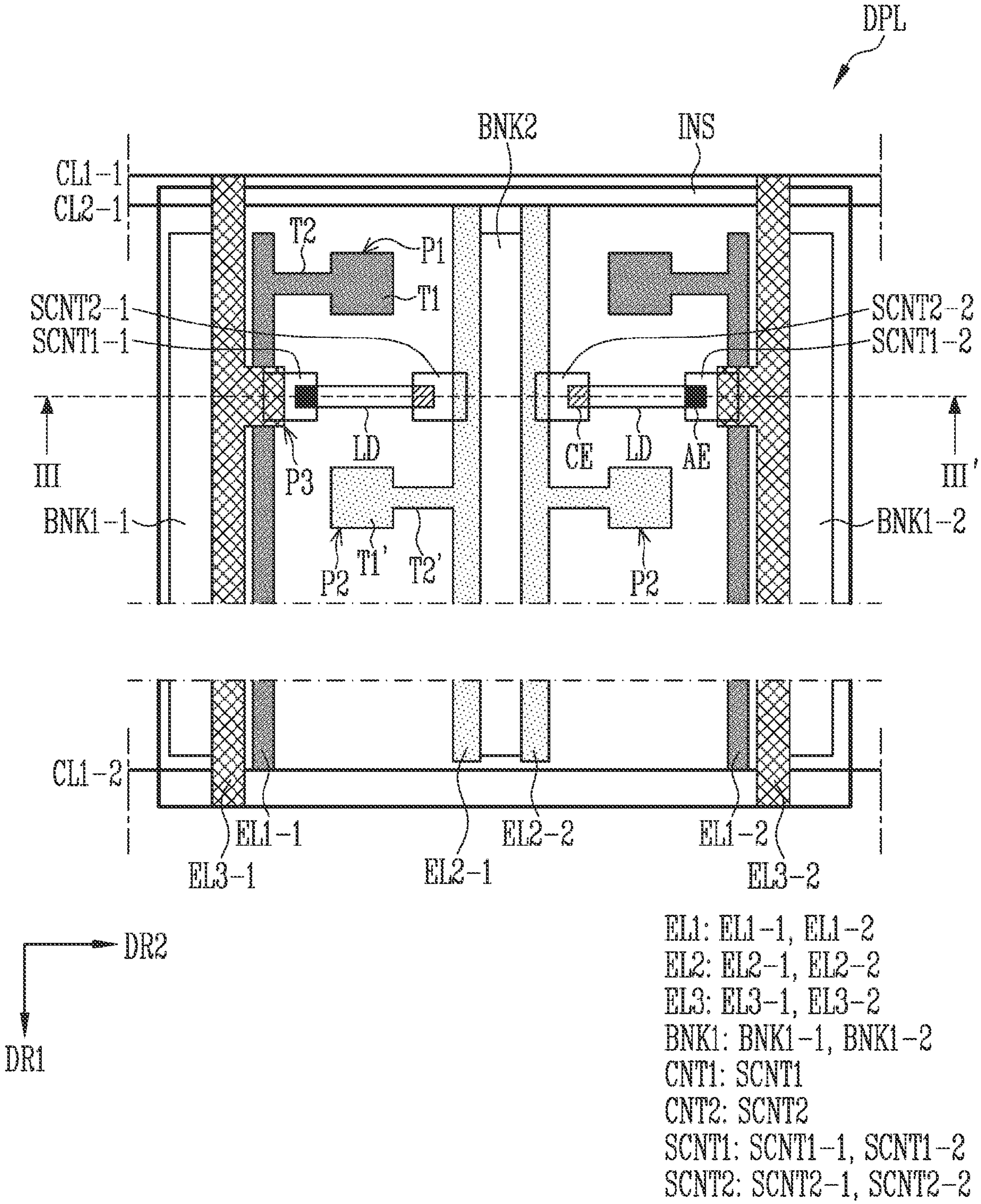

FIGS. 6A and 6B are plan views illustrating a display element layer according to one or more embodiments of the present disclosure. In particular, FIGS. 6A and 6B are plan views illustrating embodiments of a display element layer DPL in which first and second electrodes EL1 and EL2 and a third electrode EL3 are provided on different surfaces on the substrate SUB.

Figure 7A:
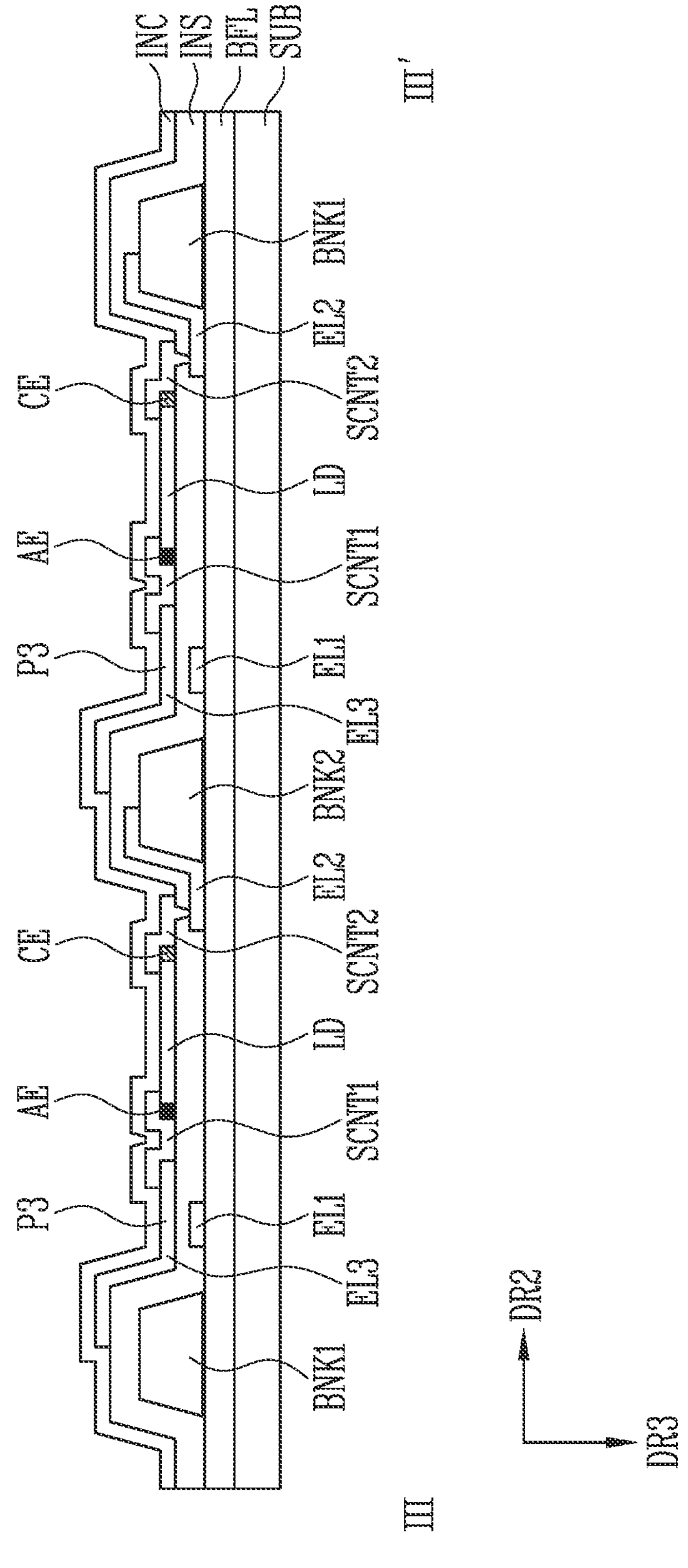
FIG. 7A is a sectional view taken along the line III-III' of FIG. 6A.
Figure 7B:
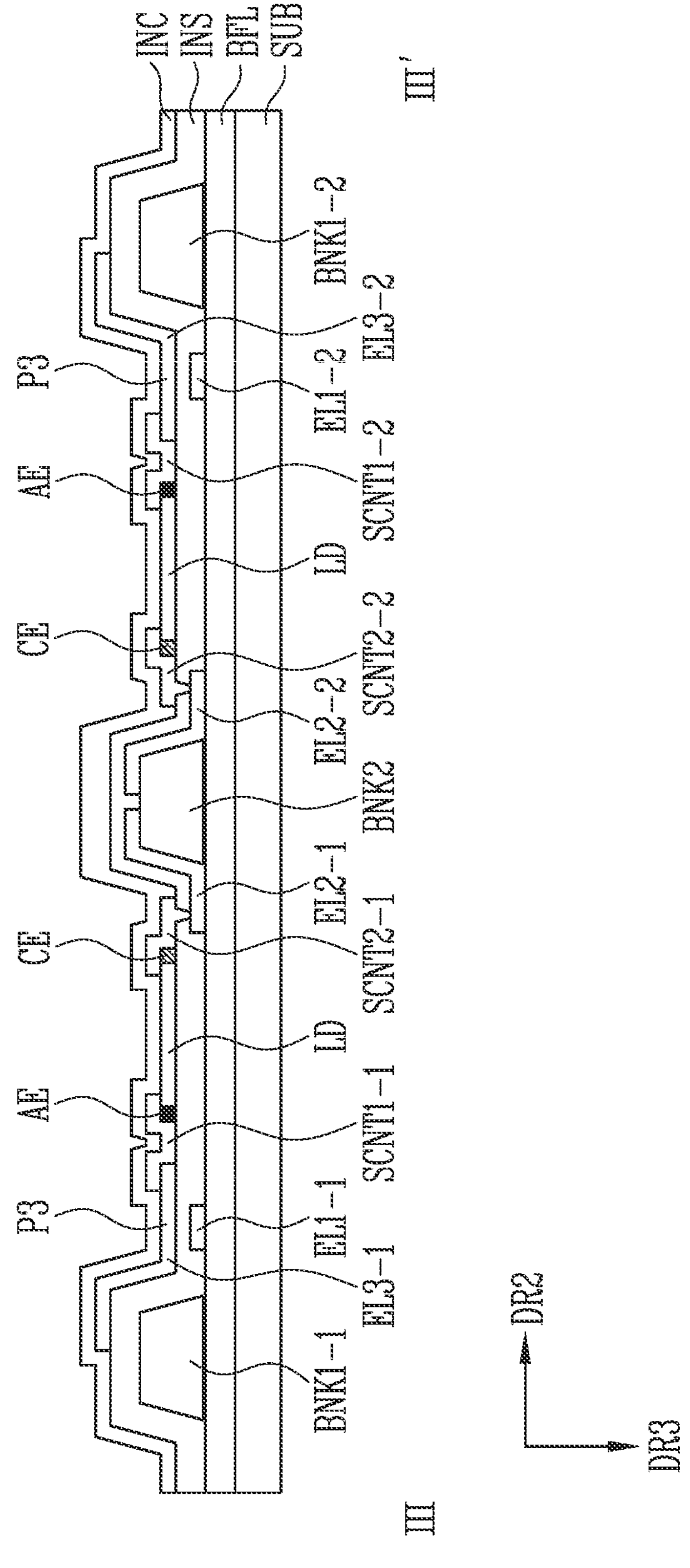
FIG. 7B is a sectional view taken along the line III-III' of FIG. 6B.

FIG. 7A is a sectional view taken along the line III-III' of FIG. 6A, and FIG. 7B is a sectional view taken along the line III-III' of FIG. 6B.

In the display device according to the present embodiment, a description will be made based on components that are not described in the display device according to the above-described embodiment to avoid repeated descriptions thereof. Components that are not especially explained in the present embodiment comply with those of the foregoing embodiments, wherein the same reference numerals designate the same components and similar reference numerals designate similar components. This is equally applied to embodiments, which will be described later.

As illustrated in FIGS. 6A to 78, the display element layer DPL according to one or more embodiments of the present disclosure may include first to third electrodes EL1, EL2, and EL3, an insulating layer INS, and light emitting elements LD, which are provided on a substrate SUB. In detail, the insulating layer INS may be provided on one surface of the substrate SUB on which the first and second electrodes EL1 and EL2 are provided, and the third electrode EL3 and the light emitting elements LD may be provided on the insulating layer INS.

The first electrode EL1 may include first protrusions P1 protruding toward the second electrode EL2, the second electrode EL2 may include second protrusions P2 protruding toward the first electrode EL1, wherein the first protrusions P1 and the second protrusions P2 may be alternately arranged along the first direction DR1.

The insulating layer INS may overlap an emission area in which the light emitting elements LD are arranged. Also, a portion of the insulting layer INS may overlap a non-emission area, for example, an area in which a 2-1-th connection line CL2-1 is arranged. The insulating layer INS may include an insulating material corresponding to any one of an inorganic insulating material and an organic insulating layer.

Referring to FIGS. 6A and 7A, first and second banks BNK1 and BNK2, the first and second electrodes EL1 and EL2, and 1-1-th to 2-1-th connection lines CL1-1, CL1-2, and CL2-1 may be provided on the same surface of the substrate SUB. The second electrode EL2 may be provided on portions of the first and second banks BNK1 and BNK2. That is, the second electrode EL2 may be provided to correspond to the shapes of the first and second banks BNK1 and BNK2. The first electrode EL1 may be coupled to a 1-2-th connection line CL1-2, and the second electrode EL2 may be coupled to a 2-1-th connection line CL2-1.

Referring to FIGS. 6A and 7A, an insulating layer INS may be provided on one surface of the substrate SUB on which the first and second banks BNK1 and BNK2, the first and second electrodes EL1 and EL2, and 1-1-th to 2-1-th connection lines CL1-1, CL1-2, and CL2-1 are provided. The third electrode EL3 and the light emitting elements LD may be provided on one surface of the insulating layer INS. The third electrode EL3 may be provided to overlap portions of the first and second banks BNK1 and BNK2. That is, the third electrode EL3 may be provided to correspond to the shapes of the first and second banks BNK1 and BNK2.

The insulating layer INS may not be provided on the 1-1-th connection line CL1-1, and the third electrode EL3 may be coupled to the 1-1-th connection line CL1-1. In one or more embodiments, when the insulating layer INS is provided on the 1-1-th connection line CL1-1, the third electrode EL3 may be coupled to the 1-1-th connection line CL1-1 through a contact hole which passes through the insulating layer INS.

In one or more embodiments of the present disclosure, the third electrode EL3 may include third protrusions P3 protruding toward the second electrode EL2. The third protrusions P3 may be arranged to be spaced from each other in the first direction DR1. The third protrusions P3 are provided on the third electrode EL3, so that first ends (e.g., anode electrodes AE) of the light emitting elements LD may be more easily aligned to face (or oppose) the first electrode EL1.

The light emitting elements LD may be provided between the first protrusions P1 and the second protrusions P2 with respect to the first direction DR1, and may be provided between the third protrusions P3 and the second electrode EL2 with respect to the second direction DR2.

In one or more embodiments of the present disclosure, the display element layer DPL may include a first contact electrode CNT1 for electrically connecting the light emitting elements LD to the third protrusions P3, and a second contract electrode CNT2 for electrically connecting the light emitting elements LD to the second electrode EL2.

Although in FIGS. 6A to 7B, an embodiment in which the first contact electrode CNT1 includes first sub-contact electrodes SCNT1 and the second contact electrode CNT2 includes second sub-contact electrodes SCNT2 is illustrated, the first contact electrode CNT1 and the second contact electrode CNT2 may be provided in a shape extending in the first direction DR1, as illustrated in FIG. 4A. In the present embodiment, a description will be made based on an embodiment in which the first contact electrode CNT1 includes first sub-contact electrodes SCNT1 and the second contact electrode CNT2 includes second sub-contact electrodes SCNT2.

As illustrated in FIGS. 6A and 7A, the first sub-contact electrode SCNT1 may electrically connect first ends (e.g., anode electrodes AE) of the light emitting element LD to the third protrusions P3 of the third electrode EL3. The first sub-contact electrode SCNT1 is connected to the third protrusion P3, and thus the length of the first sub-contact electrode SCNT1 in the second direction DR2 may be reduced. By means of this, the driving voltage transferred through the third electrode EL3 may be effectively provided to the first ends of the light emitting elements LD.

The second sub-contact electrode SCNT2 may electrically connect second ends (e.g., cathode electrodes CE) of the light emitting elements LD to the second electrode EL2. Here, the second sub-contact electrode SCNT2 may be connected to the second electrode EL2 through a contact hole that passes through the insulating layer INS.

In one or more embodiments of the present disclosure, the 1-1-th connection line CL1-1 may be coupled to a first driving power source VDD, and the first sub-contact electrode SCNT1 may supply a driving voltage of the first driving power source VDD, transferred through the third electrode EL3, to the first ends of the light emitting elements LD. The 2-1-th connection line CL2-1 may be coupled to a second driving power source VSS, and the second sub-contact electrode SCNT2 may supply a driving voltage of the second driving power source VSS, transferred through the second electrode EL2, to the second ends of the light emitting elements LD.

The second electrode EL2 and the third electrode EL3 may be reflective electrodes, and may be configured to reflect light emitted from both ends of the light emitting elements LD and guide the light in a direction upwards (e.g., a front direction) from the third direction DR3.

Referring to FIGS. 6B and 7B, a 2-1-th electrode EL2-1 and a 2-2-th electrode EL2-2 may be provided on a portion of a second bank BNK2. The 2-1-th and 2-2-th electrodes EL2-1 and EL2-2 may be coupled to the 2-1-th connection line CL2-1. In the second direction DR2, a 3-1-th electrode EL3-1 and the 2-1-th electrode EL2-1 may face each other with the 1-1-th electrode EL1-1 interposed therebetween, and a 3-2-th electrode EL3-2 and a 2-2-th electrode EL2-2 may face each other with the 1-2-th electrode EL1-2 interposed therebetween.

As illustrated in FIGS. 6B and 7B, the first ends (e.g., anode electrodes AE) of the light emitting elements LD provided between the 1-1-th electrode EL1-1 and the 2-1-th electrode EL2-1 may be electrically connected to the third protrusion P3 of the 3-1-th electrode EL3-1 through the 1-1-th sub-contact electrode SCNT1-1. Further, the second ends (e.g., cathode electrodes CE) of the light emitting elements LD may be electrically connected to the 2-1-th electrode EL2-1 through the 2-1-th sub-contact electrode SCNT2-1. Here, the 2-1-th sub-contact electrode SCNT2-1 may be connected to the 2-1-th electrode EL2-1 through a contact hole that passes through the insulating layer INS.

The first ends (e.g., anode electrodes AE) of the light emitting elements LD provided between the 1-2-th electrode EL1-2 and the 2-2-th electrode EL2-2 may be electrically connected to the third protrusion P3 of the 3-2-th electrode EL3-2 through the 1-2-th sub-contact electrode SCNT1-2. Further, the second ends (e.g., cathode electrodes CE) of the light emitting elements LD may be electrically connected to the 2-2-th electrode EL2-2 through the 2-2-th sub-contact electrode SCNT2-2. Here, the 2-2-th sub-contact electrode SCNT2-2 may be connected to the 2-2-th electrode EL2-2 through a contact hole that passes through the insulating layer INS.

Figure 8A:
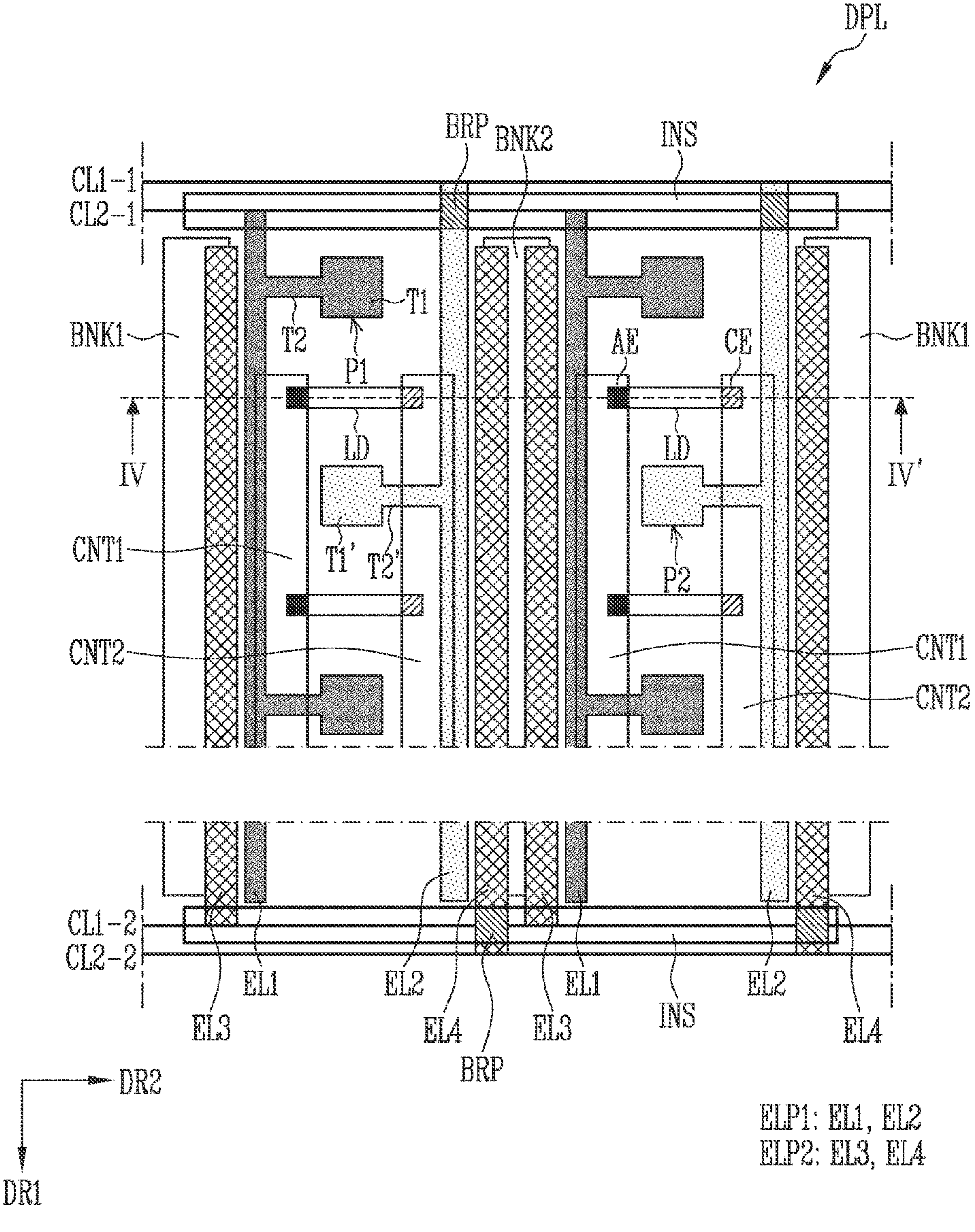
FIGS. 8A to 8C are plan views illustrating a display element layer according to one or more embodiments of the present disclosure.
Figure 8B:
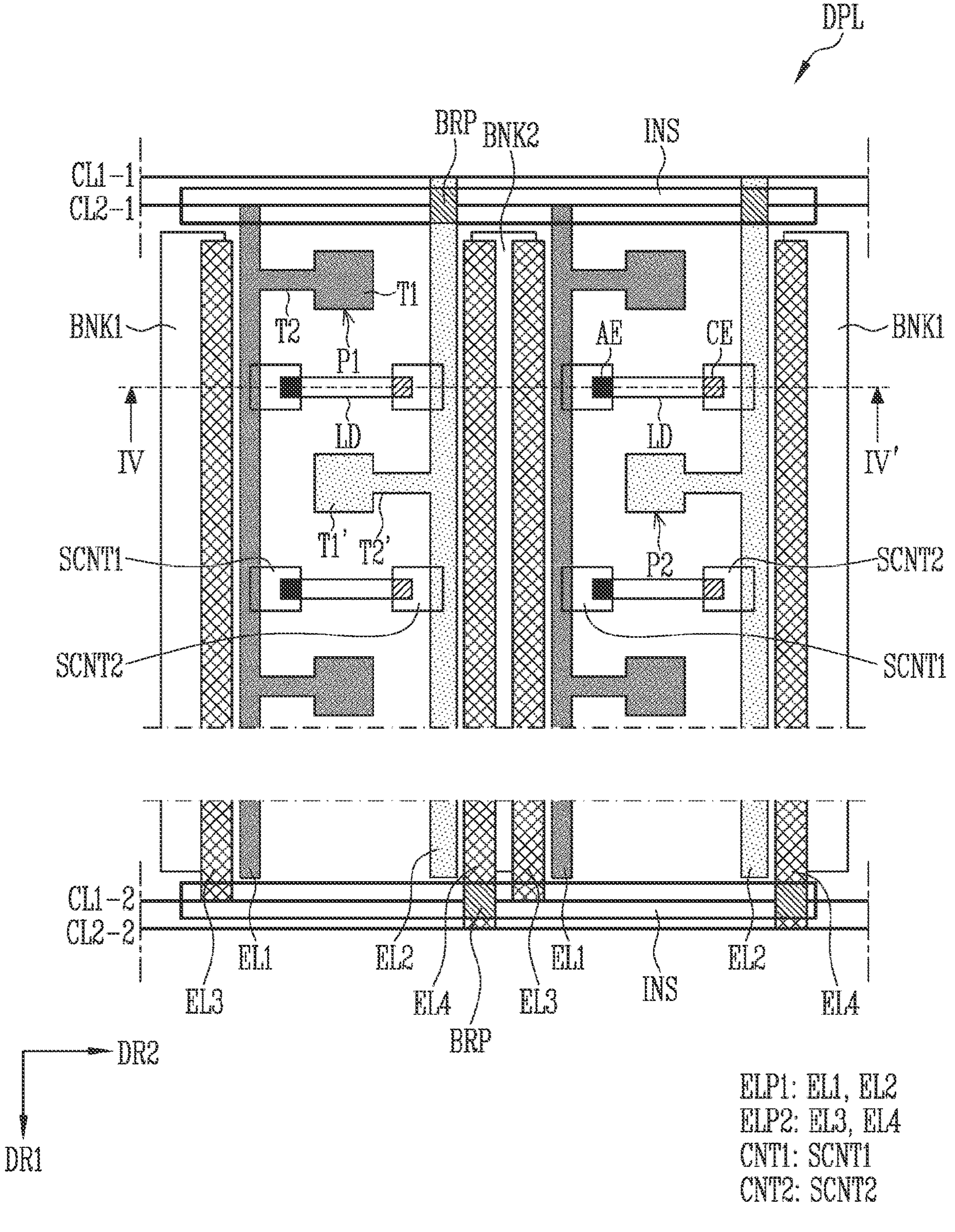
Figure 8C:
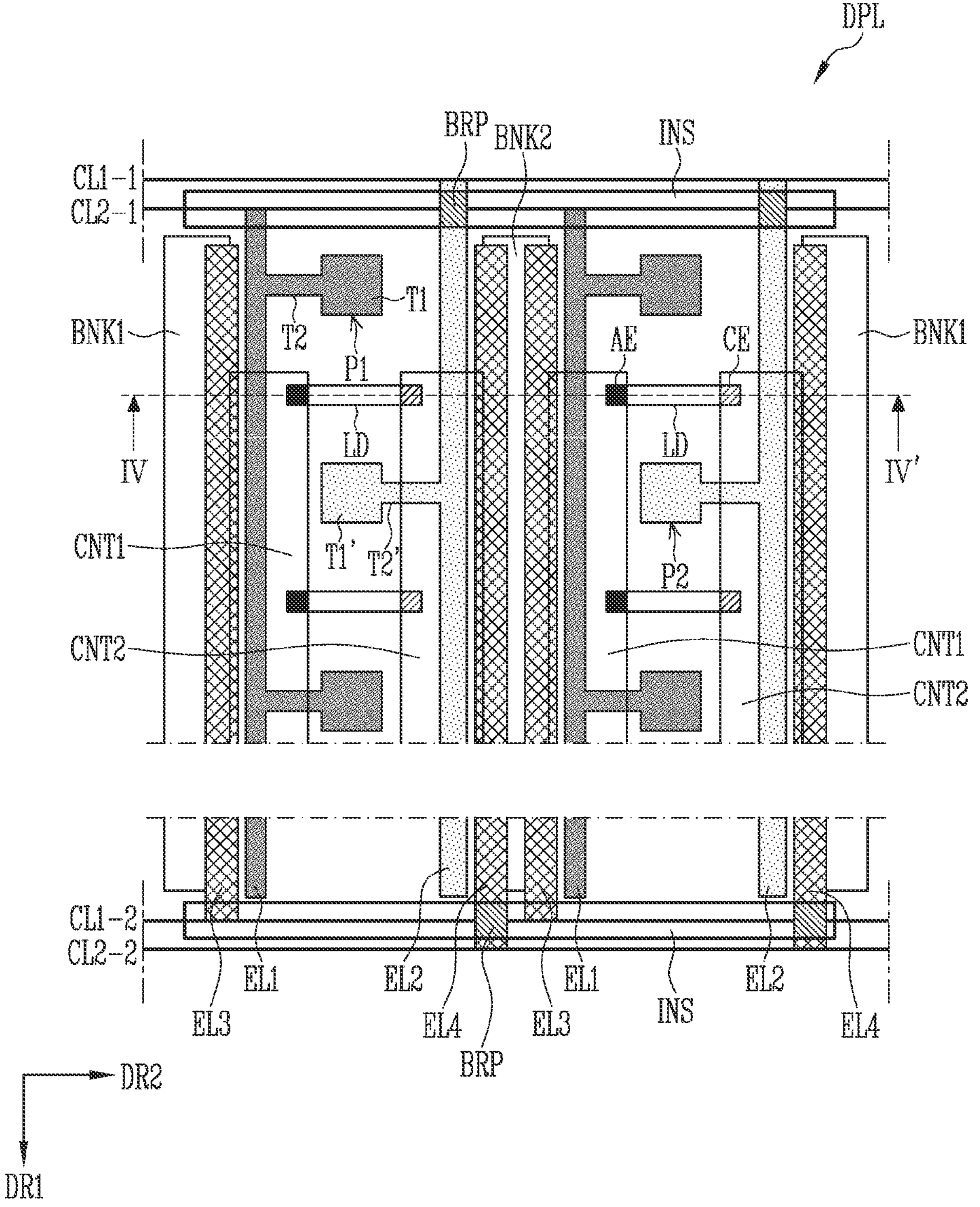

FIGS. 8A to 8C are plan views illustrating a display element layer according to a one or more embodiments of the present disclosure. In particular, FIGS. 8A to 8C are plan views illustrating one or more embodiments of a display element layer DPL on which first to four electrodes EL1 to EL4 and light emitting elements LD are provided on the same surface of a substrate SUB.

Figure 9A:
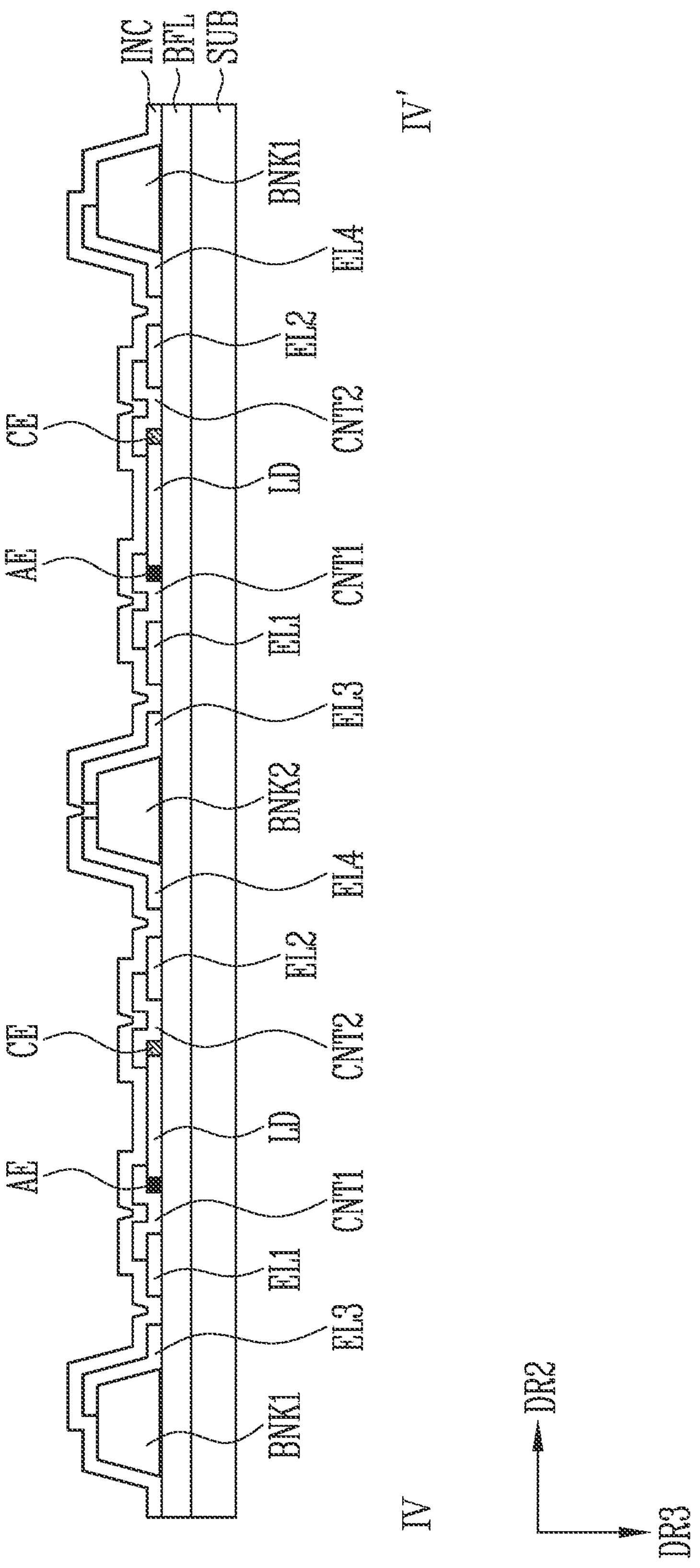
FIG. 9A is a sectional view taken along the line IV-IV' of FIG. 8A.
Figure 9B:
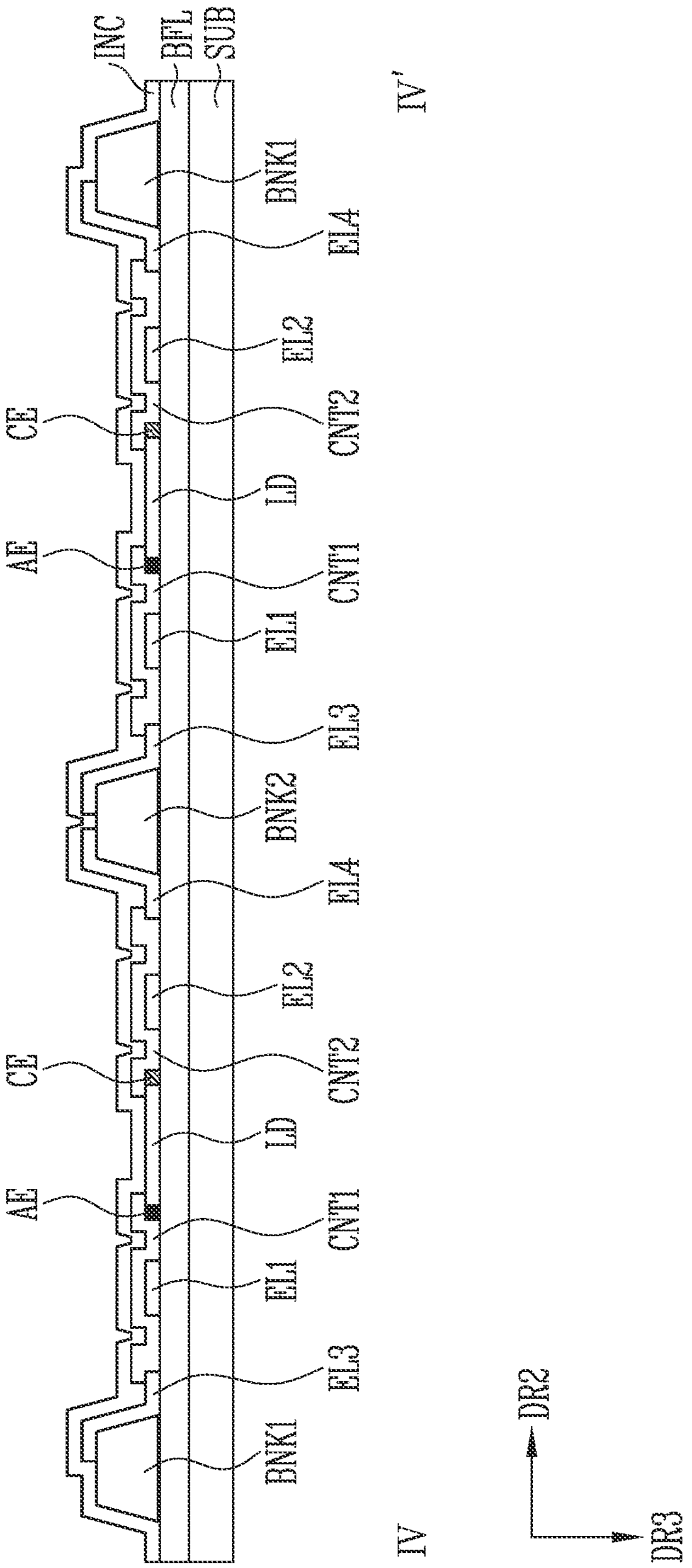
FIG. 9B is a sectional view taken along the line V-V' of FIG. 8C.

FIG. 9A is a sectional view taken along the line IV-IV' of FIG. 8A, and FIG. 9B is a sectional view taken along the line IV-IV' of FIG. 8C.

As illustrated in FIGS. 8A to 98, a display element layer DPL according to one or more embodiments of the present disclosure may include first to four electrodes EL1 to EL4 and light emitting elements LD that are provided on the substrate SUB. For example, the first to fourth electrodes EL1 to EL4 and the light emitting elements LD may be provided on one surface of the substrate SUB or provided on one surface of a buffer layer BFL provided on the substrate SUB.

In one or more embodiments of the present disclosure, a display element layer DPL may include the fourth electrode EL4 that extends in a first direction DR1 and faces (or opposes) the first electrode EL1 with the second electrode EL2 interposed therebetween. The display element layer DPL may include a first electrode pair ELP1 including the first electrode EL1 and the second electrode EL2, and a second electrode pair ELP2 including the third electrode EL3 and the fourth electrode EL4 that face (or oppose) each other with the first electrode pair ELP1 interposed therebetween.

The first electrode EL1 and the second electrode EL2 may be provided between first and second banks BNK1 and BNK2. The first electrode EL1 may include first protrusions P1 protruding toward the second electrode EL2, the second electrode EL2 may include second protrusions P2 protruding toward the first electrode EL1, wherein the first protrusions P1 and the second protrusions P2 may be alternately arranged along a first direction DR1.

As illustrated in FIGS. 8A to 8C, each first protrusion P1 may include first and second ends T1 and T2, and each second protrusion P2 may include first and second ends T1' and T2'. The widths of the first ends T1 and T1' of the first protrusion P1 and the second protrusion P2 in the first direction DR1 may be greater than those of the second ends T2 and T2'.

The third electrode EL3 and the fourth electrode EL4 may be provided on portions of the first and second banks BNK1 and BNK2. For example, the third electrode EL3 may be provided on portions of the first and second banks BNK1 and BNK2 adjacent to the first electrode EL1, and the fourth electrode EL4 may be provided on portions of the first and second banks BNK1 and BNK2 adjacent to the second electrode EL2.

As illustrated in FIGS. 8A to 9B, the first to fourth electrodes EL1 to EL4, 1-1-th to 2-2-th connection lines CL1-1 to CL2-2 and light emitting elements LD may be provided on one surface of the substrate SUB. The first electrode EL1 may be coupled to the 2-1-th connection line CL2-1, and the second electrode EL2 may be coupled to the 1-1-th connection line CL1-1. The third electrode EL3 may be coupled to the 1-2-th connection line CL1-2, and the fourth electrode EL4 may be coupled to the 2-2-th connection line CL2-2.

The display element layer DPL may include an insulating layer INS provided in a non-emission area. For example, the insulating layer INS may be provided on the 2-1-th connection line CL2-1 and the 1-2-th connection line CL1-2, and a bridge pattern BRP may be provided on the insulating layer INS. Through the bridge pattern BRP, the second electrode EL2 may be coupled to the 1-1-th connection line CL1-1, and the fourth electrode EL4 may be coupled to the 2-2-th connection line CL2-2.

The light emitting elements LD may be provided between the first protrusion P1 and the second protrusion P2 in the first direction DR1, and may be provided between the first electrode EL1 and the second electrode EL2 in the second direction DR2. The first ends (e.g., anode electrodes AE) of the light emitting elements LD may face (or oppose) the first electrode EL1, and second ends thereof (e.g., cathode electrodes CE) may face (or oppose) the second electrode EL2. That is, the light emitting elements LD may be directionally aligned on the substrate SUB.

In one or more embodiments of the present disclosure, the display element layer DPL may include a first contact electrode CNT1 for electrically connecting at least one of the first electrode EL1 and the third electrode EL3 to the light emitting elements LD. In detail, the first contact electrode CNT1 may electrically connect at least the first electrode EL1 of the first electrode EL1 and the third electrode EL3 to the light emitting elements LD. Further, the display element layer DPL may include a second contact electrode CNT2 for electrically connecting at least one of the second electrode EL2 and the fourth electrode EL4 to the light emitting elements LD. In detail, the second contact electrode CNT2 may electrically connect at least the second electrode EL2 of the second electrode EL2 and the fourth electrode EL4 to the light emitting elements LD.

As illustrated in FIGS. 8A and 9A, the first contact electrode CNT1 may connect the first electrode EL1 to the first ends (e.g., anode electrodes AE) of the light emitting elements LD, and the second contact electrode CNT2 may connect the second electrode EL2 to the second ends (e.g., cathode electrodes CE) of the light emitting elements LD.

The 2-1-th connection line CL2-1 connected to the first electrode EL1 may be coupled to a first driving power source VDD, and the 1-1-th connection line CL1-1 connected to the second electrode EL2 may be coupled to a second driving power source VSS. The first contact electrode CNT1 may provide a driving voltage of the first driving power source VDD to the first ends of the light emitting elements LD, and the second contact electrode CNT2 may provide a driving voltage of the second driving power source VSS to the second ends of the light emitting elements LD.

The third electrode EL3 and the fourth electrode EL4 provided on portions of the first and second banks BNK1 and BNK2 may be reflective electrodes. The third and fourth electrodes EL3 and EL4, which are reflective electrodes, may guide light emitted from the light emitting elements LD in a direction from the substrate SUB to the display element layer DPL (e.g., a front direction or a third direction DR3).

The third electrode EL3 and the fourth electrode EL4, which are reflective electrodes, may include a conductive material having high light reflectivity. For example, the third electrode EL3 and the fourth electrode EL4 may each be formed as a single layer structure formed of Ag, or as a triple-layer structure including ITO/Ag/ITO, but the material used to form the third and fourth electrodes EL3 and EL4 is not limited thereto.

The first and second electrodes EL1 and EL2 may each include a transparent conductive material. The transparent conductive material may include, for example, ITO, IZO, ITZO, etc., but the material used to form the first and second electrodes EL1 and EL2 is not limited thereto.

As illustrated in FIG. 8B, the first contact electrode CNT1 may include first sub-contact electrodes SCNT1 that are coupled to a portion of the first electrode EL1 adjacent to the light emitting elements LD and that are spaced from each other in the first direction DR1. The second contact electrode CNT2 may include second sub-contact electrodes SCNT2 that are coupled to a portion of the second electrode EL2 adjacent to the light emitting elements LD and that are spaced from each other in the first direction DR1.

In one or more embodiments, as illustrated in FIG. 8B, the first sub-contact electrodes SCNT1 may couple the first and third electrodes EL1 and EL3 to the first ends of the light emitting elements LD, and the second sub-contact electrodes SCNT2 may couple the second and fourth electrodes EL2 and EL4 to the second ends of the light emitting elements LD.

As illustrated in FIGS. 8C and 9B, the first contact electrode CNT1 may electrically connect the first and third electrodes EL1 and EL3 to the first ends (e.g., anode electrodes AE) of the light emitting elements LD, and the second contact electrode CNT2 may electrically connect the second and fourth electrodes EL2 and EL4 to the second ends (e.g., cathode electrodes CE) of the light emitting elements LD.

In one or more embodiments of the present disclosure, one of the 2-1-th connection line CL2-1 and the 1-2-th connection line CL1-2 may be coupled to the first driving power source VDD. One of the 1-1-th connection line CL1-1 and the 2-2-th connection line CL2-2 may be coupled to the second driving power source VSS.

For example, the 2-1-th connection line CL2-1 may be coupled to the first driving power source VDD, and the 1-1-th connection line CL1-1 may be coupled to the second driving power source VSS. The first contact electrode CNT1 may provide a driving voltage of the first driving power source VDD, transferred through the first electrode EL1, to the first ends of the light emitting elements LD, and the second contact electrode CNT2 may provide the driving voltage of the second driving power source VSS, transferred through the second electrode EL2, to the second ends of the light emitting elements LD.

Further, the 2-1-th connection line CL2-1 may be coupled to the first driving power source VDD, and the 2-2-th connection line CL2-2 may be coupled to the second driving power source VSS. The first contact electrode CNT1 may provide a driving voltage of the first driving power source VDD, transferred through the first electrode EL1, to the first ends of the light emitting elements LD, and the second contact electrode CNT2 may provide the driving voltage of the second driving power source VSS, transferred through the fourth electrode EL4, to the second ends of the light emitting elements LD.

Further, the 1-2-th connection line CL1-2 may be coupled to the first driving power source VDD, and the 1-1-th connection line CL1-1 may be coupled to the second driving power source VSS. The first contact electrode CNT1 may provide a driving voltage of the first driving power source VDD, transferred through the third electrode EL3, to the first ends of the light emitting elements LD, and the second contact electrode CNT2 may provide the driving voltage of the second driving power source VSS, transferred through the second electrode EL2, to the second ends of the light emitting elements LD.

Further, the 1-2-th connection line CL1-2 may be coupled to the first driving power source VDD, and the 2-2-th connection line CL2-2 may be coupled to the second driving power source VSS. The first contact electrode CNT1 may supply the driving voltage of the first driving power source VDD, transferred through the third electrode EL3, to the first ends of the light emitting elements LD, and the second contact electrode CNT2 may provide the driving voltage of the second driving power source VSS, transferred through the fourth electrode EL4, to the second ends of the light emitting elements LD.

Figure 10A:
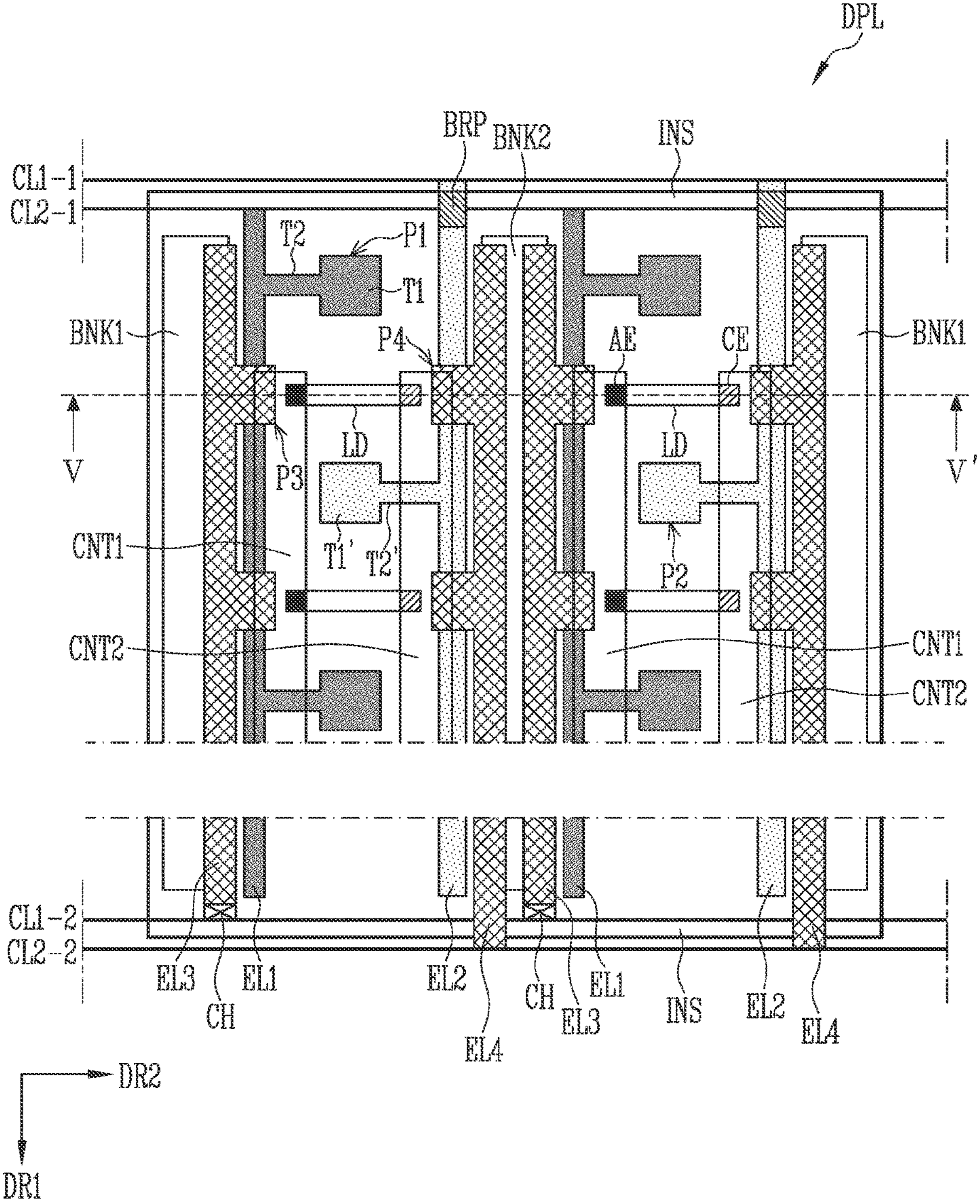
FIGS. 10A and 10B are plan views illustrating a display element layer according to one or more embodiments of the present disclosure.
Figure 10B:
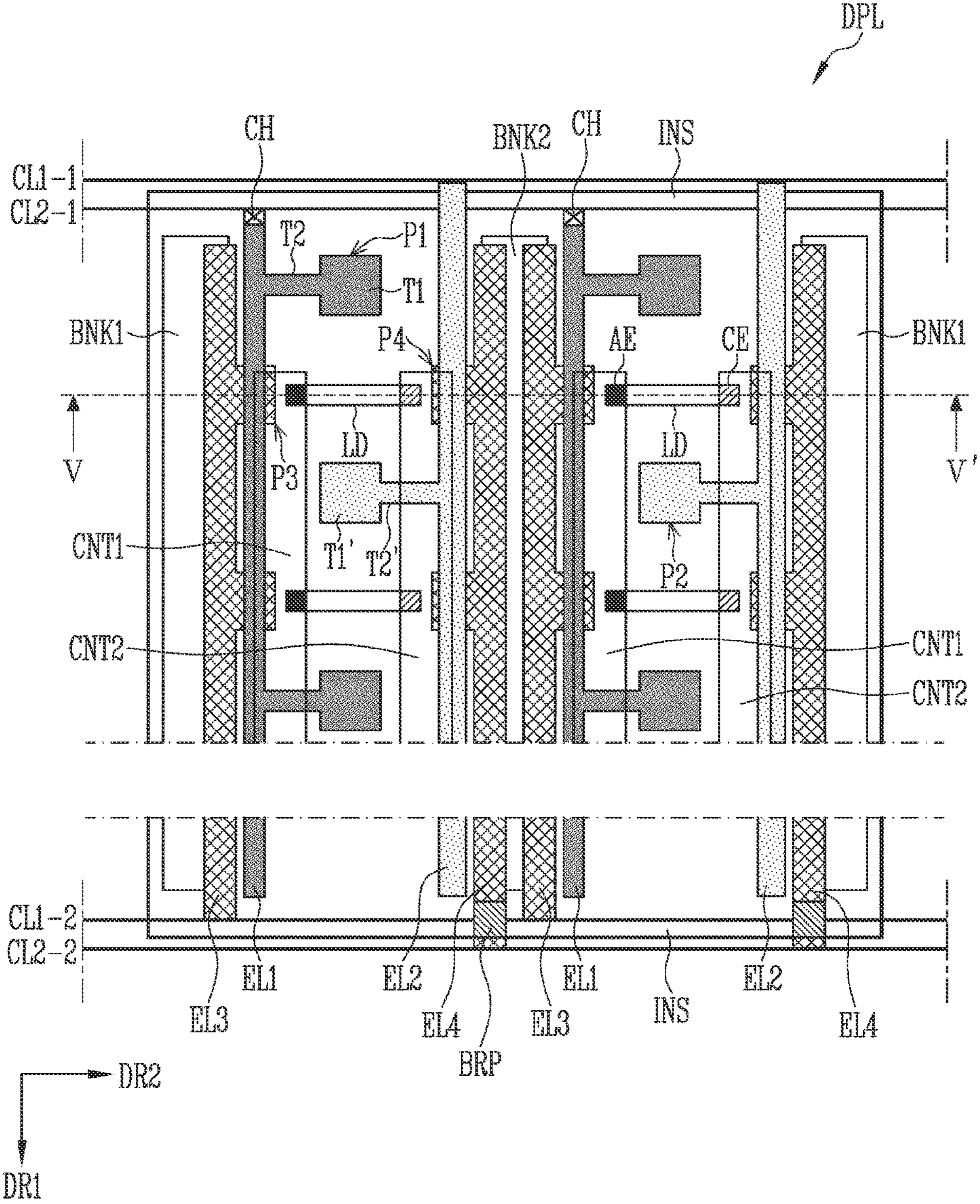

FIGS. 10A and 10B are plan views illustrating a display element layer according to one or more embodiments of the present disclosure. In particular, FIGS. 10A and 10B are plan views illustrating embodiments of a display element layer DPL in which first and second electrodes EL1 and EL2 and third and fourth electrodes EL3 and EL4 are provided on different surfaces on a substrate SUB.

Figure 11A:
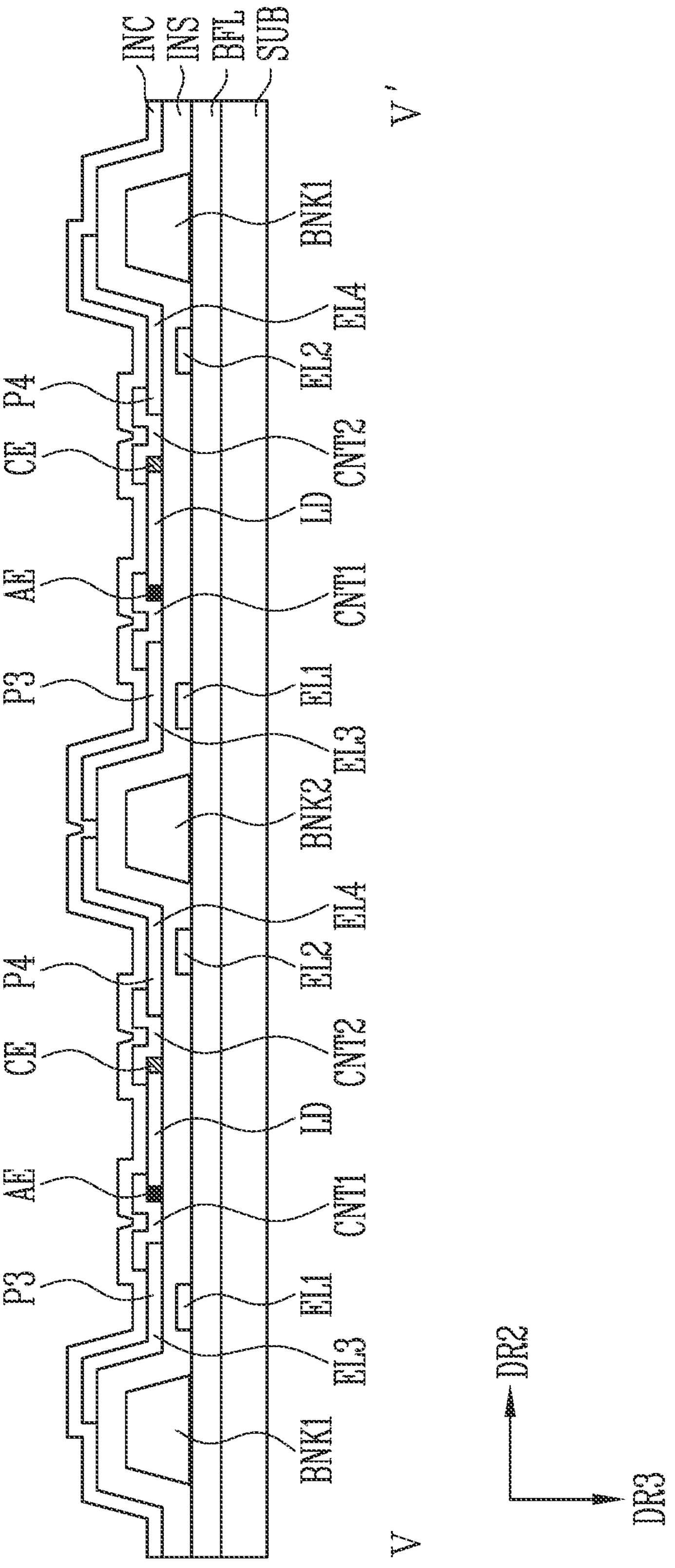
FIG. 11A is a sectional view taken along the line V-V' of FIG. 10A.
Figure 11B:
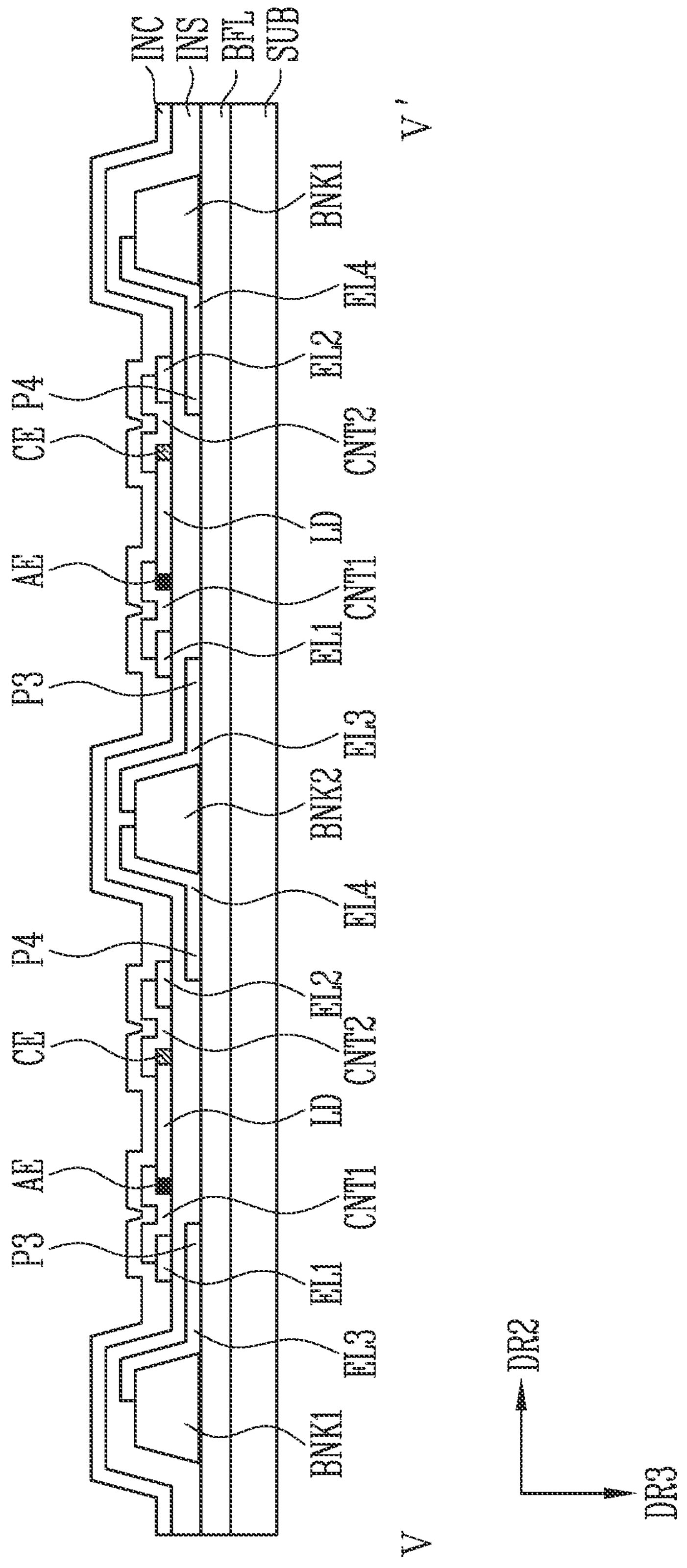
FIG. 11B is a sectional view taken along the line V-V' of FIG. 10B.

FIG. 11A is a sectional view taken along the line V-V' of FIG. 10A, and FIG. 11B is a sectional view taken along the line V-V' of FIG. 10B.

The display element layer DPL according to one or more embodiments of the present disclosure may include first to four electrodes EL1 to EL4, an insulating layer INS, and light emitting elements LD that are provided on the substrate SUB. Here, in a third direction DR3, the first and second electrodes EL1 and EL2 may be provided on a surface (or a layer) different from that of the third and fourth electrodes EL3 and EL4 with the insulating layer INS interposed therebetween.

As illustrated in FIGS. 10A and 11A, the insulating layer INS may be provided on one surface of the substrate SUB on which the first and second electrodes EL1 and EL2 are provided, and the third and fourth electrodes EL3 and EL4 and the light emitting elements LD may be provided on the insulating layer INS. As illustrated in FIGS. 10B and 11B, the insulating layer INS may be provided on one surface of the substrate SUB on which the third and fourth electrodes EL3 and EL4 are provided, and the first and second electrodes EL1 and EL2 and the light emitting elements LD may be provided on the insulating layer INS.

The first electrode EL1 may include first protrusions P1 protruding toward the second electrode EL2, the second electrode EL2 may include second protrusions P2 protruding toward the first electrode EL1, where the first protrusions P1 and the second protrusions P2 may be alternately arranged along a first direction DR1.

The insulating layer INS may overlap an emission area in which the light emitting elements LD are arranged. Also, a portion of the insulting layer INS may overlap a non-emission area, for example, an area in which a 2-1-th connection line CL2-1 and a 1-2-th connection line CL1-2 are arranged. The insulating layer INS may include an insulating material corresponding to any one of an inorganic insulating material and an organic insulating layer.

Referring to FIGS. 10A and 11A, an insulating layer INS may be provided on one surface of the substrate SUB on which first and second banks BNK1 and BNK2, the first and second electrodes EL1 and EL2, and 1-1-th to 2-2-th connection lines CL1-1 to CL2-2 are provided. The third and fourth electrodes EL3 and EL4 and the light emitting elements LD may be provided on one surface of the insulating layer INS. The third and fourth electrodes EL3 and EL4 may be provided to overlap portions of the first and second banks BNK1 and BNK2. That is, the third and fourth electrodes EL3 and EL4 may be provided to correspond to the shapes of the first and second banks BNK1 and BNK2.

The first electrode EL1 may be coupled to the 2-1-th connection line CL2-1 on one surface of the substrate SUB. A bridge pattern BRP may be provided in the area of the insulating layer INS overlapping the 2-1-th connection line CL2-1. The bridge pattern BRP may connect the second electrode EL2 to the 1-1-th connection line CL1-1 through a contact hole that passes through the insulating layer INS. The third electrode EL3 may be coupled to the 1-2-th connection line CL1-2 through a contact hole CH, which passes through the insulating layer INS. The insulating layer INS may not be provided on the 2-2-th connection line CL2-2, and the fourth electrode EL4 may be coupled to the 2-2-th connection line CL2-2.

In one or more embodiments of the present disclosure, of a first electrode pair ELP1 including the first and second electrodes EL1 and EL2 and a second electrode pair ELP2 including the third and fourth electrodes EL3 and EL4, the electrode pair provided on the insulating layer INS may be electrically connected to the light emitting elements LD.

As illustrated in FIGS. 10A and 11A, the display element layer DPL may include a first contact electrode CNT1 for coupling the third electrode EL3 provided on the insulating layer INS to the first ends (e.g., anode electrodes AE) of the light emitting elements LD. Also, the display element layer DPL may include a second contact electrode CNT2 for coupling the fourth electrode EL4 provided on the insulating layer INS to the second ends (e.g., cathode electrodes CE) of the light emitting elements LD.

The 1-2-th connection line CL1-2 may be coupled to the first driving power source VDD, and the 2-2-th connection line CL2-2 may be coupled to the second driving power source VSS. The first contact electrode CNT1 may supply the driving voltage of the first driving power source VDD, transferred through the third electrode EL3, to the first ends of the light emitting elements LD, and the second contact electrode CNT2 may provide the driving voltage of the second driving power source VSS, transferred through the fourth electrode EL4, to the second ends of the light emitting elements LD.

In one or more embodiments of the present disclosure, the third electrode EL3 may include third protrusions P3 protruding toward the fourth electrode EL4. The third protrusions P3 may be arranged to be spaced from each other in the first direction DR1. The fourth electrode EL4 may include fourth protrusions P4 protruding toward the third electrode EL3, and the fourth protrusions P4 may be arranged to be spaced from each other in the first direction DR1. The third protrusions P3 are provided on the third electrode EL3, and the fourth protrusions P4 are provided on the fourth electrode EL4, so that the first ends (e.g., anode electrodes AE) of the light emitting elements LD may be more easily directionally aligned to face the first electrode EL1.

The light emitting elements LD may be provided between the first protrusions P1 and the second protrusions P2 with respect to the first direction DR1, and may be provided between the third protrusions P3 and the fourth protrusion P4 with respect to the second direction DR2. That is, the third protrusions P3 and the fourth protrusions P4 may face (or oppose) each other with the light emitting elements LD interposed therebetween.

In one or more embodiments of the present disclosure, the first contact electrode CNT1 may connect the third protrusions P3 of the third electrode EL3 to the first ends of the light emitting elements LD, and the second contact electrode CNT2 may connect the fourth protrusions P4 of the fourth electrode EL4 to the second ends of the light emitting elements LD. The first contact electrode CNT1 is coupled to the third protrusions P3 and the second contact electrode CNT2 is coupled to the fourth protrusions P4, whereby the sizes of the first and second contact electrodes CNT1 and CNT2 may be reduced. By means of this, the driving voltage transferred through the third and fourth electrodes EL3 and EL4 may be effectively provided to the light emitting elements LD.

The third electrode EL3 and the fourth electrode EL4 overlapping portions of the first and second banks BNK1 and BNK2 may be reflective electrodes. The third and fourth electrodes EL3 and EL4, which are reflective electrodes, may guide light emitted from the light emitting elements LD in a direction from the substrate SUB to the display element layer DPL (e.g., a front direction or the third direction DR3).

Referring to FIGS. 10B and 11B, an insulating layer INS may be provided on one surface of the substrate SUB on which the first and second banks BNK1 and BNK2, the third and fourth electrodes EL3 and EL4, and the 1-1-th to 2-2-th connection lines CL1-1 to CL2-2 are provided. The third and fourth electrodes EL3 and EL4 may be provided to overlap portions of the first and second banks BNK1 and BNK2, and may be provided to correspond to the shapes of the first and second banks BNK1 and BNK2. The first and second electrodes EL1 and EL2 and the light emitting elements LD may be provided on one surface of the insulating layer INS.

The third electrode EL3 may be coupled to the 1-2-th connection line CL1-2 on one surface of the substrate SUB. A bridge pattern BRP may be provided in the area of the insulating layer INS overlapping the 1-2-th connection line CL1-2. The bridge pattern BRP may connect the fourth electrode EL4 to the 2-2-th connection line CL2-2 through a contact hole that passes through the insulating layer INS. The first electrode EL1 may be coupled to the 2-1-th connection line CL2-1 through a contact hole CH, which passes through the insulating layer INS. The insulating layer INS may not be provided on the 1-1-th connection line CL1-1, and the second electrode EL2 may be coupled to the 1-1-th connection line CL1-1.

The display element layer DPL may include a first contact electrode CNT1 for coupling the first electrode EL1 provided on the insulating layer INS to the first ends (e.g., anode electrodes AE) of the light emitting elements LD. Also, the display element layer DPL may include a second contact electrode CNT2 for coupling the second electrode EL2 provided on the insulating layer INS to the second ends (e.g., cathode electrodes CE) of the light emitting elements LD.

The 2-1-th connection line CL2-1 may be coupled to the first driving power source VDD, and the 1-1-th connection line CL1-1 may be coupled to the second driving power source VSS. The first contact electrode CNT1 may provide a driving voltage of the first driving power source VDD, transferred through the first electrode EL1, to the first ends of the light emitting elements LD, and the second contact electrode CNT2 may provide the driving voltage of the second driving power source VSS, transferred through the second electrode EL2, to the second ends of the light emitting elements LD.

Figure 12:
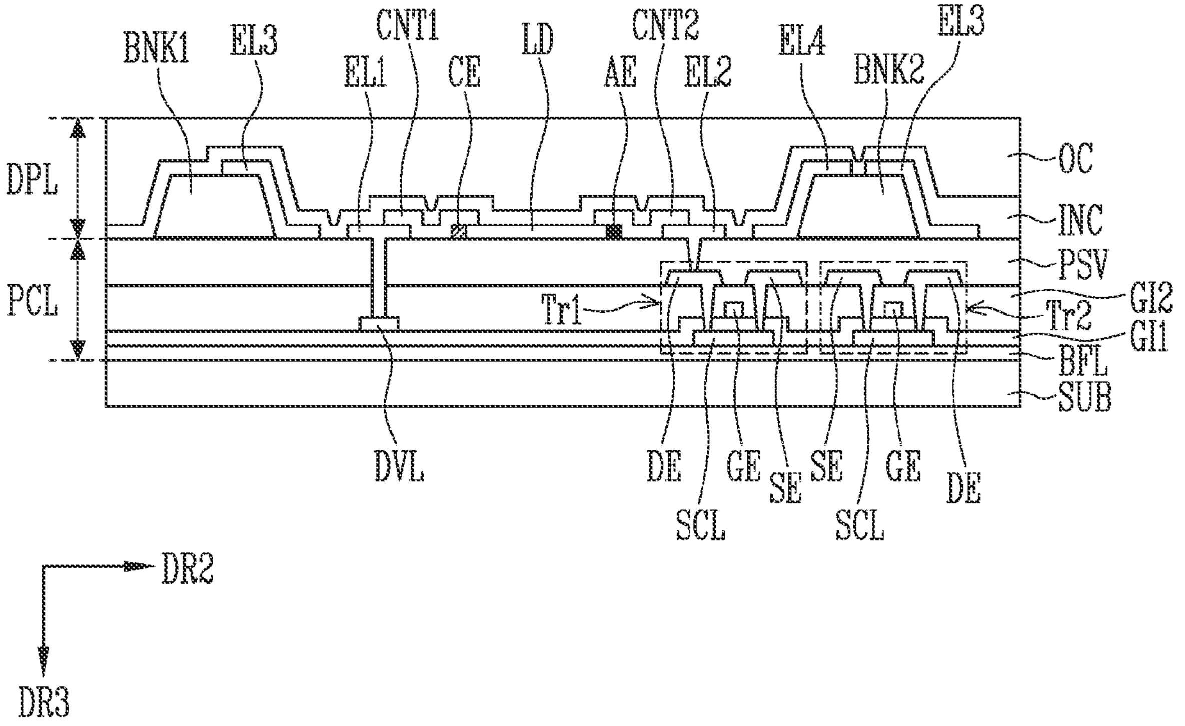
FIG. 12 is a sectional view illustrating a display device according to one or more embodiments of the present disclosure.

FIG. 12 is a sectional view illustrating a display device according to one or more embodiments of the present disclosure. In particular, FIG. 12 is a sectional view of a display device including a display element layer DPL in which first to fourth electrodes EL1 to EL4 are provided on the same surface of a substrate SUB and on which the first and second electrodes EL1 and EL2 are electrically connected to the light emitting element LD.

As illustrated in FIG. 12, the display device may include the substrate SUB, a pixel circuit layer PCL, and the display element layer DPL.

The pixel circuit layer PCL may include a buffer layer BFL, a first transistor T1, a second transistor Tr2, and a driving voltage line DVL.

The buffer layer BFL may be provided on one surface of the substrate SUB. The buffer layer BFL may prevent impurities from being diffused into the first and second transistors Tr1 and Tr2. The buffer layer BFL may be provided in a single layer structure or a multilayer structure having at least two or more layers. When the buffer layer BFL is provided as a multilayer structure, individual layers may be formed of the same material or different materials. In one or more embodiments, the buffer layer BFL may be omitted depending on the material and processing conditions of the substrate SUB.

The first transistor Tr1 may be a driving transistor electrically connected to the light emitting element LD and configured to drive the light emitting element LD. The second transistor Tr2 may be a switching transistor electrically connected to the first transistor Tr1 and configured to switch the first transistor Tr1.

Each of the first and second transistor Tr1 and Tr2 may include a semiconductor layer SCL, a gate electrode GE, a source electrode SE, and a drain electrode DE.

The semiconductor layer SCL may be provided on the buffer layer BFL. The semiconductor layer SCL may include a source region and a drain region respectively contacting the source electrode SE and the drain electrode DE corresponding thereto. An area between the source region and the drain region may be a channel area. The semiconductor layer SCL may be a semiconductor pattern formed of polysilicon, amorphous silicon, an oxide semiconductor, etc. The channel area may be a semiconductor pattern doped with impurities. Impurities such as n-type impurities, p-type impurities or other metals may be used as the impurities.

The gate electrode GE may be provided on the corresponding semiconductor layer SCL with a first gate insulating layer GI1 interposed therebetween.

The source electrode SE and the drain electrode DE included in the first transistor Tr1 may be respectively coupled to the source region and the drain region of the semiconductor layer SCL corresponding thereto through contact holes that pass through the second gate insulating layer GI2 and the first gate insulating layer GI1.

The source electrode SE and the drain electrode DE included in the second transistor Tr2 may be respectively coupled to the source region and the drain region of the semiconductor layer SCL corresponding thereto through respective contact holes that pass through the second gate insulating layer GI2 and the first gate insulating layer GI1.

The driving voltage line DVL may be provided on the first gate insulating layer GI1, but the location of the driving voltage line DVL is not limited thereto. The driving voltage line may be coupled to the second driving power source VSS, and a signal corresponding to the driving voltage may be supplied from a driver to the driving voltage line DVL.

The pixel circuit layer PCL may further include a protective layer PSV for covering the first and second transistors Tr1 and Tr2. The protective layer PSV may be provided as an organic insulating layer, an inorganic insulating layer, or a form including the organic insulating layer disposed on the inorganic insulating layer. The inorganic insulating layer may include at least one of inorganic insulating materials such as a silicon oxide (SiOx), a silicon nitride (SiNx), a silicon oxynitride (SiON), and AlOx. The organic insulating layer may include an organic insulating material that is capable of transmitting light. The organic insulating layer may include, for example, at least one of polyacrylates resin, epoxy resin, phenolic resin, polyamides resin, polyimides resin, unsaturated polyesters resin, poly-phenylen ethers resin, poly-phenylene sulfides resin, and benzocyclobutene resin.

Further, although the case where each of the transistors Tr1 and Tr2 is a thin film transistor having a top gate structure is described by way of example, the present disclosure is not limited thereto. In one or more embodiments, each of the transistors Tr1 and Tr2 may be a thin film transistor having a bottom gate structure.

Referring to FIG. 12, the display element layer DPL may include first and second banks BNK1 and BNK2, first to fourth electrodes EL1 to EL4, a light emitting element LD, and first and second contact electrodes CNT1 and CNT2.

The first bank BNK1 and the second bank BNK2 may be provided to be spaced from each other in a second direction DR2 with the light emitting element LD interposed therebetween. The third and fourth electrodes EL3 and EL4 may be provided on portions of the first and second banks BNK1 and BNK2. One of the first electrode EL1 and the second electrode EL2 may be electrically connected to at least one of a plurality of transistors Tr1 and Tr2 included in the pixel circuit layer PCL.

For example, the second electrode EL2 may be electrically connected to the drain electrode DE of the first transistor Tr1 through a contact hole that passes through the protective layer PSV. The source electrode SE of the first transistor Tr1 may be electrically connected to the first driving power source VDD. By means of this, the second electrode EL2 may receive a signal from the first transistor T1.

The first electrode EL1 may be electrically connected to the driving voltage line DVL through a contact hole that passes through the protective layer PSV and the second gate insulating layer GI2. By means of this, the first electrode EL1 may receive a signal from the driving voltage line DVL.

By the second contact electrode CNT2, the first end (e.g., an anode electrode AE) of the light emitting element LD may contact the second electrode EL2, and by the first contact electrode CNT1, the second end (e.g., cathode electrode CE) of the light emitting element LD may contact the first electrode EL1. Accordingly, the light emitting element LD may receive a suitable voltage (e.g., a set or predetermined voltage) through the first electrode EL1 and the second electrode EL2. When an electric field of the suitable voltage (e.g., a set or predetermined voltage) or more is applied to the both ends of the light emitting element LD, the light emitting element LD emits light while electron and holes are coupled to each other to create electron-hole pairs in the active layer 12. That is, the first and second contact electrodes CNT1 and CNT2 may function as driving electrodes that drive the light emitting element LD.

Light emitted from both ends of the light emitting element LD is reflected by the third and fourth electrodes EL3 and EL4, and may then be guided in a direction upwards from the third direction DR3 (e.g., a front direction).

An encapsulation layer INC may be provided on the protective layer PSV. The first to fourth electrodes EL1 to EL4, the first and second contact electrodes CNT1 and CNT2, and the light emitting element LD are provided on the protective layer PSV. The encapsulation layer INC may cover the first to four electrodes EL1 to EL4, the first and second contact electrodes CNT1 and CNT2, and the light emitting element LD so that they are not exposed to outside, thus preventing occurrence of corrosion.

An overcoat layer OC may be provided on the encapsulation layer INC. The overcoat layer OC may be an encapsulation layer for preventing oxygen and moisture from permeating the light emitting element LD.

FIGS. 13A to 13E are plan views sequentially illustrating a method of manufacturing a display device according to one or more embodiments of the present disclosure. In particular, FIGS. 13A to 13E are plan views sequentially showing a method of manufacturing a display device in which first to third electrodes EL1, EL2, and EL3 are provided on the same surface of a substrate SUB and the first and second electrodes EL1 and EL2 are electrically connected to the light emitting elements LD.

Figure 14:
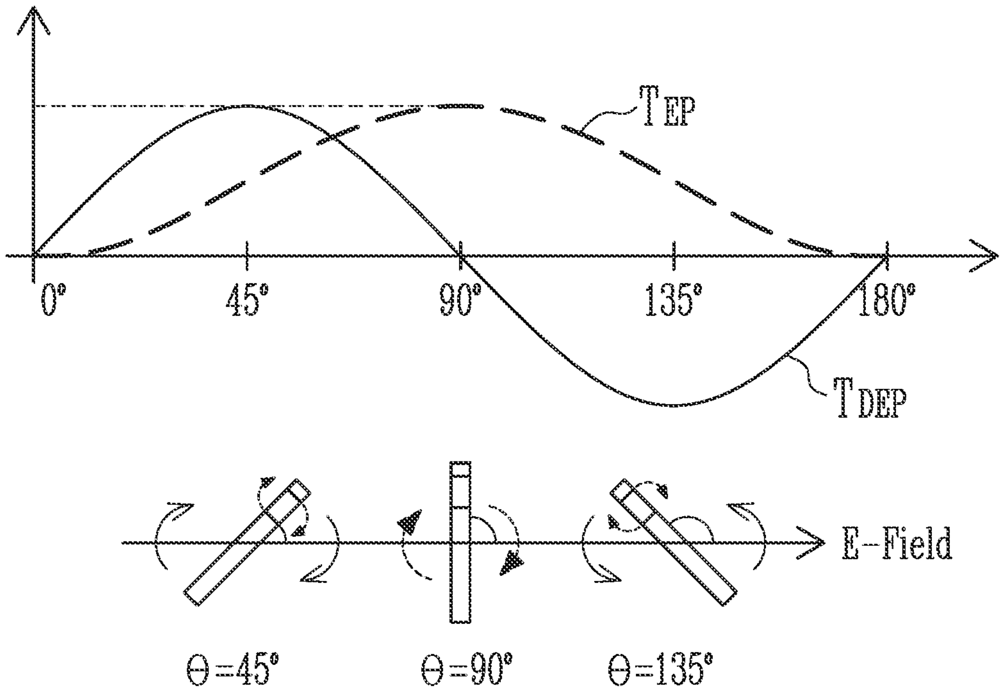
FIG. 14 is a diagram illustrating torques contributing to alignment of light emitting elements and mutual relationships therebetween.
Figure 15A:
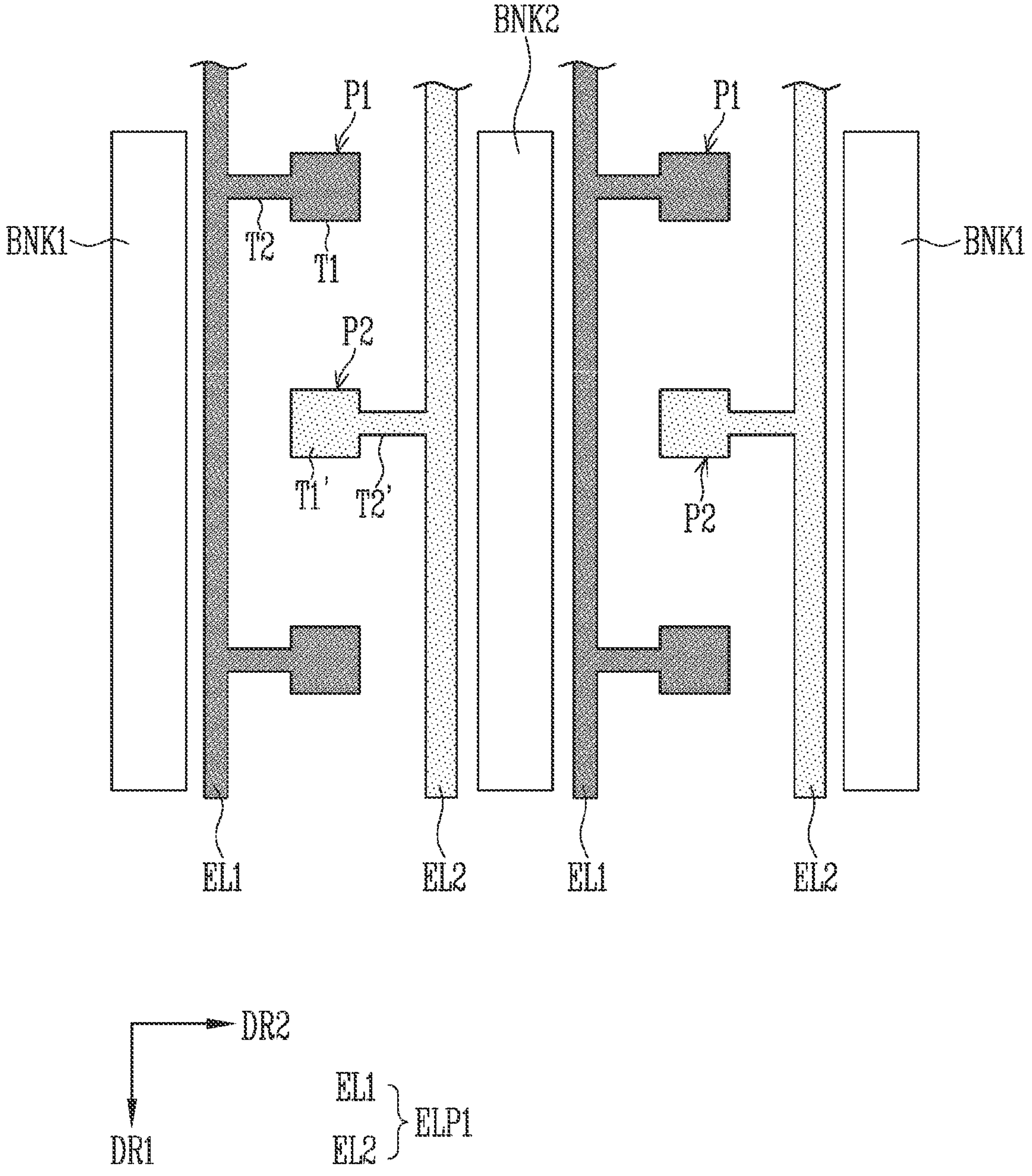
FIGS. 15A to 15G are plan views sequentially illustrating a method of manufacturing a display device according to one or more embodiments of the present disclosure.
Figure 15B:
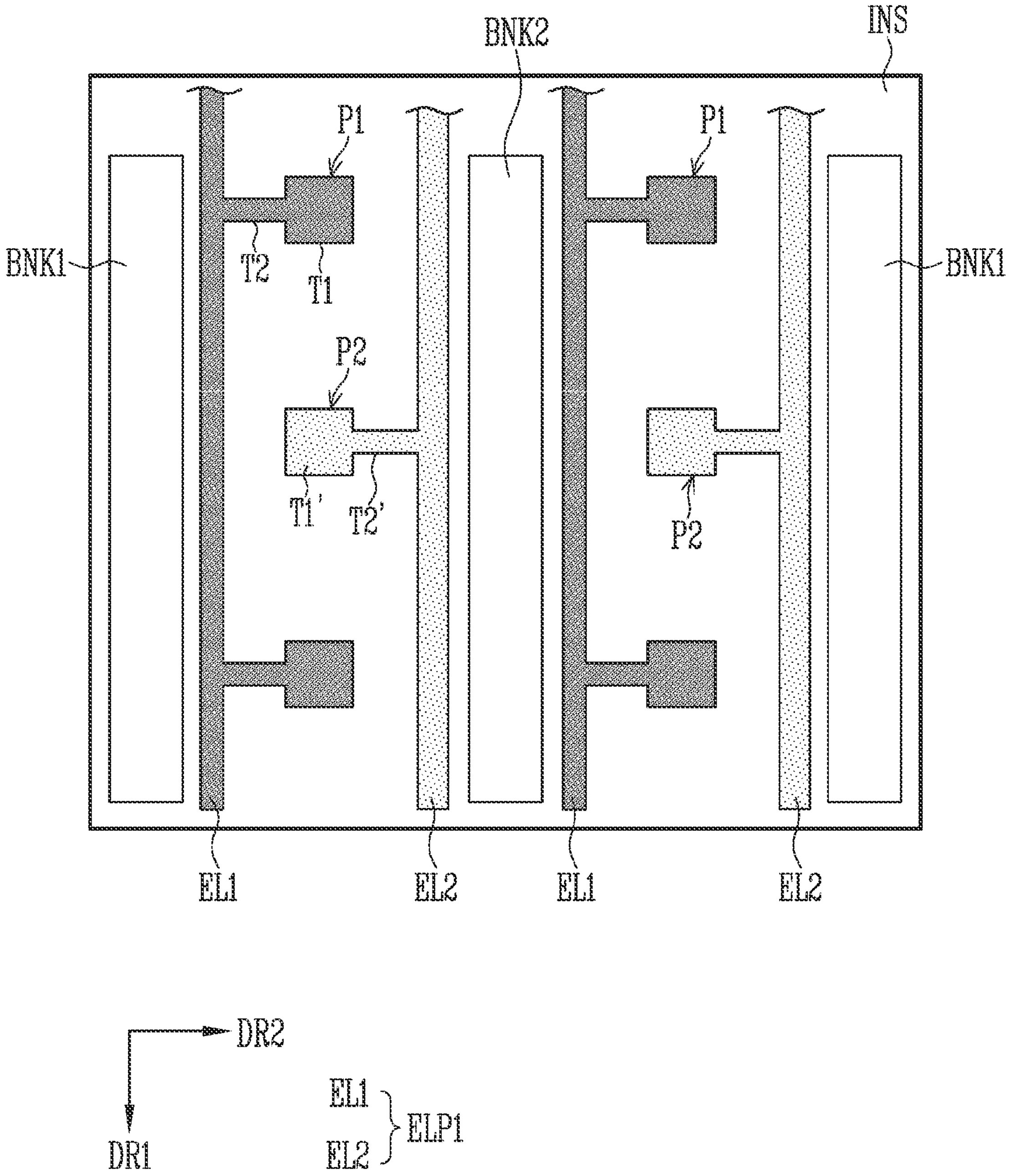
Figure 15C:
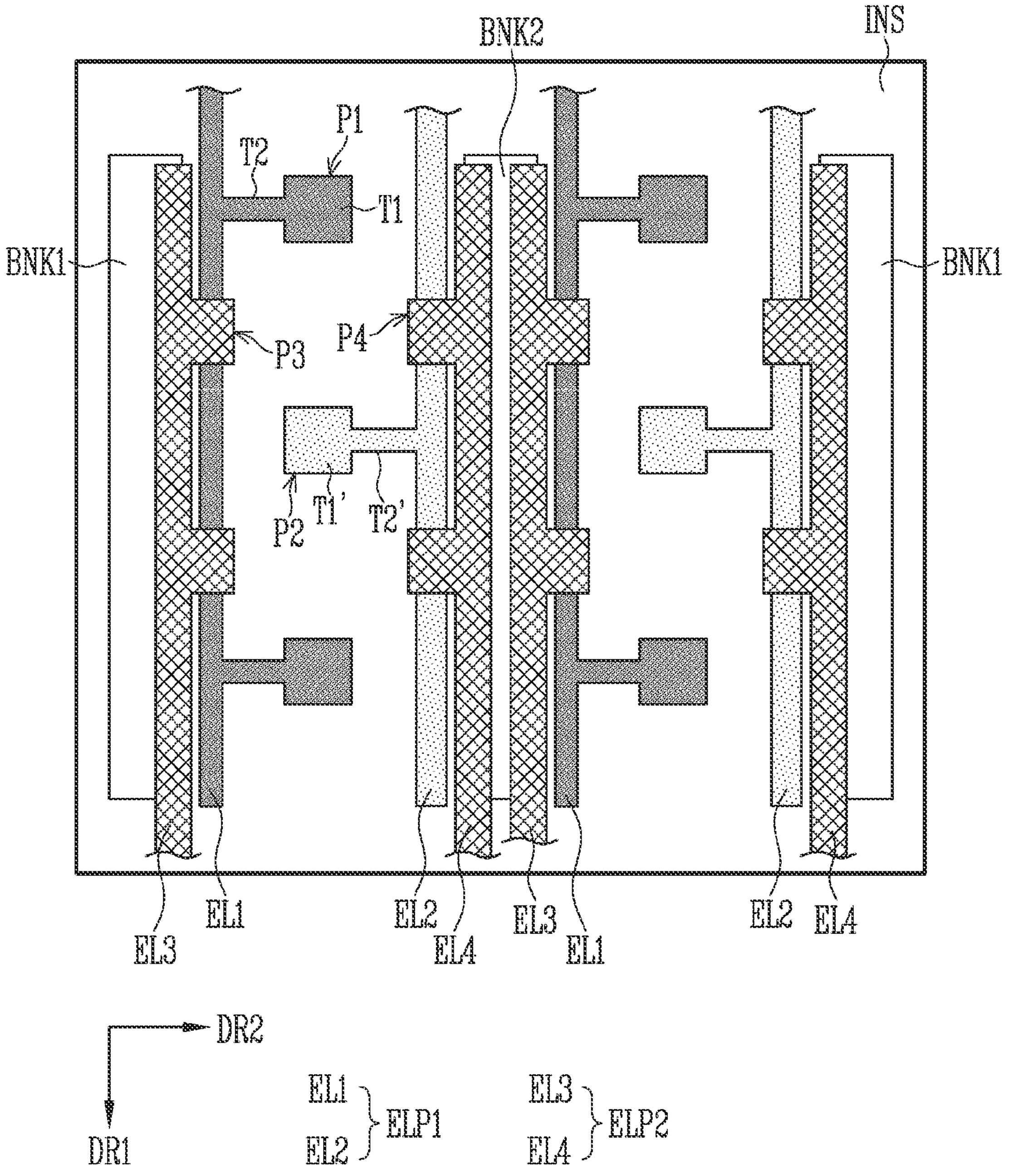
Figure 15D:
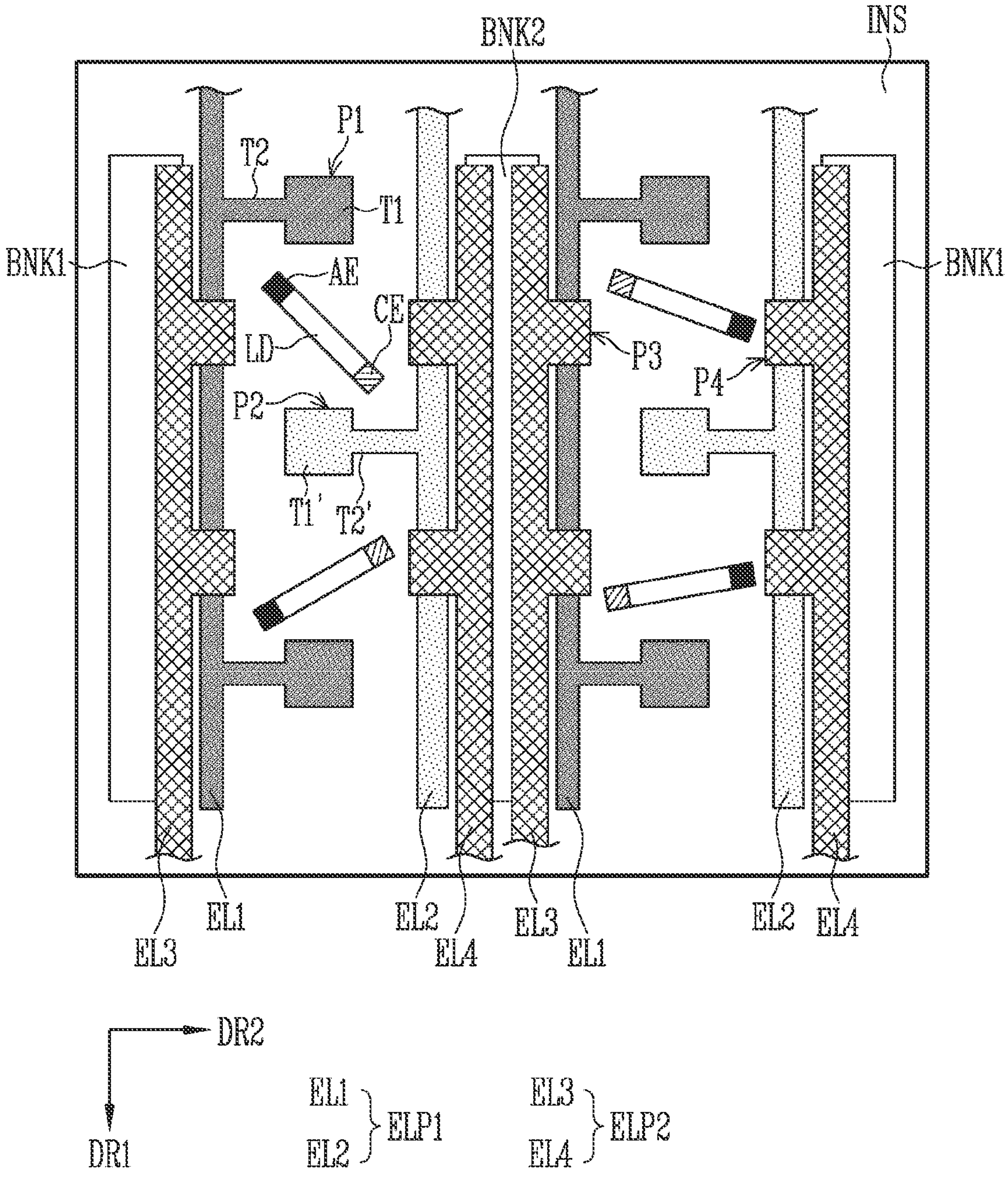
Figure 15E:
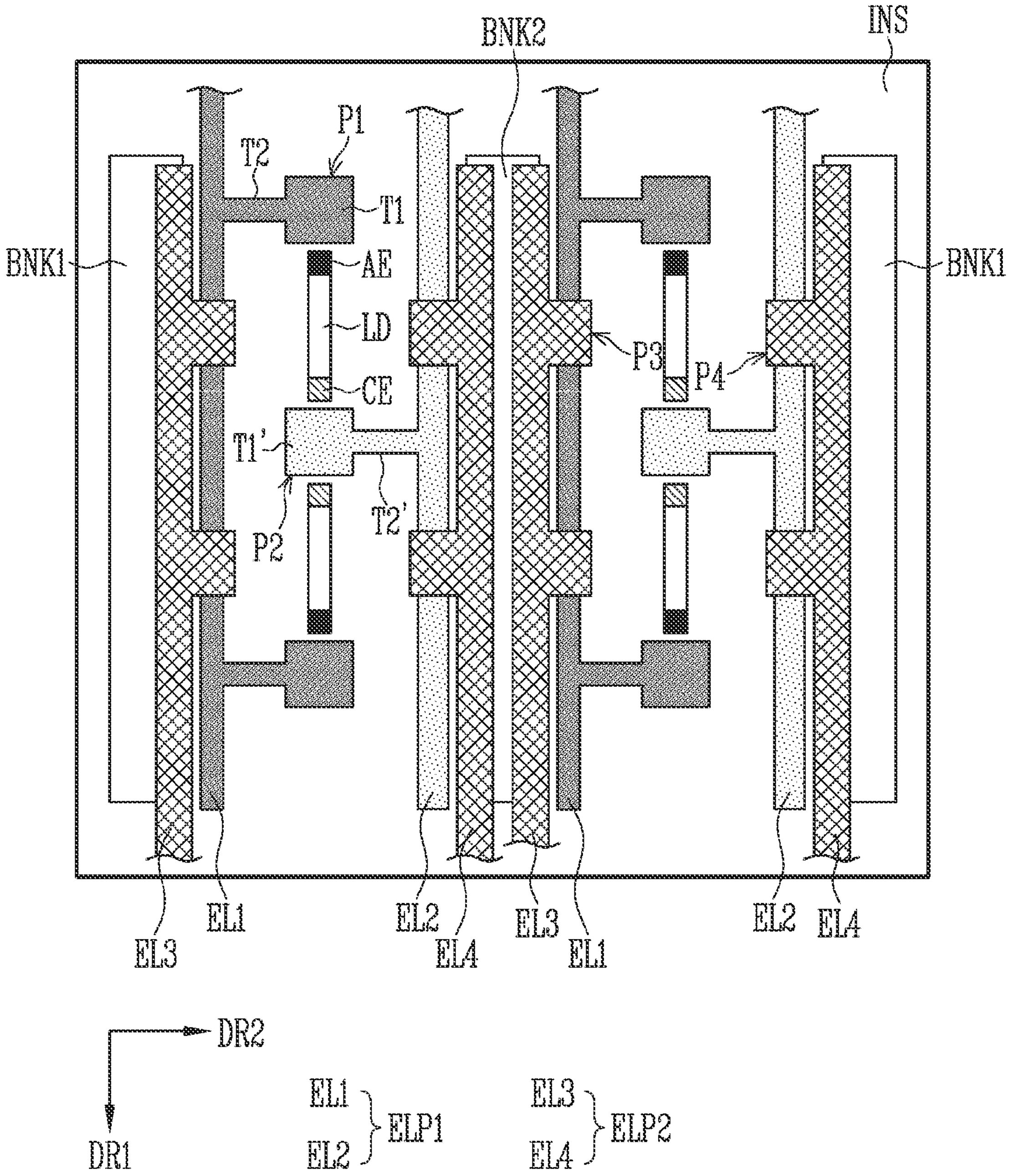
Figure 15F:
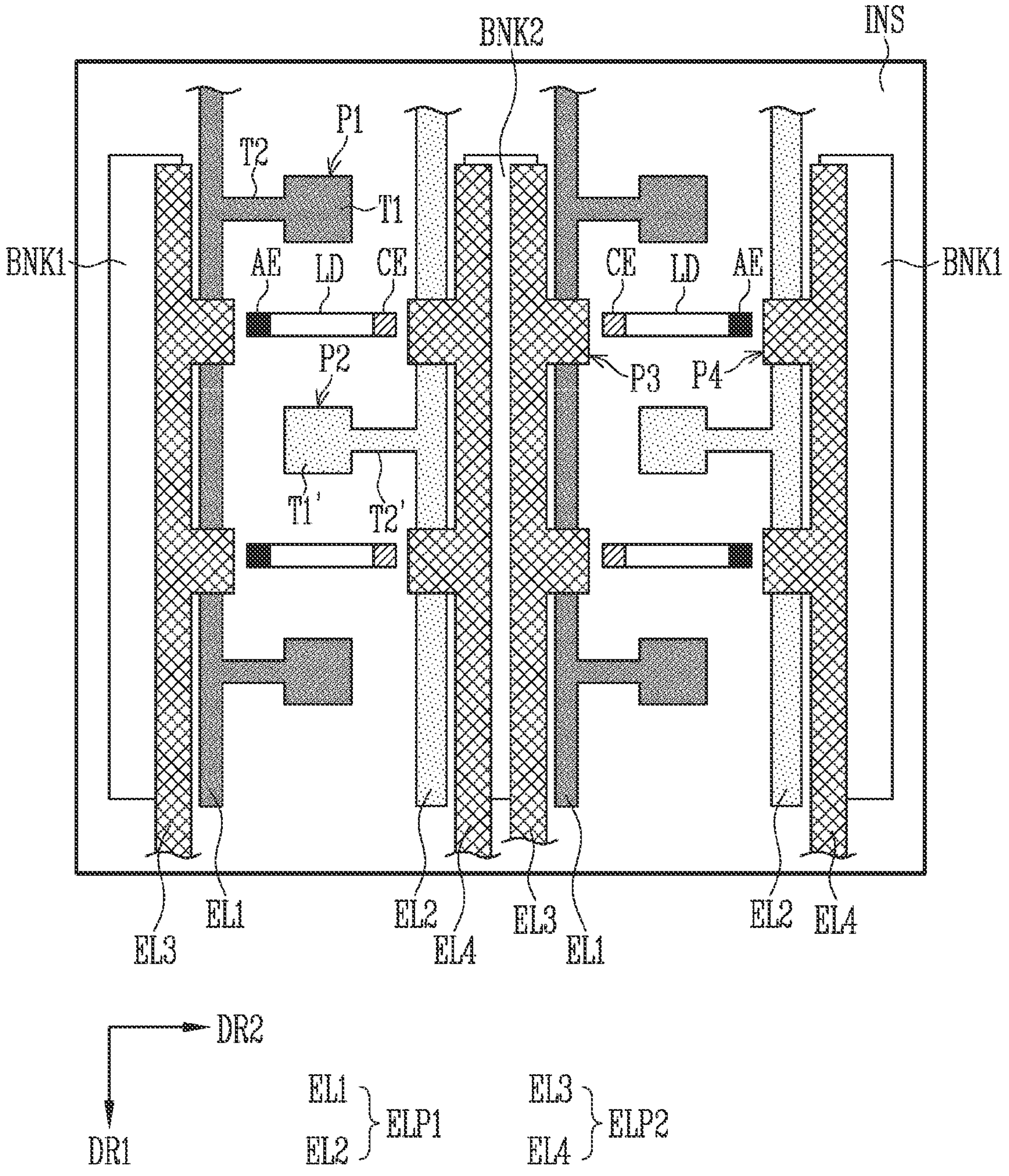
Figure 15G:
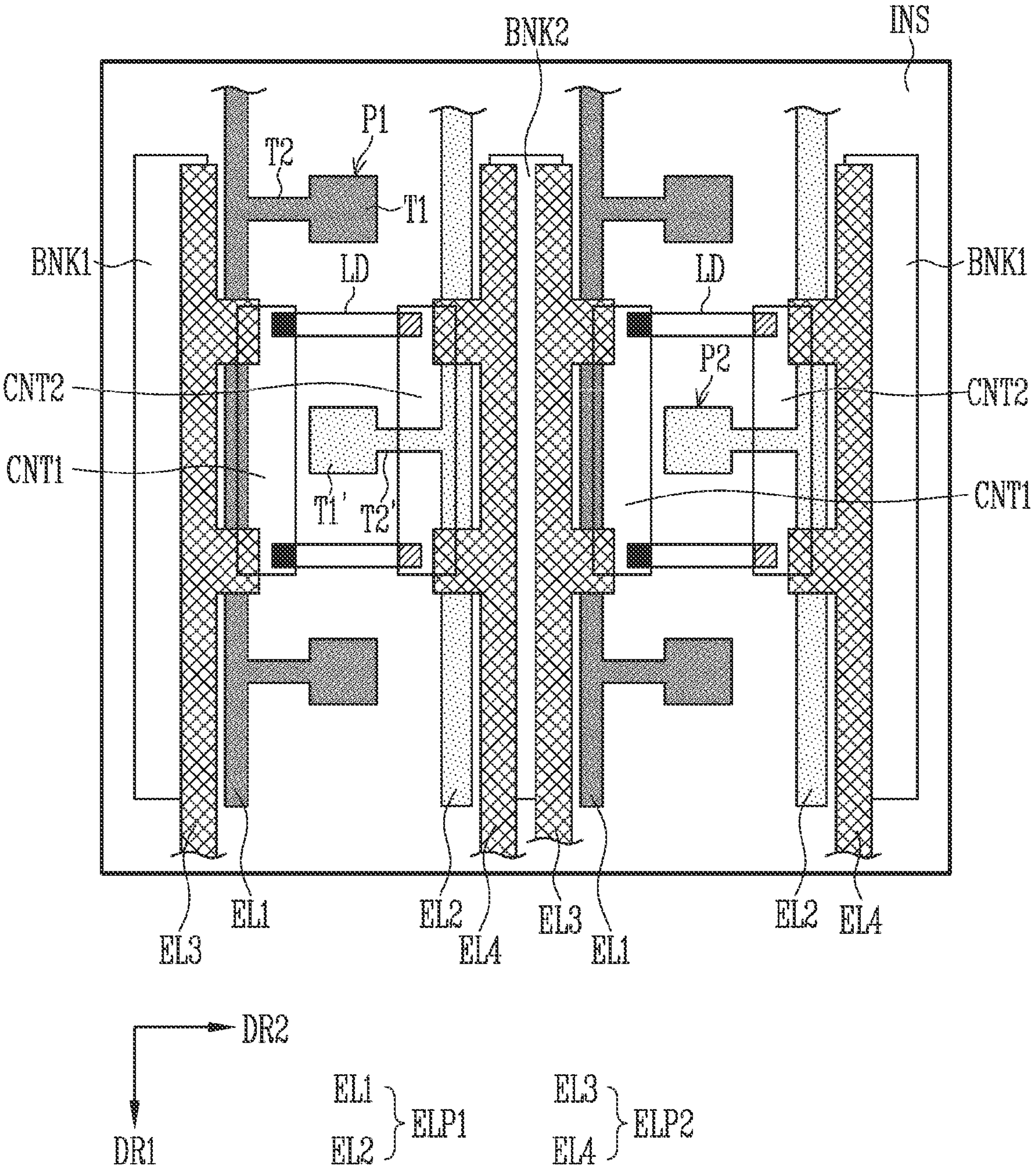

FIG. 14 is a diagram illustrating torques contributing to alignment of light emitting elements and mutual relationships therebetween.

Figure 13A:
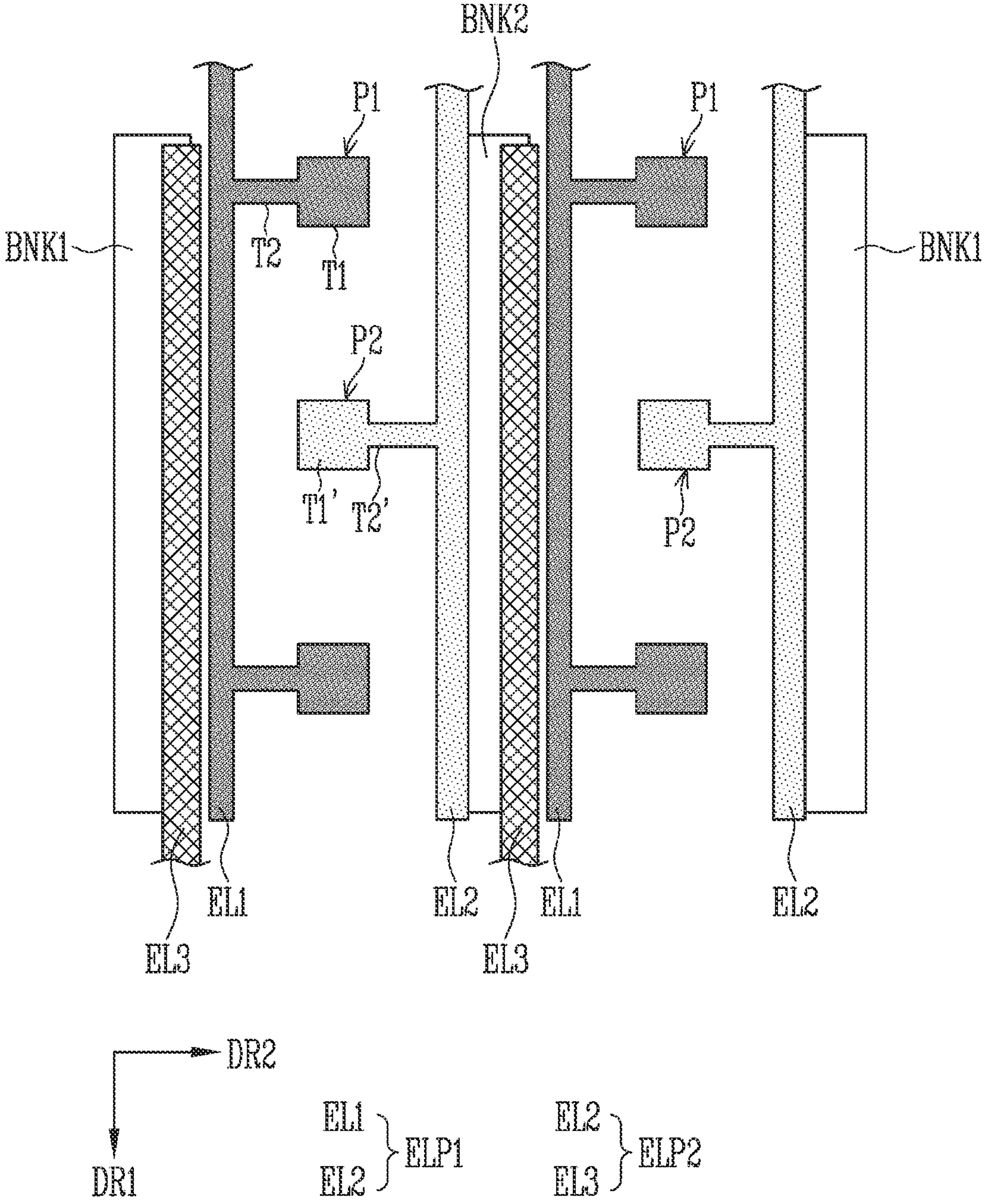
FIGS. 13A to 13E are plan views sequentially illustrating a method of manufacturing a display device according to one or more embodiments of the present disclosure.
Figure 13B:
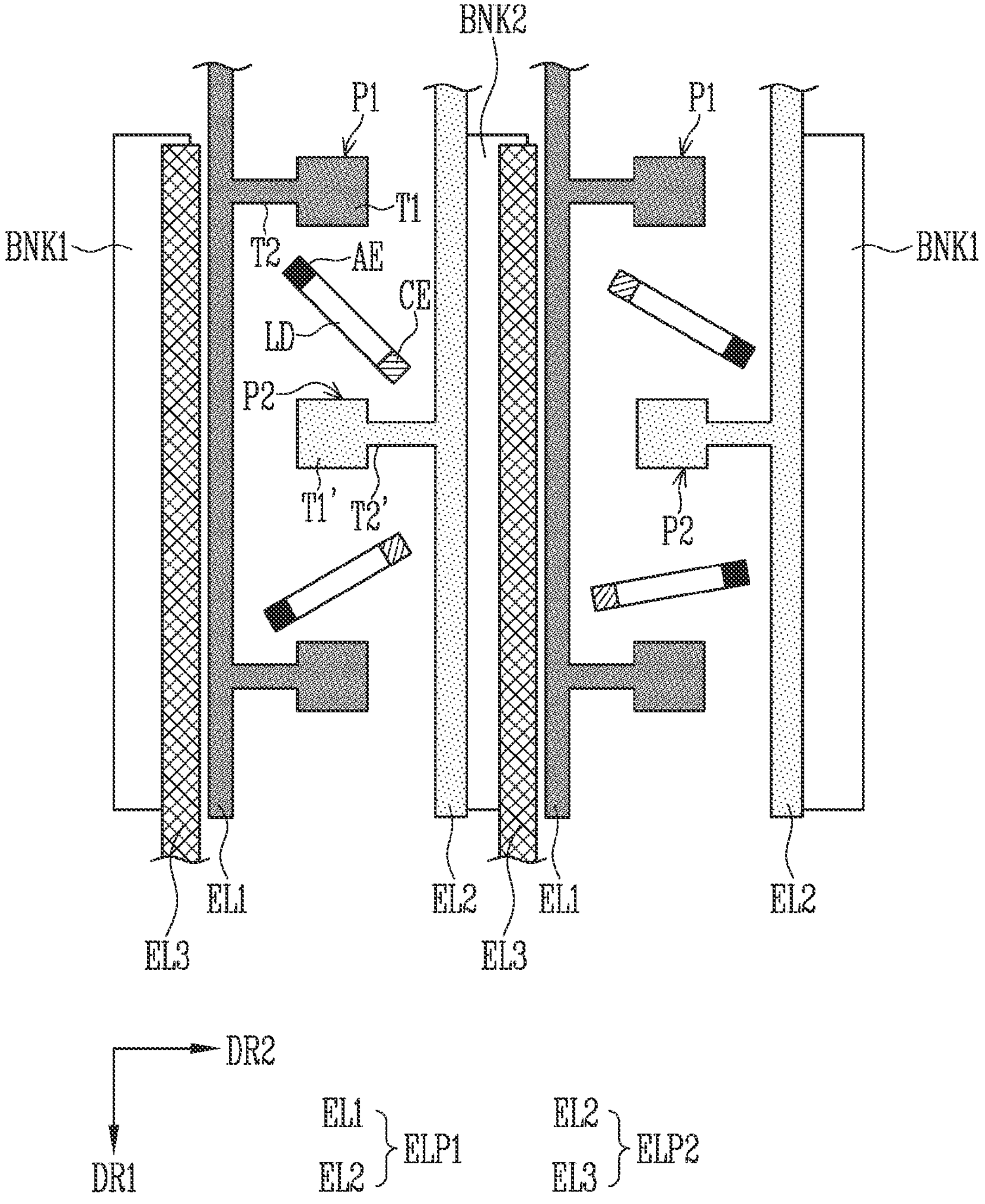

In one or more embodiments, the first to third electrodes EL1, EL2, and EL3 may be formed on one surface of the substrate SUB. As illustrated in FIG. 13A, the first to third electrodes EL1, EL2, and EL3 may be formed on the substrate SUB so that they extend in a first direction DR1 and are spaced from each other in a second direction DR2.

Before the first to third electrodes EL1, EL2, and EL3 are formed, first and second banks BNK1 and BNK2 may be formed on the substrate SUB. The first and second banks BNK1 and BNK2 may be formed to extend in the first direction DR1 and to be spaced from each other in the second direction DR2. The first electrode EL1 may be formed between the first bank BNK1 and the second bank BNK2, and the second electrode EL2 and the third electrode EL3 may be formed to face (or oppose) each other with the first electrode EL1 interposed therebetween. As illustrated in FIG. 13A, the second electrode EL2 and the third electrode EL3 may be formed to overlap portions of the first and second banks BNK1 and BNK2. That is, the second and third electrodes EL2 and EL3 may be formed to correspond to the shapes of the first and second banks BNK1 and BNK2.

First protrusions P1 protruding from the first electrode EL1 toward the second electrode EL2 may be formed on the first electrode EL1. The step of forming the first protrusions P1 may be performed concurrently (e.g., simultaneously) with the step of forming the first electrode EL1. For example, using a mask having the shape of the first electrode EL1 on which the first protrudes P1 are formed, the first electrode EL1 including the first protrusions P1 may be formed on the substrate SUB. Second protrusions P2 protruding from the second electrode EL2 toward the first electrode EL1 may be formed on the second electrode EL2. The step of forming the second protrusions P2 may be identical to the above-described step of forming the first protrusions P1. Here, the first protrusions P1 and the second protrusions P2 may be formed to be alternately arranged along the first direction DR1.

In one or more embodiments of the present disclosure, 1-1-th to 2-1-th connection lines (see CL1-1, CL1-2, and CL2-1 of FIGS. 4A to 4F) may be formed on the substrate SUB on which the first to third electrodes EL1, EL2, and EL3 are formed. A connection relationship between the first to third electrodes EL1, EL2, and EL3 and the 1-1-th to 2-1-th connection lines CL1-1, CL1-2, and CL2-1 may be identical to those described above with reference to FIGS. 4A to 4F.

For example, on one surface of the substrate SUB, the second electrode EL2 may be coupled to the 2-1-th connection line CL2-1, and the third electrode EL3 may be coupled to the 1-2-th connection line CL1-2. Also, as illustrated in FIG. 5B, an insulating layer INS may be formed on the 2-1-th connection line CL2-1, and the first electrode EL1 may be coupled to the 1-1-th connection line CL1-1 through a bridge pattern BRP.

In one or more embodiments of the present disclosure, at the step of providing the light emitting elements LD, the light emitting elements LD may be provided on the substrate SUB on which the first to third electrodes EL1, EL2, and EL3 are formed. For example, the light emitting elements LD may be injected into emission areas of respective pixels PXL through an ink jet printing scheme, a slit coating scheme, or other various schemes. For example, the light emitting elements LD may be mixed with a volatile solvent and then be supplied to the emission areas of respective pixels PXL through the ink jet printing scheme or the slit coating scheme.

In one or more embodiments of the present disclosure, a first alignment signal may be applied to the first and second electrodes EL1 and EL2, and thus the light emitting elements LD may be primarily aligned. When the first alignment signal is applied to the first and second electrodes EL1 and EL2, self-aligning of the light emitting elements LD may be induced due to an electric field formed between the first electrode EL1 and the second electrode EL2. That is, the first and second electrodes EL1 and EL2 may function as alignment electrodes (or alignment lines) for aligning the light emitting elements LD.

Figure 13C:
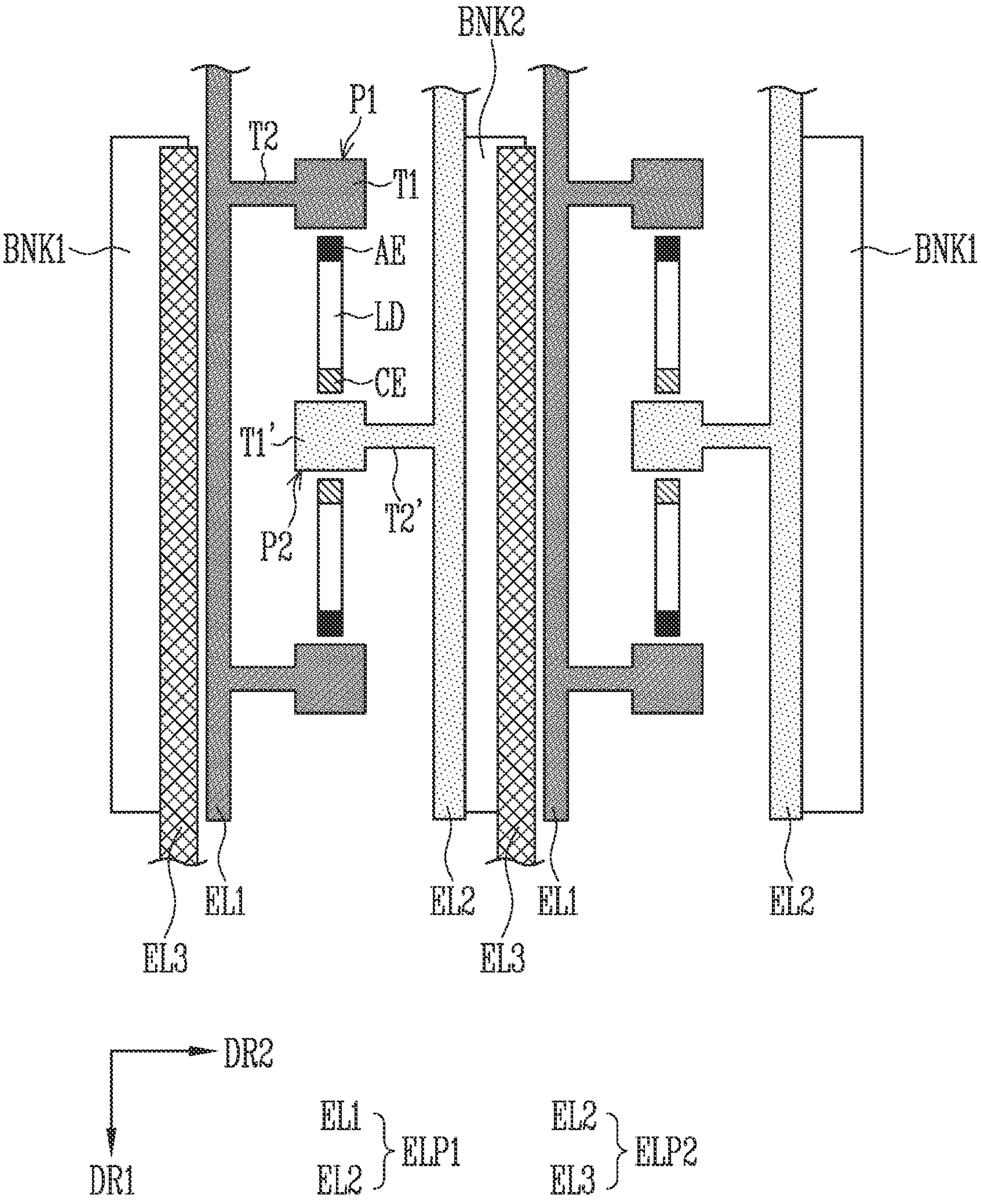

As illustrated in FIG. 13C, the first alignment signal may be applied to the first and second electrodes EL1 and EL2, thus enabling the light emitting elements LD to be primarily aligned such that the first ends and the second ends of the light emitting elements LD face (or oppose) the first protrusions P1 and the second protrusions P2, respectively. That is, the first alignment signal may be applied to a first electrode pair ELP1 including the first and second electrodes EL1 and EL2, and thus the light emitting elements LD may be primarily aligned on the substrate SUB.

During the primary alignment, a 1-1-th alignment signal may be applied to the first electrode EL1 through the 1-1-th connection line CL1-1, and a 1-2-th alignment signal may be applied to the second electrode EL2 through the 2-1-th connection line CL2-1. The 1-1-th alignment signal and the 1-2-th alignment signal may have different voltage levels.

The 1-1-th and 1-2-th alignment signals may be signals having a voltage difference and/or a phase difference enough to align the light emitting elements LD between the first and second protrusions P1 and P2. For example, the 1-1-th alignment signal may be an alternating current (AC) signal, and the 1-2-th alignment signal may be a ground signal GND, but the present disclosure is not limited thereto.

In one or more embodiments of the present disclosure, the first ends (e.g., anode electrodes AE) of the light emitting elements LD may face the first protrusions P1, and the second ends thereof (e.g., cathode electrodes CE) may face the second protrusions P2. In one or more embodiments, the first ends (e.g., anode electrodes AE) of the light emitting elements LD may face the second protrusions P2, and the second ends thereof (e.g., cathode electrodes CE) may face the first protrusions P1.

In one or more embodiments, the light emitting elements LD are primarily aligned such that the first ends and the second ends of the light emitting elements LD face the first protrusions P1 and the second protrusions P2, respectively, and thus the degree of directional alignment of the light emitting elements LD between the first electrode EL1 and the second electrode EL2 may be improved during secondary alignment, which will be described later. In particular, when the light emitting elements LD are aligned to be perpendicular (or substantially perpendicular) to the second direction DR2 during primary alignment (or aligned in parallel to the first direction DR1), the degree of directional alignment of the light emitting elements LD may be maximally secured.

In FIG. 14, an angle θ may be an angle between the direction of an electric field and the direction of a major axis that couples the first end and the second end of each light emitting element LD to each other. For example, the angle θ may be the angle of a light emitting element LD with respect to the second direction DR2. Furthermore, in FIG. 14, torque EP (TEP) may indicate the rotational force caused by a dipole moment in the light emitting element LD, and may be defined by the following Equation 1. Here, TEP may be represented by a function of Sin*Sin.

$$TEP=p\times E \quad \text{[Equation 1]}$$

In Equation 1, p may mean an internal dipole moment occurring in a process for manufacturing the light emitting element LD. Here, p=QW/2, Q may be charge, and W may be the width of a depletion layer.

Also, in FIG. 14, a torque DEP ($T_{DEP}$) may mean rotational force depending on a dipole moment induced by an externally applied electric field, and may be defined by the following Equation 2. In this case, $T_{DEP}$ may be represented by a function of Cos*Sin.

$$T_{DEP}=p\times E \quad \text{[Equation 2]}$$

In Equation 2, p may be a dipole moment induced in the light emitting element LD due to the electric field.

Referring to FIG. 14, when an angle between the direction of the major axis of the light emitting element LD and the direction of the electric field is 90°, TEP formed in the light emitting element LD in secondary alignment may be maximized, and $T_{DEP}$ may be 0. By means of this, primary alignment may be completed, and the degree of directional alignment of light emitting elements LD may be maximally secured during secondary alignment.

In one or more embodiments of the present disclosure, each first protrusion P1 may include a first end T1 adjacent to the second electrode EL2 and a second end T2 adjacent to the first electrode EL1, and each second protrusion P2 may include a first end T1' adjacent to the first electrode EL1 and a second end T2' adjacent to the second electrode EL2.

As illustrated in FIGS. 13A to 13E, the widths of the first ends T1 and T1' of the first protrusion P1 and the second protrusion P2 in the first direction DR1 may be greater than those of the second ends T2 and T2' thereof. The widths of the first ends T1 and T1' of the first and second protrusions P1 and P2 are formed to be greater than the widths of the second ends T2 and T2' thereof, whereby the light emitting elements LD have an angle of 90° with respect to the second direction DR2, and primary alignment of the light emitting elements LD may be facilitated. Through this process, the degree of directional alignment of the light emitting elements LD may be improved during secondary alignment.

In one or more embodiments of the present disclosure, the second alignment signal may be applied to the second and third electrodes EL2 and EL3, and thus the light emitting elements LD may be secondarily aligned. That is, the second and third electrodes EL2 and EL3 may function as alignment electrodes (or alignment lines) for aligning the light emitting elements LD.

Figure 13D:
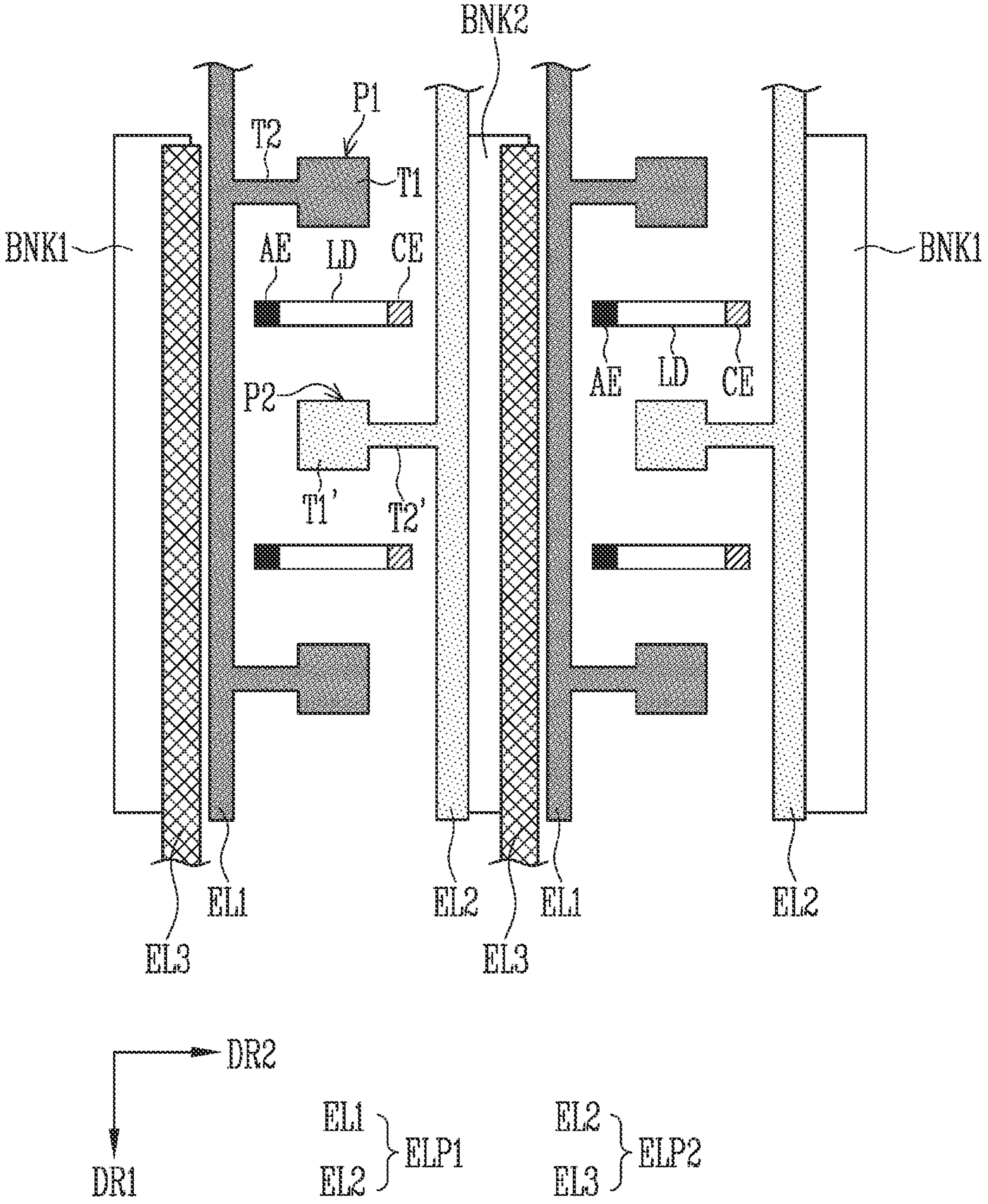

As illustrated in FIG. 13D, the second alignment signal may be applied to the second and third electrodes EL2 and EL3, and thus first ends of respective light emitting elements LD may be secondarily aligned to face one of the first and second electrodes EL1 and EL2. The first ends (e.g., anode electrodes AE) of the light emitting elements LD may face the first electrode EL1, and the second ends thereof (e.g., cathode electrodes CE) may face the second electrode EL2. That is, the second alignment signal may be applied to a second electrode pair ELP2 including the second and third electrodes EL2 and EL3, and thus the light emitting elements LD may be directionally aligned on the substrate SUB.

During the secondary alignment, a 2-1-th alignment signal may be applied to the third electrode EL3 through the 1-2-th connection line CL1-2, and a 2-2-th alignment signal may be applied to the second electrode EL2 through the 2-1-th connection line CL2-1. The 2-1-th alignment signal and the 2-2-th alignment signal may have different voltage levels. The 2-1-th and 2-2-th alignment signals may be signals having a voltage difference and/or a phase difference enough to directionally align the light emitting elements LD between the first and second electrodes EL1 and EL2. For example, the 2-1-th alignment signal may be an alternating current (AC) signal, and the 2-2-th alignment signal may be a ground signal GND, but the present disclosure is not limited thereto.

In one or more embodiments of the present disclosure, the frequency of the first alignment signal may be higher than that of the second alignment signal. That is, the first alignment signal having a high frequency may be applied to the first electrode pair ELP1, and the second alignment signal having a low frequency may be applied to the second electrode pair ELP2. By exploiting a high frequency as the first alignment signal to be applied when the light emitting elements LD are primarily aligned, the angle of the light emitting elements LD with respect to the second direction DR2 during the primary alignment may be formed to be closer to 90°. For example, the first alignment signal may have a frequency that is equal to or higher than 1 kHz and lower than or equal to 1 mHz, and the second alignment signal may have a frequency of lower than 1 kHz, but the frequencies of the first and second alignment signals are not limited thereto.

In one or more embodiments of the present disclosure, the waveform of the second alignment signal may be a square wave, a sawtooth wave or a pulse wave. For example, the pulse wave may be a DC pulse wave. The second alignment signal having a waveform of a square wave, a sawtooth wave or a pulse wave is applied to the second electrode pair ELP2, and thus the light emitting elements LD may be effectively directionally aligned. In one or more embodiments, the waveform of the first alignment signal is not especially limited, and may be identical to or different from that of the second alignment signal.

In one or more embodiments of the present disclosure, after application of the first alignment signal to the first electrode pair ELP1 has been stopped, the second alignment signal may be applied to the second electrode pair ELP2 when a suitable time (e.g., a set or predetermined time) has elapsed. A suitable interval (e.g., a set or predetermined interval) is provided between the time to stop the first alignment signal and the time to apply the second alignment signal, and thus the degree of directional alignment of the light-emitting elements LD may be improved during secondary alignment. In one or more embodiments, at the same time that the application of the first alignment signal to the first electrode layer ELP1 is stopped, the second alignment signal may be applied to the second electrode pair ELP2.

In one or more embodiments of the present disclosure, directional alignment is performed such that respective first ends of the light emitting elements LD face one of the first and second electrodes EL1 and EL2 on the substrate SUB, after which a solvent is volatilized or removed using other methods, thus enabling the light emitting elements LD to be fixed in respective emission areas of pixels PXL in a directionally aligned state.

In one or more embodiments of the present disclosure, the method of manufacturing a display device may include the step of forming a first contact electrode CNT1 for electrically connecting at least one of the first electrode EL1 and the third electrode EL3 to the light emitting elements LD and a second contact electrode CNT2 for electrically connecting the second electrode EL2 to the light emitting elements LD. In detail, the first contact electrode CNT1 may electrically connect at least the first electrode EL1 of the first and third electrodes EL1 and EL3 to the light emitting elements LD.

Figure 13E:
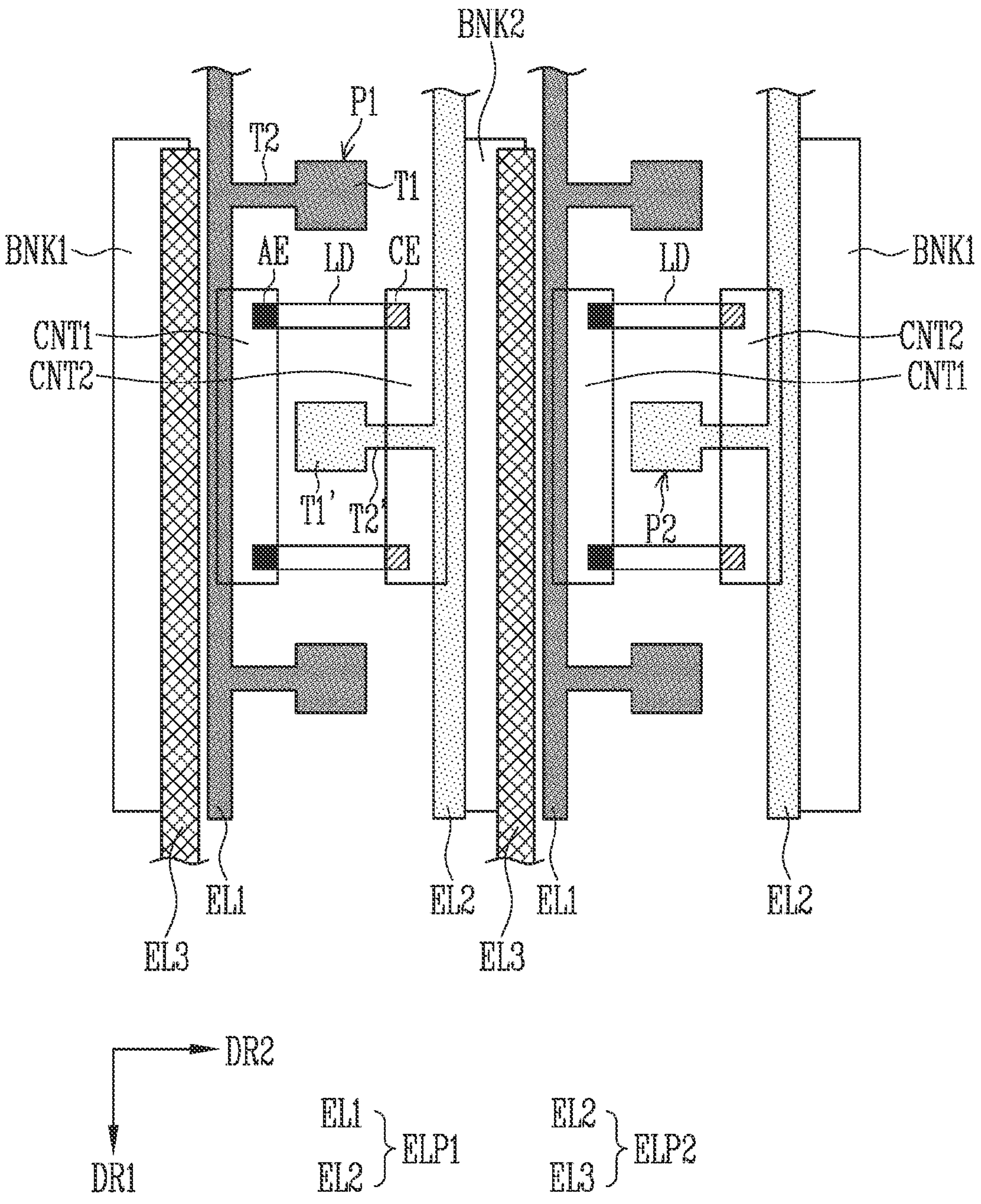

As illustrated in FIG. 13E, the first contact electrode CNT1 may connect the first ends (e.g., anode electrodes AE) of the light emitting elements LD to the first electrode EL1, and the second contact electrode CNT2 may connect the second ends (e.g., cathode electrodes CE) of the light emitting elements LD to the second electrode EL2. Here, a 1-1-th connection line CL1-1 coupled to the first electrode EL1 may be coupled to a first driving power source VDD, and a 2-1-th connection line CL2-1 coupled to the second electrode EL2 may be coupled to a second driving power source VSS.

In one or more embodiments of the present disclosure, after the first and second contact electrodes CNT1 and CNT2 have been formed, an encapsulation layer INC may be formed on the substrate SUB. The encapsulation layer INC is formed, and thus light emitting elements LD that are directionally aligned may be finally fixed. Also, an overcoat layer OC may be formed on the encapsulation layer INC.

In one or more embodiments of the present disclosure, the step of forming the first to third electrodes EL1, EL2, and EL3 may include the step of forming the first and second electrodes EL1 and EL2 on the substrate SUB, the step of forming an insulating layer INS on the substrate SUB on which the first and second electrodes EL1 and EL2 are formed, and the step of forming the third electrode on the insulating layer INS. By means of this, the display device including a display element layer DPL illustrated in FIGS. 6A to 7B may be manufactured.

FIGS. 15A to 15G are plan views sequentially illustrating a method of manufacturing a display device according to one or more embodiments of the present disclosure. In particular, FIGS. 15A to 15E are plan views sequentially illustrating a method of manufacturing a display device in which the first and second electrodes EL1 and EL2 and the third and fourth electrodes EL3 and EL4 are provided on different surfaces of the substrate SUB and the third and fourth electrodes EL3 and EL4 are electrically connected to the light emitting elements LD.

FIGS. 15A to 15G illustrate the case where the first and second electrodes EL1 and EL2 are formed on the substrate SUB, an insulating layer INS is formed on the substrate SUB including the first and second electrodes EL1 and EL2, and the third and fourth electrodes EL3 and EL4 and the light emitting elements LD are provided on the insulating layer INS. In one or more embodiments, a separate insulating layer INS is not formed in an emission area, and the first to fourth electrodes EL1 to EL4 and light emitting elements LD are provided on one surface of the substrate SUB, and thus the display device including the display element layer DPL illustrated in FIGS. 8A to 9B may be manufactured. Hereinafter, as illustrated in FIGS. 15A to 15G, a description will be made based on an embodiment in which a first electrode pair ELP1 including the first and second electrodes EL1 and EL2 and a second electrode pair ELP2 including third and fourth electrodes EL3 and EL4 are provided on different surfaces with an insulating layer INS interposed therebetween.

In one or more embodiments of the present disclosure, the first electrode pair ELP1 including the first and second electrodes EL1 and EL2 that are extending in a first direction DR1 and are spaced from each other in a second direction DR2 may be formed on the substrate SUB. Here, the first electrode EL1 may include first protrusions P1 protruding toward the second electrode EL2, and the second electrode EL2 may include second protrusions P2 protruding toward the first electrode EL1. The first and second protrusions P1 and P2 may be alternately arranged along the first direction DR1.

The 1-1 to 2-2-th connection lines CL1-1 to CL2-2 may be provided on one surface of the substrate SUB. The first electrode EL1 may be coupled to the 2-1-th connection line CL2-1. Through a bridge pattern BRP provided on the insulating layer INS overlapping the 2-1-th connection line CL2-1, the second electrode EL2 may be coupled to the 1-1-th connection line CL1-1.

The insulating layer INS may be formed on the substrate SUB including the first and second electrodes EL1 and EL2. The second electrode pair ELP2 including third and fourth electrodes EL3 and EL4 that are extending in the first direction DR1 and are spaced from each other in the second direction DR2 with the first electrode pair ELP1 interposed therebetween may be formed on the insulating layer INS. The third electrode EL3 may be coupled to the 1-2-th connection line CL1-2 through a contact hole, which passes through the insulating layer INS, and the fourth electrode EL4 may be coupled to the 2-2-th connection line CL2-2.

The light emitting elements LD may be provided on the insulating layer INS including the second electrode pair ELP2. Thereafter, a first alignment signal may be applied to the first electrode pair ELP1, so that the light emitting elements LD may be primarily aligned such that first ends and second ends of the light emitting elements LD face the first and second protrusions P1 and P2.

During the primary alignment, a 1-1-th alignment signal may be applied to the first electrode EL1 through the 2-1-th connection line CL2-1, and a 1-2-th alignment signal may be applied to the second electrode EL2 through the 1-1-th connection line CL1-1. For example, the 1-1-th alignment signal may be a ground signal GND, and the 1-2-th alignment signal may be an alternating current (AC) signal, but the present disclosure is not limited thereto.

After the primary alignment has been completed, a second alignment signal may be applied to the second electrode pair ELP2, whereby the light emitting elements LD may be secondarily aligned (directionally aligned) such that respective first ends thereof face one of the first and second electrodes EL1 and EL2.

During the secondary alignment, a 2-1-th alignment signal may be applied to the third electrode EL3 through the 1-2-th connection line CL1-2, and a 2-2-th alignment signal may be applied to the fourth electrode EL4 through the 2-2-th connection line CL2-2. For example, the 2-1-th alignment signal may be an alternating current (AC) signal, and the 2-2-th alignment signal may be a ground signal GND, but the present disclosure is not limited thereto.

In one or more embodiments of the present disclosure, with respect to the second direction DR2, the third electrode EL3 may include third protrusions P3 protruding toward the fourth electrode EL4, and the fourth electrode EL4 may include fourth protrusions P4 protruding toward the third electrode EL3. By forming the third and fourth protrusions P3 and P4, the light emitting elements LD may be more effectively directionally aligned. By means of this, the light emitting elements LD may be directionally aligned in the state in which the first ends (e.g., anode electrodes AE) of the light emitting elements LD face (or oppose) the third protrusions P3, and the second ends thereof (e.g., cathode electrodes CE) face (or oppose) the fourth protrusions P4.

After directional alignment of the light emitting elements LD has been completed, a solvent remaining on the insulating layer INS is removed, with the result that the directionally aligned light emitting elements LD may be fixed on the insulating layer INS. Thereafter, a first contact electrode CNT1 for connecting the third protrusions P3 to the first ends of the light emitting elements LD and a second contact electrode CNT2 for connecting the fourth protrusions P4 to the second ends of the light emitting elements LD may be formed. In one or more embodiments of the present disclosure, after the first and second contact electrodes CNT1 and CNT2 have been formed, an encapsulation layer INC may be formed on the insulating layer INS. The encapsulation layer INC is formed, and thus light emitting elements LD that are directionally aligned may be finally fixed. Also, an overcoat layer OC may be formed on the encapsulation layer INC.

The foregoing detailed descriptions are intended to exemplify and explain the present disclosure. Further, the above-described contents are merely intended to represent and describe embodiments of the present disclosure, and as described above, the present disclosure may be used in various other combinations, modifications, and environments, and may be changed or modified within the scope of the concept of the disclosure disclosed in the present specification, equivalents of the disclosed contents, and/or the scope of those skilled in the art or knowledge. Therefore, the foregoing detailed description of the present disclosure is not intended to limit the disclosure to the disclosed embodiments. Also, the accompanying claims should be construed as including alternative embodiments.

The invention claimed is:

1. A display device, comprising:
a substrate; and
a display element layer on a first surface of the substrate, the display element layer comprising:
a plurality of light emitting elements;
a first electrode and a second electrode extending in a first direction and spaced from each other in a second direction different from the first direction; and
a third electrode extending in the first direction and opposing the second electrode with the first electrode interposed between the third electrode and the second electrode, and the third electrode being not overlapped with the plurality of light emitting elements in a plan view,
wherein the first electrode comprises a first protrusion protruding toward the second electrode,
wherein the second electrode comprises a second protrusion protruding toward the first electrode,
wherein the first protrusion and the second protrusion are alternately arranged along the first direction and extend from the first electrode and the second electrode in the second direction,
wherein each of the plurality of light emitting elements extends in the second direction to have a length in the second direction that is greater than a width in the first direction, and
wherein the plurality of light emitting elements is located between the first protrusion and the second protrusion, and first ends of respective one of the plurality of light emitting elements face one of the first electrode or the second electrode.

2. The display device according to claim 1, wherein the first electrode, the second electrode, and the third electrode, and the plurality of light emitting elements are located on a same surface of the substrate.

3. The display device according to claim 2, wherein the display element layer further comprises:
a first contact electrode electrically connecting at least one of the first electrode and the third electrode to the plurality of light emitting elements; and
a second contact electrode electrically connecting the second electrode to the plurality of light emitting elements.

4. The display device according to claim 3, wherein:
the first contact electrode comprises first sub-contact electrodes coupled to a portion of the first electrode adjacent to the plurality of light emitting elements and spaced from each other in the first direction; and
the second contact electrode comprises second sub-contact electrodes coupled to a portion of the second electrode adjacent to the plurality of light emitting elements and spaced from each other in the first direction.

5. The display device according to claim 1, wherein the display element layer further comprises an insulating layer on the first electrode and the second electrode,
wherein the third electrode and the plurality of light emitting elements are on the insulating layer.

6. The display device according to claim 5, wherein the third electrode comprises a third protrusion protruding toward the second electrode.

7. The display device according to claim 6, wherein the display element layer further comprises:
a first contact electrode electrically connecting the plurality of light emitting elements to the third protrusion; and a second contact electrode electrically connecting the plurality of light emitting elements to the second electrode.

8. The display device according to claim 1, wherein:

the first protrusion comprises a first end adjacent to the second electrode and a second end adjacent to the first electrode;

the second protrusion comprises a first end adjacent to the first electrode and a second end adjacent to the second electrode; and in the first direction, a width of each first end is greater than a width of each second end.

9. The display device according to claim 1, wherein the display element layer further comprises a fourth electrode extending in the first direction and opposing the first electrode with the second electrode interposed therebetween.

10. The display device according to claim 9, wherein the first electrode, the second electrode, the third electrode, and the fourth electrode, and the plurality of light emitting elements are on a same surface of the substrate.

11. The display device according to claim 10, wherein the display element layer further comprises:

a first contact electrode electrically connecting at least one of the first electrode and the third electrode to the plurality of light emitting elements; and a second contact electrode electrically connecting at least one of the second electrode and the fourth electrode to the plurality of light emitting elements.

12. The display device according to claim 9, wherein, in a direction from the substrate to the display element layer, the first electrode and the second electrode are located on a surface different from a surface on which the third electrode and the fourth electrode are located, with an insulating layer interposed therebetween.

13. The display device according to claim 12, wherein:

the plurality of light emitting elements are on the insulating layer; and from among a first electrode pair comprising the first electrode and the second electrode and a second electrode pair comprising the third electrode and the fourth electrode, an electrode pair on the insulating layer is electrically connected to the plurality of light emitting elements.

14. The display device according to claim 12, wherein:

the third electrode comprises a third protrusion protruding toward the fourth electrode;

the fourth electrode comprises a fourth protrusion protruding toward the third electrode; and the third protrusion opposes the fourth protrusion with the plurality of light emitting elements interposed therebetween.

* * * * *